(12) United States Patent
Kim et al.

(10) Patent No.: US 11,610,896 B2
(45) Date of Patent: Mar. 21, 2023

(54) SEMICONDUCTOR DEVICES AND METHODS OF FORMING SEMICONDUCTOR DEVICES

(71) Applicant: Samsung Electronics Co., Ltd., Suwon-si (KR)

(72) Inventors: Daeik Kim, Hwaseong-si (KR); Bong-Soo Kim, Yongin-si (KR); Jemin Park, Suwon-si (KR); Taejin Park, Yongin-si (KR); Yoosang Hwang, Suwon-si (KR)

(73) Assignee: Samsung Electronics Co., Ltd.

( * ) Notice: Subject to any disclaimer, the term of this patent is extended or adjusted under 35 U.S.C. 154(b) by 105 days.

(21) Appl. No.: 17/245,203

(22) Filed: Apr. 30, 2021

(65) Prior Publication Data

US 2021/0249418 A1    Aug. 12, 2021

Related U.S. Application Data

(63) Continuation of application No. 16/295,562, filed on Mar. 7, 2019, now Pat. No. 10,998,322, which is a
(Continued)

(30) Foreign Application Priority Data

May 4, 2016   (KR) .......................... 10-2016-0055607

(51) Int. Cl.
*H01L 27/108* (2006.01)
*H01L 21/768* (2006.01)
(Continued)

(52) U.S. Cl.
CPC .... *H01L 27/10885* (2013.01); *H01L 21/3213* (2013.01); *H01L 21/76829* (2013.01);
(Continued)

(58) Field of Classification Search
CPC ......... H01L 27/10885; H01L 27/10814; H01L 27/10823; H01L 27/10876;
(Continued)

(56) References Cited

U.S. PATENT DOCUMENTS

| 6,573,168 B2 | 6/2003 | Kim et al. |
| 7,189,605 B2 | 3/2007 | Lee |

(Continued)

FOREIGN PATENT DOCUMENTS

| CN | 103545383 A | 1/2014 |
| CN | 103681677 A | 3/2014 |

(Continued)

*Primary Examiner* — David Vu
*Assistant Examiner* — Brandon C Fox
(74) *Attorney, Agent, or Firm* — Myers Bigel, P.A.

(57) ABSTRACT

Semiconductor devices are provided. A semiconductor device includes a substrate. The semiconductor device includes a stack structure on the substrate. The stack structure includes a first insulating material and a second insulating material that is on the first insulating material. The semiconductor device includes a spacer that extends from a sidewall of the first insulating material of the stack structure to a portion of a sidewall of the second insulating material of the stack structure. Moreover, the semiconductor device includes a conductive line that is on the spacer. Methods of forming semiconductor devices are also provided.

20 Claims, 53 Drawing Sheets

Related U.S. Application Data continuation of application No. 15/584,342, filed on May 2, 2017, now Pat. No. 10,269,808.

(51) Int. Cl.
*H01L 29/66* (2006.01)
*H01L 21/3213* (2006.01)

(52) U.S. Cl.
CPC .. *H01L 21/76838* (2013.01); *H01L 27/10814* (2013.01); *H01L 27/10823* (2013.01); *H01L 27/10852* (2013.01); *H01L 27/10876* (2013.01); *H01L 29/6656* (2013.01)

(58) Field of Classification Search
CPC ........... H01L 21/76829; H01L 21/3213; H01L 21/76838; H01L 29/6656
See application file for complete search history.

(56) References Cited

U.S. PATENT DOCUMENTS

| | | |
|---|---|---|
| 7,265,011 B2 | 9/2007 | Yoon et al. |
| 8,598,710 B2 | 12/2013 | Park et al. |
| 8,809,162 B2 | 8/2014 | Lee et al. |
| 9,029,957 B2 | 5/2015 | Yoon |
| 9,184,168 B2 | 11/2015 | Ryu et al. |
| 9,299,709 B2 | 3/2016 | Sasaki |
| 9,318,607 B2 | 4/2016 | Seo et al. |
| 9,349,741 B2 | 5/2016 | Liu |
| 9,601,420 B2 | 3/2017 | Hwang et al. |
| 9,825,146 B2 | 11/2017 | Lim |
| 2012/0135592 A1* | 5/2012 | Kim .................. H01L 27/10894 257/E21.294 |
| 2014/0021521 A1 | 1/2014 | Lim |
| 2015/0102504 A1 | 4/2015 | Park et al. |
| 2015/0144862 A1 | 5/2015 | Choi et al. |
| 2019/0273083 A1* | 9/2019 | Liou ................. H01L 27/10894 |

FOREIGN PATENT DOCUMENTS

| | | |
|---|---|---|
| JP | 2015019067 A | 1/2015 |
| JP | 2015041626 A | 3/2015 |
| KR | 20020001328 A | 1/2002 |
| KR | 20050022699 A | 3/2005 |
| KR | 101012222 B1 | 2/2011 |
| KR | 20110055180 A | 5/2011 |
| KR | 101087586 B1 | 11/2011 |
| KR | 101133710 B1 | 4/2012 |
| KR | 101177486 B1 | 8/2012 |

\* cited by examiner

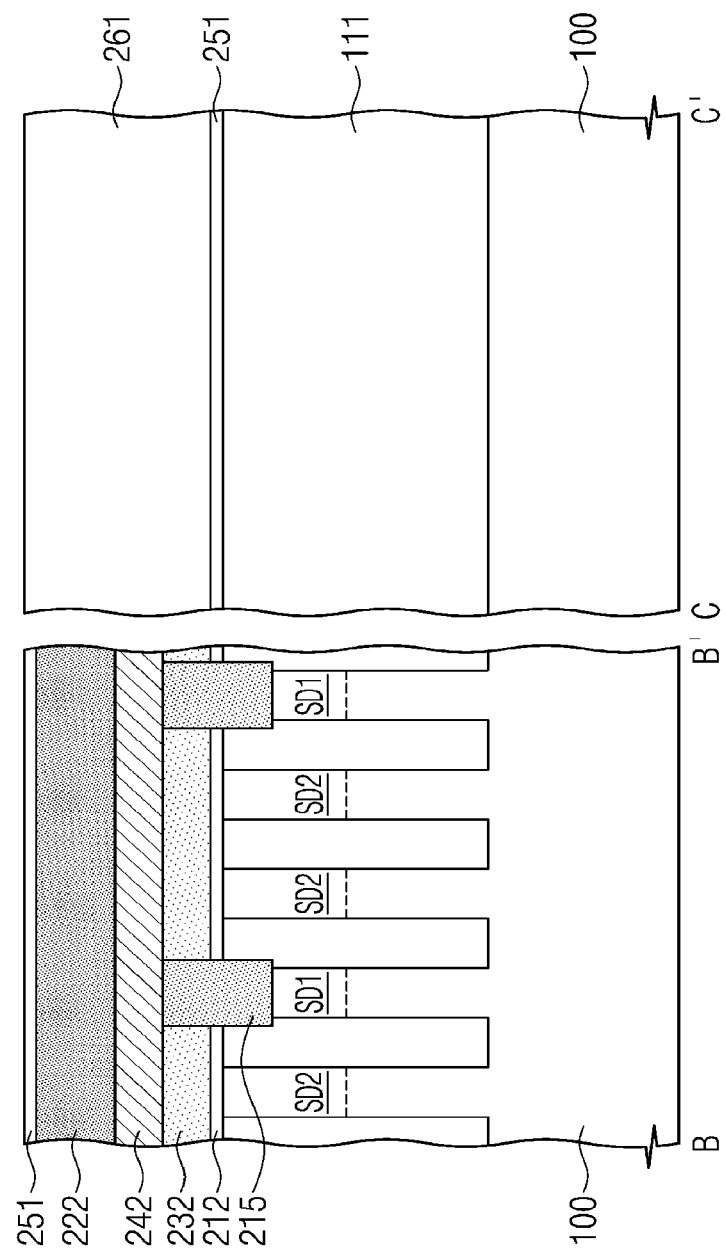

SEMICONDUCTOR DEVICES AND METHODS OF FORMING SEMICONDUCTOR DEVICES

CROSS-REFERENCE TO RELATED APPLICATIONS

The present application is a continuation application of and claims priority from U.S. patent application Ser. No. 16/295,562, now U.S. Pat. No. 10,998,322, filed Mar. 7, 2019, which is a continuation application of and claims priority from U.S. patent application Ser. No. 15/584,342, now U.S. Pat. No. 10,269,808, filed May 2, 2017, which claims priority under 35 U.S.C. § 119 to Korean Patent Application No. 10-2016-0055607, filed May 4, 2016, in the Korean Intellectual Property Office, the disclosures of which are hereby incorporated herein by reference in entirety.

BACKGROUND

The present disclosure relates to semiconductor devices. Semiconductor devices are widely used in the electronics industry because of their small sizes, multi-functional characteristics, and/or low manufacturing costs. However, semiconductor devices have been highly integrated with the development of the electronics industry. Widths of patterns included in semiconductor devices have been reduced to increase the integration density of semiconductor devices. However, since new exposure techniques and/or expensive exposure techniques may be needed to form fine patterns, it may be difficult to highly integrate semiconductor devices. Thus, research is being conducted for new integration techniques.

SUMMARY

Various embodiments of present inventive concepts may provide semiconductor devices capable of improving reliability and methods of fabricating/forming the same.

A semiconductor device, according to some embodiments, may include a substrate. The semiconductor device may include a plurality of stack structures on the substrate. Each of the plurality of stack structures may include a first insulating material and a second insulating material that is on the first insulating material. The semiconductor device may include a spacer including a first sidewall that extends from a sidewall of the first insulating material of one of the plurality of stack structures to a portion of a sidewall of the second insulating material of the one of the plurality of stack structures. Moreover, the semiconductor device may include a conductive line that is on the second insulating material and on a second sidewall of the spacer.

A semiconductor device, according to some embodiments, may include a substrate. The semiconductor device may include a plurality of cell conductive lines on a cell region of the substrate that includes a plurality of active regions. The semiconductor device may include a stack of first and second insulating materials on a region of the substrate that is spaced apart from the plurality of active regions. The first and second insulating materials may be different respective insulating materials. The semiconductor device may include first and second spacers extending from respective opposing sidewalls of the first insulating material to at least portions of respective opposing sidewalls of the second insulating material. Moreover, the semiconductor device may include a conductive line on the first and second spacers.

A semiconductor device, according to some embodiments, may include a substrate. The semiconductor device may include a cell conductive line on a cell region of the substrate. The semiconductor device may include a stack of first and second insulating materials on a region of the substrate that is adjacent the cell region. The cell conductive line may include first and second layers of the second insulating material. The semiconductor device may include a pair of spacers on the stack. An uppermost surface of one of the spacers may be at a first level that is between a second level of an interface of the first and second insulating materials and a third level of an uppermost surface of the second insulating material. The second level may be coplanar with, or closer to a surface of the substrate than, an interface between the first and second layers of the second insulating material of the cell conductive line. Moreover, the semiconductor device may include a conductive line on the stack.

A method of forming a semiconductor device, according to some embodiments, may include forming a conductive layer on a first region of a substrate. The method may include forming a first insulating material on a second region of the substrate that is adjacent the first region. The method may include reducing, in a first reduction process, a thickness of the first insulating material. The method may include performing a second reduction process of the first insulating material, after performing the first reduction process. The method may include forming a second insulating material on the second region of the substrate that is adjacent the first region, after performing the first and second reduction processes. The method may include forming a spacer material on the first and second insulating materials. The method may include etching the spacer material to form a spacer. Moreover, the method may include forming a conductive line that is on the second insulating material and on a sidewall of the spacer.

A method of forming a semiconductor device, according to some embodiments, may include forming a conductive layer on a first region of a substrate. The method may include forming a first insulating material on a second region of the substrate that is adjacent the first region. The method may include performing a planarization process to reduce a vertical thickness of the first insulating material. The method may include forming a second insulating material on the first insulating material, after performing the planarization process. The method may include etching the conductive layer and the first insulating material, using the second insulating material as an etch mask. The method may include forming a spacer material on the first and second insulating materials, after etching the first insulating material. The method may include forming a spacer by thinning a first portion of the spacer material that is on a sidewall of the second insulating material without thinning a second portion of the spacer material that is on a sidewall of the first insulating material. Moreover, the method may include forming a conductive line that is on the second insulating material and on a sidewall of the spacer.

A method of forming a semiconductor device, according to some embodiments, may include forming a conductive layer on a cell region of a substrate. The method may include forming an oxide material on a region of the substrate that is adjacent the cell region. The method may include performing a wet etch process to reduce a height of the oxide material. The method may include forming a nitride material on the oxide material, after performing the wet etch process. The method may include etching the conductive layer and the oxide material, using the nitride material as an etch mask. The method may include forming a spacer material on the oxide and nitride materials, after etching the oxide material. The method may include forming a spacer by etching a first portion of the spacer material that is on a sidewall of the nitride material without etching a second portion of the spacer material that is on a sidewall of the oxide material. Moreover, the method may include forming a conductive line that is on the nitride material and on a sidewall of the spacer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 18B, 19B, and 22B are cross-sectional views taken along the lines B-B' and C-C' of FIGS. 7A, 8A, and 2A, respectively.

DETAILED DESCRIPTION

Figure 1:
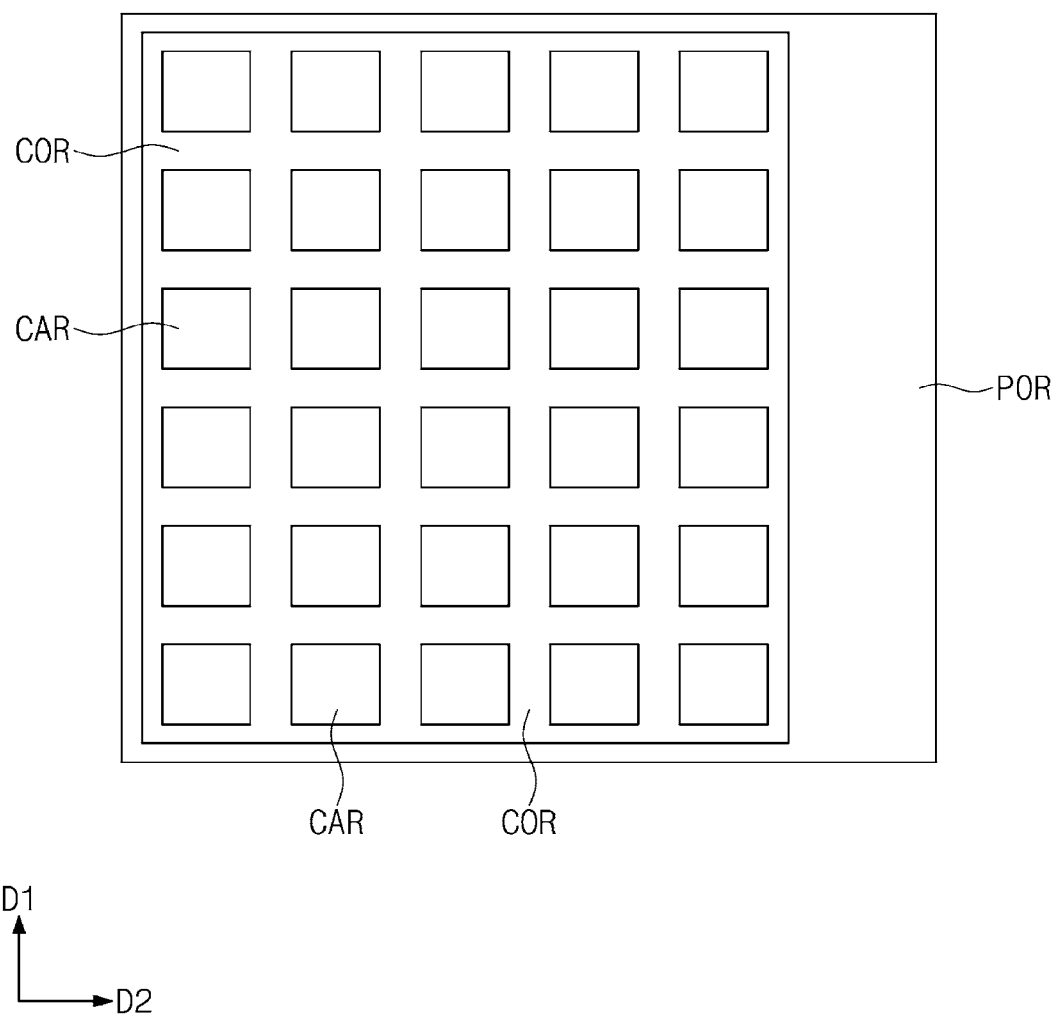
FIG. 1 is a plan view illustrating a semiconductor device according to some embodiments of present inventive concepts.

FIG. 1 is a plan view illustrating a semiconductor device according to some embodiments of present inventive concepts. A semiconductor device 10 may include cell regions CAR. The cell regions CAR may include a plurality of memory cells, and each of the cell regions CAR may include one unit cell block. The cell regions CAR may be spaced apart from each other in a first direction D1 and a second direction D2, and a core region COR may be provided between the cell regions CAR. The core region COR may be a region in which a sense amplifier and a write driver are provided. A peripheral circuit region POR may be provided at a side of the cell regions CAR. The peripheral circuit region POR may include a row decoder and a column decoder. The peripheral circuit region POR is illustrated at a right side of the cell regions CAR in FIG. 1. However, embodiments of present inventive concepts are not limited thereto. In some embodiments, the peripheral circuit region POR may also be provided at other sides of the cell regions CAR.

Figure 2A:
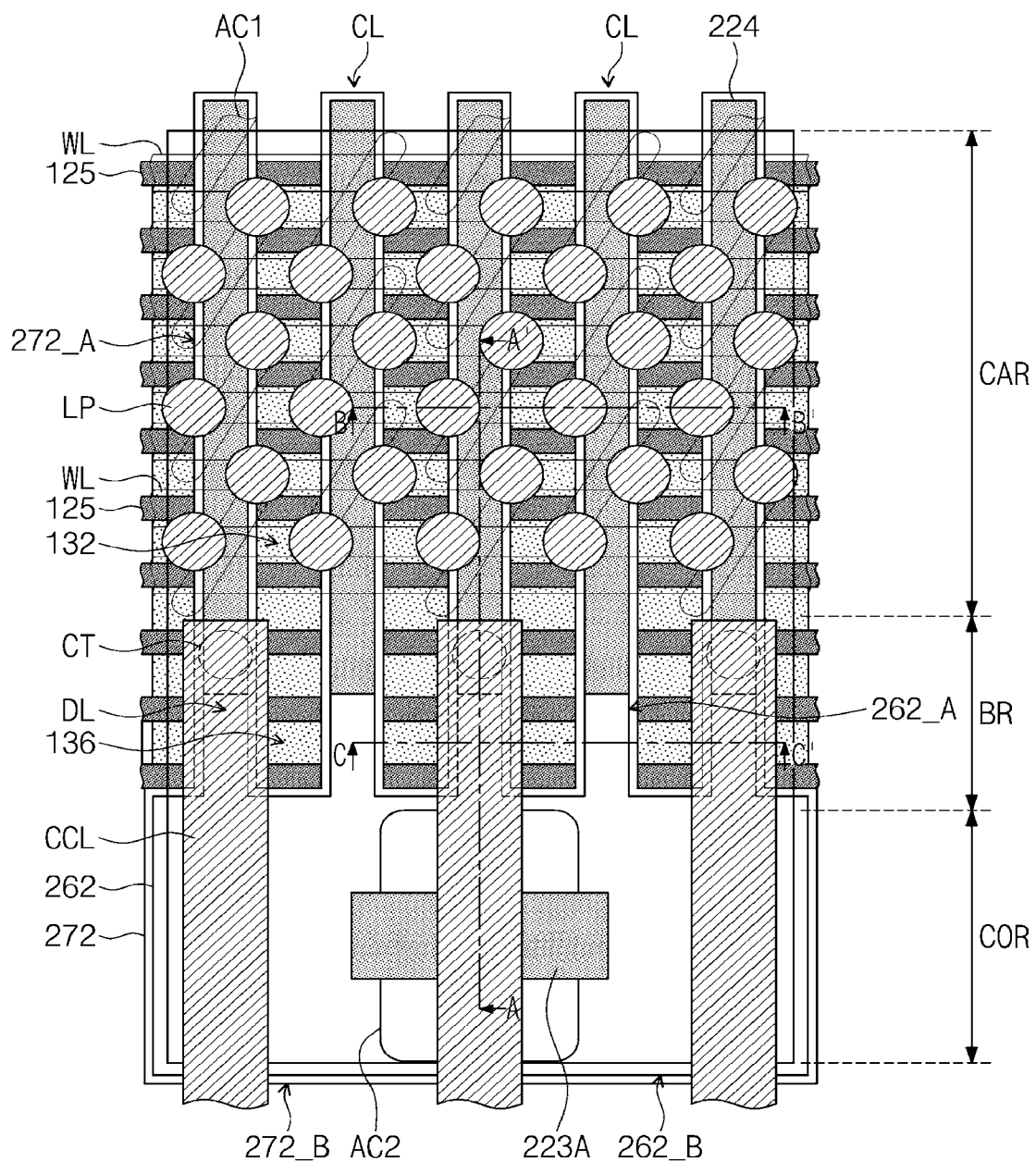
FIG. 2A is a plan view illustrating a semiconductor device according to some embodiments of present inventive concepts.
Figure 2B:
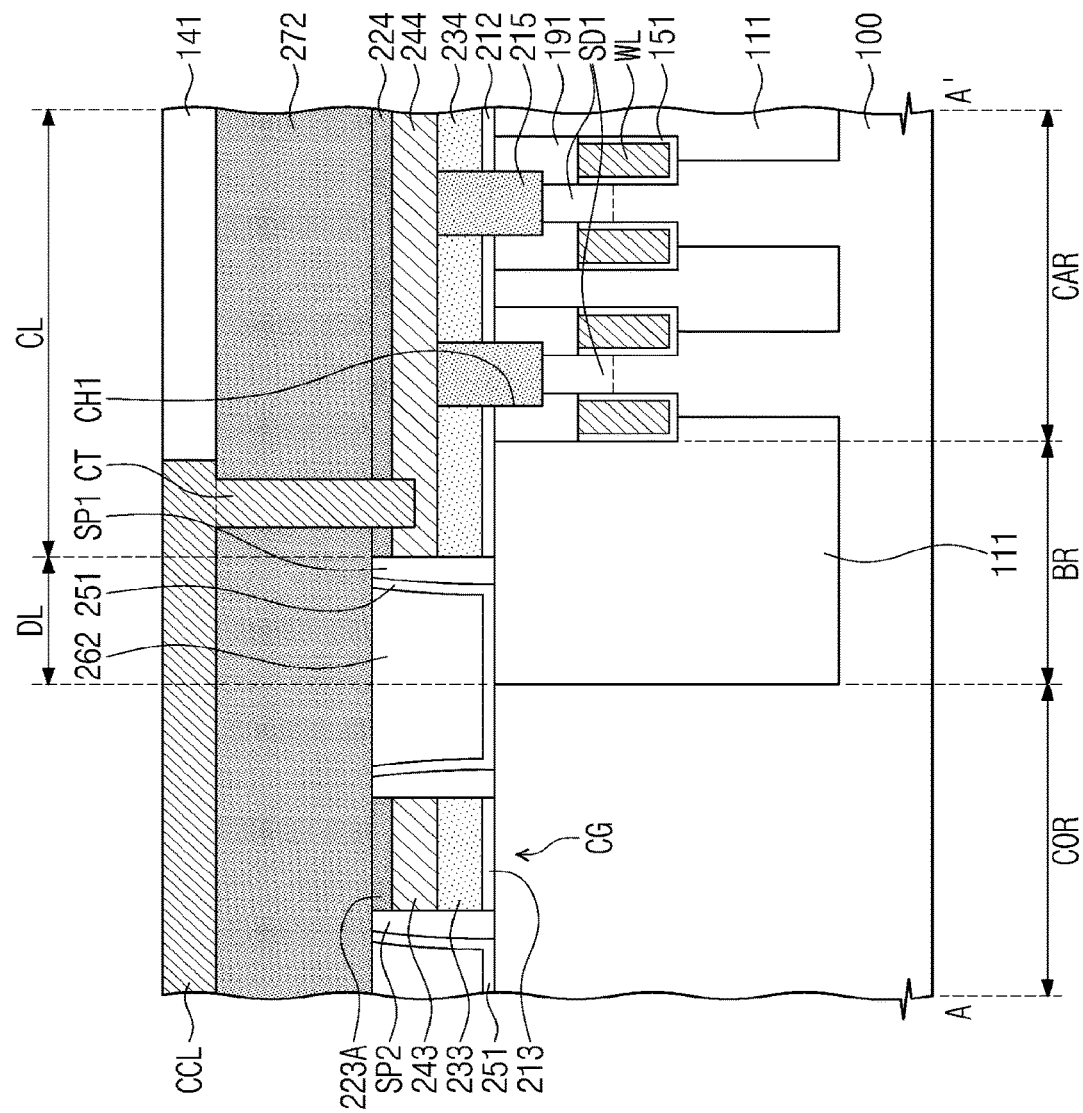
FIG. 2B is a cross-sectional view taken along a line A-A' of FIG. 2A.
Figure 2C:
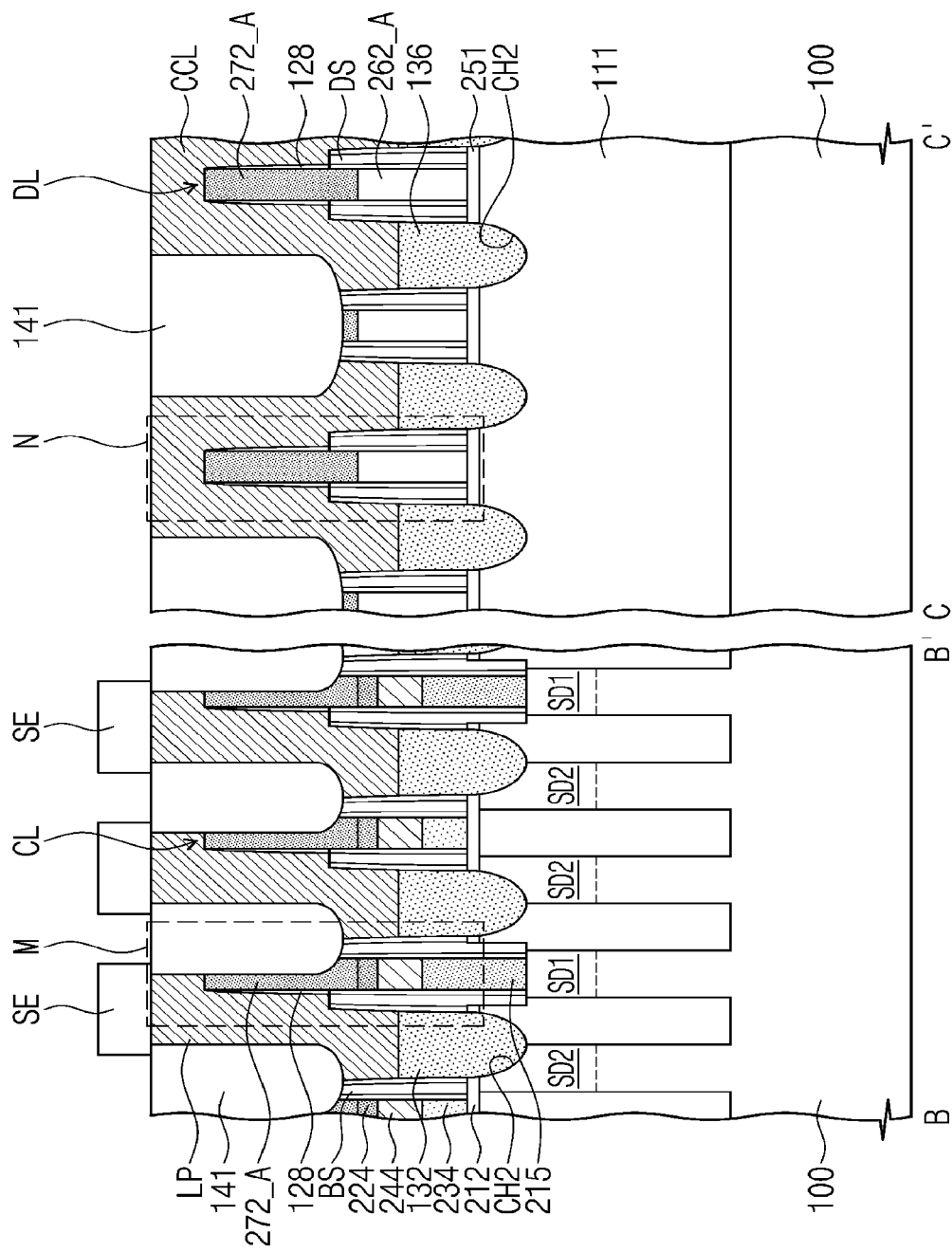
FIG. 2C is a cross-sectional view taken along lines B-B' and C-C' of FIG. 2A.
Figure 2D:
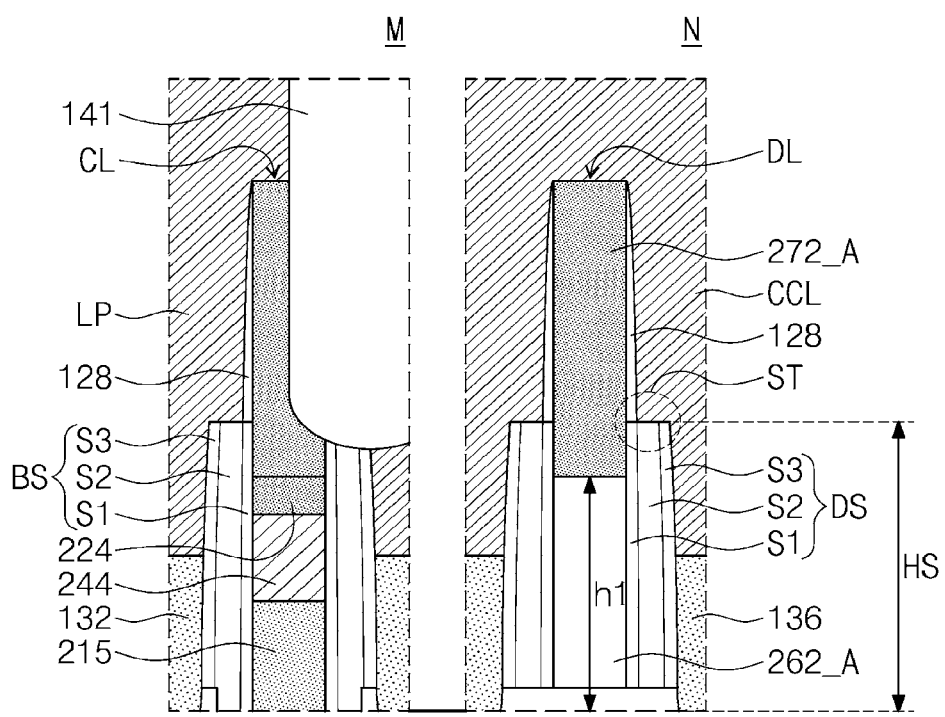
FIG. 2D is an enlarged view of regions 'M' and 'N' of FIG. 2C.

FIG. 2A is a plan view illustrating a semiconductor device according to some embodiments of present inventive concepts. FIG. 2B is a cross-sectional view taken along a line A-A' of FIG. 2A. FIG. 2C is a cross-sectional view taken along lines B-B' and C-C' of FIG. 2A. FIG. 2D is an enlarged view of regions 'M' and 'N' of FIG. 2C.

Referring to FIGS. 2A to 2D, a substrate 100 may be provided. The substrate 100 may include a cell region CAR, a core region COR, and a boundary region BR between the cell region CAR and the core region COR. The cell region CAR may be a region on which a plurality of memory cells are provided. The boundary region BR may be a region that buffers a process difference caused by a difference between a structure disposed on the cell region CAR and a structure disposed on the core region COR. In addition, the boundary region BR may be a region for connecting the structure of the cell region CAR and the structure of the core region COR to each other.

The substrate 100 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process. A device isolation layer 111 may be provided in the substrate 100 to define first active regions AC1 in the cell region CAR and to define a second active region AC2 in the core region COR. In the present disclosure, a boundary between the boundary region BR and the core region COR may be defined as a starting point/line from which the second active region AC2 extends.

Each of the first active regions AC1 may have a bar shape having a long axis parallel to a third direction D3 intersecting both first and second directions D1 and D2 to be described below. The first active regions AC1 may be disposed in parallel to each other. The second active region AC2 having a quadrilateral shape is illustrated in FIG. 2A. However, embodiments of present inventive concepts are not limited thereto. In some embodiments, the shape of the second active region AC2 may be variously modified.

Word lines WL may be buried in the substrate 100 of the cell region CAR. In some embodiments, each of the first active regions AC1 may intersect a pair of word lines WL. The word lines WL may be arranged along a first direction D1 and may extend in a second direction D2 perpendicular to the first direction D1. A gate insulating layer 151 may be provided between each of the word lines WL and the substrate 100. The gate insulating layer 151 may include an insulating material. For example, the gate insulating layer 151 may include at least one of a silicon oxide layer, a silicon oxynitride layer, or a high-k dielectric layer. The word lines WL may include a conductive material. For example, the word lines WL may include at least one of doped poly-silicon, a metal material, or a conductive metal nitride.

Capping patterns 191 may be provided on the word lines WL, respectively. The capping patterns 191, the word lines WL, and the gate insulating layer 151 may be buried in the substrate 100. The capping patterns 191 may include at least one of silicon oxide, silicon nitride, or silicon oxynitride. In the present disclosure, a boundary between the cell region CAR and the boundary region BR may be defined as a starting point/line from which the first active region AC1 extends.

A first dopant region SD1 and second dopant regions SD2 may be provided in each of the first active regions AC1. The first and second dopant regions SD1 and SD2 may have a different conductivity type from the substrate 100. Each of the first active regions AC1 may include the first dopant region SD1 between a pair of word lines WL, and the second dopant regions SD2 spaced apart from each other with the first dopant region SD1 and the pair of word lines WL interposed therebetween.

Cell conductive lines CL extending in the first direction D1 may be provided. In some embodiments, the cell conductive lines CL may be provided on the substrate 100 of the cell region CAR. Each of the cell conductive lines CL may be connected in common to a plurality of the first dopant regions SD1 arranged in the first direction D1. In some embodiments, the cell conductive lines CL may be bit lines. Each of the cell conductive lines CL may include a conductive line and an insulating line disposed on the conductive line. In some embodiments, the conductive line may include a first sub-conductive line 234 and a second sub-conductive line 244 disposed on the first sub-conductive line 234. For example, the first sub-conductive line 234 may include a doped semiconductor material, e.g., doped poly-silicon. The second sub-conductive line 244 may include at least one of a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide).

The cell conductive lines CL may further include connection contacts 215 that are provided in first contact holes CH1 penetrating the first sub-conductive lines 234 at overlapping regions of the cell conductive lines CL and the first dopant regions SD1. The connection contacts 215 may be connected to respective ones of the first dopant regions SD1. The connection contacts 215 may include a doped semiconductor material, e.g., doped silicon. Each of the cell conductive lines CL may further include a first buffer pattern 212 disposed between the first sub-conductive line 234 and the substrate 100. The connection contacts 215 may penetrate the first buffer patterns 212 so as to be inserted into an upper portion of the substrate 100. For example, the first buffer patterns 212 may include silicon oxide.

An insulating line may include a first insulating pattern 224 and a second insulating pattern 272 that are sequentially stacked on the second sub-conductive line 244. The first and second insulating patterns 224 and 272 may be a portion of a mask pattern used to form the first and second sub-conductive lines 234 and 244. The first and second insulating patterns 224 and 272 may include first and second layers, respectively, of the same insulating material. The first insulating pattern 224 may be aligned with the first and second sub-conductive lines 234 and 244. The second insulating pattern 272 may be aligned with the first insulating pattern 224 and the first and second sub-conductive lines 234 and 244 on the cell region CAR and may extend onto the boundary region BR and the core region COR to form a portion of a dummy line DL to be described below. The first and second insulating patterns 224 and 272 may include the same material. For example, the first and second insulating patterns 224 and 272 may include at least one of silicon nitride or silicon oxynitride.

The cell conductive lines CL may extend onto the boundary region BR. The cell conductive lines CL may be connected to dummy lines DL on the boundary region BR. End portions of the cell conductive lines CL may be respectively connected to end portions of the dummy lines DL extending toward the core region COR. In other words, one cell conductive line CL and one dummy line DL may be aligned with each other along the first direction D1 to constitute one continuous line shape. The cell conductive lines CL and the dummy lines DL may be disposed at the same level from a top surface of the substrate 100. The term "dummy line" is used herein to indicate a component having a structure and a shape that are the same as, or similar to, those of the cell conductive lines CL but which are merely present as a pattern without possessing the ability to perform substantial functions. Therefore, an electrical signal may not be applied to a "dummy line" and the "dummy line" may not be able to perform certain electrical functions even in the case that an electrical signal is applied thereto.

Each of the dummy lines DL may include a second buffer pattern 251 and a third insulating pattern 262 which are sequentially stacked on the substrate 100. For example, the third insulating pattern 262 may include at least one of silicon oxide or silicon oxynitride. The third insulating pattern 262 may be spaced apart from a lower portion of the cell conductive line CL with a first spacer SP1 interposed therebetween. The first spacer SP1 may be disposed on an end sidewall of the lower portion of the cell conductive line CL. The end sidewall of the lower portion of the cell conductive line CL may extend substantially parallel to a width direction (e.g., the second direction D2) of the cell conductive line CL. The second buffer pattern 251 may extend between a sidewall of the third insulating pattern 262 and the first spacer SP1. The second buffer pattern 251 may include, for example, at least one of silicon nitride or silicon oxynitride. The first spacer SP1 may include at least one of a silicon oxide layer, a silicon nitride layer, or a silicon oxynitride layer. In some embodiments, the second buffer pattern 251 may include the same material as the first and second insulating patterns 224 and 272.

The third insulating pattern 262 may include first portions 262_A respectively aligned with the cell conductive lines CL on the boundary region BR, and a second portion 262_B connected in common to the first portions 262_A and covering the core region COR.

A portion of the second insulating pattern 272 may correspond to a portion of the dummy line DL. The second insulating pattern 272 may include first portions 272_A separated from each other to correspond to the cell conductive lines CL on the cell region CAR, respectively, and a second portion 272_B connected in common to the first portions 272_A and covering the core region COR. The first portions 272_A may be portions of the cell conductive lines CL on the cell region CAR and may be portions of the dummy lines DL on the boundary region BR. The first portions 272_A of the second insulating pattern 272 may be disposed on the first portions 262_A of the third insulating pattern 262, and the second portion 272_B of the second insulating pattern 272 may be disposed on the second portion 262_B of the third insulating pattern 262. As used herein, a reference to a "stack structure" (or a "stack") of first and second insulating layers may refer to the first portion 272_A being stacked on the first portion 262_A.

Spacers may be provided on sidewalls of the cell conductive lines CL and sidewalls of the dummy lines DL. The spacers may include cell spacers BS on the sidewalls of the cell conductive lines CL and dummy spacers DS on the sidewalls of the dummy lines DL. The sidewalls of the cell conductive and dummy lines CL and DL, on which the cell and dummy spacers BS and DS are provided, may extend substantially parallel to a longitudinal direction (e.g., the first direction D1) of the cell conductive line CL. The cell spacers BS and the dummy spacers DS may be formed by the same process. Each of the cell and dummy spacers BS and DS may include a first sub-spacer S1, a second sub-spacer S2, and a third sub-spacer S3, as illustrated in FIG. 2D. Each of the first to third sub-spacers S1 to S3 may include at least one of silicon oxide, silicon nitride, or silicon oxynitride. For example, the first and third sub-spacers S1 and S3 may include silicon nitride, and the second sub-spacer S2 may include silicon oxide.

Upper spacers 128 may be provided on sidewalls of the first portions 272_A of the second insulating pattern 272. The upper spacers 128 may include, for example, at least one of a silicon oxide layer, a silicon nitride layer, or a silicon oxynitride layer. The upper spacers 128 may be in contact with top surfaces of the cell spacers BS and top surfaces of the dummy spacers DS. However, embodiments of present inventive concepts are not limited thereto. Moreover, in some embodiments, the upper spacers 128 may be omitted.

A core gate structure CG may be provided on the core region COR. The core gate structure CG may include a core gate insulating layer 213, a first gate electrode 233, a second gate electrode 243, and a core mask pattern 223A which are sequentially stacked on the second active region AC2. Components of the core gate structure CG and components of the cell conductive line CL may be formed by the same processes. Thus, the components of the core gate structure CG may be disposed at the substantially same levels as the components of the cell conductive line CL, respectively. In other words, the core gate insulating layer 213 may correspond to the first buffer patterns 212, and the first gate electrode 233 may correspond to the first sub-conductive lines 234. The second gate electrode 243 may correspond to the second sub-conductive lines 244, and the core mask pattern 223A may correspond to the first insulating patterns 224. Moreover, the first gate electrode 233 may be formed of doped silicon, and the second gate electrode 243 may be formed of a metal. Alternatively, the core gate insulating layer 213 and the first buffer pattern 212 may be formed by processes different from each other, and/or the core gate insulating layer 213 may include layers different from the first buffer pattern 212.

A second spacer SP2 may be provided on a sidewall of the core gate structure CG. The second spacer SP2 may include at least one of a silicon oxide layer, a silicon nitride layer, or a silicon oxynitride layer. The second buffer pattern 251 may also extend between a sidewall of the third insulating pattern 262 and the second spacer SP2. The second portion 262_B of the third insulating pattern 262 may surround the core gate structure CG, and the second portion 272_B of the second insulating pattern 272 may extend onto the core gate structure CG so as to be connected to the core mask pattern 223A.

Lower contacts may be provided between the cell conductive lines CL and between the dummy lines DL. The lower contacts may include cell lower contacts 132 between the cell conductive lines CL and dummy lower contacts 136 between the dummy lines DL. The cell lower contacts 132 and the dummy lower contacts 136 may be formed by the same process, and thus shapes and materials of the cell lower contacts 132 may be the same as those of the dummy lower contacts 136. For example, the lower contacts 132 and 136 may include doped poly-silicon. The lower contacts 132 and 136 may be spaced apart from each other with fence insulating patterns 125 interposed therebetween. The fence insulating patterns 125 may also be disposed between the cell conductive lines CL and between the dummy lines DL. In other words, the lower contacts 132 and 136 may be provided in second contact holes CH2 defined by the cell conductive lines CL, the dummy lines DL, and the fence insulating patterns 125.

The cell lower contacts 132 may be disposed on the second dopant regions SD2, respectively. The cell lower contacts 132 may be connected to upper portions of respective ones of the second dopant regions SD2. The dummy lower contacts 136 may be inserted in an upper portion of the device isolation layer 111 of the boundary region BR. In other words, the dummy lower contacts 136 may be isolated from the substrate 100 (e.g., the active regions AC1 and AC2 of the substrate 100) by the device isolation layer 111.

Upper contacts LP may be provided on the cell lower contacts 132, respectively. The upper contacts LP may be disposed between the cell lower contacts 132 and data storage elements to be described below, respectively. The upper contacts LP may be respectively disposed on the cell lower contacts 132 and may extend onto the cell conductive lines CL. However, embodiments of present inventive concepts are not limited thereto. The upper contacts LP may be separated from each other by an upper interlayer insulating layer 141. The upper interlayer insulating layer 141 may be inserted between the upper contacts LP and the cell conductive lines CL (e.g., the first portions 272_A of the second insulating pattern 272). The upper contacts LP may include at least one of a metal or a conductive metal nitride. For example, the upper contacts LP may include at least one of tungsten (W), aluminum (Al), copper (Cu), nickel (Ni), cobalt (Co), or any conductive nitride thereof. The upper contacts LP may not be provided on the dummy lower contacts 136.

Data storage elements SE may be provided on respective ones of the upper contacts LP. Each of the data storage elements SE may be electrically connected to a corresponding one of the second dopant regions SD2 through a corresponding one of the upper contacts LP and a corresponding one of the cell lower contacts 132. In some embodiments, each of the data storage elements SE may be a capacitor. In some embodiments, the data storage elements SE may include lower electrodes respectively connected to the upper contacts LP, an upper electrode covering the lower electrodes, and a dielectric layer disposed between the upper electrode and the lower electrodes. The upper electrode may be a common electrode which covers the lower electrodes in common. In some embodiments, each of the lower electrodes may have a hollow cylindrical shape. The lower electrodes and the upper electrode may include at least one of silicon doped with dopants, a metal, or a metal compound. The dielectric layer may be formed of a single layer or multiple layers including at least one of a metal oxide (e.g., hafnium oxide ($HfO_2$), zirconium dioxide ($ZrO_2$), aluminum oxide ($Al_2O_3$), lanthanum oxide ($La_2O_3$), tantalum oxide ($Ta_2O_3$), or titanium dioxide ($TiO_2$)) or a perovskite dielectric material (e.g., strontium titanate ($SrTiO_3$ (STO)), barium strontium titanate ((Ba,Sr)$TiO_3$ (BST)), barium titanate (Ba$TiO_3$), lead zirconate titanate (PZT), or lead lanthanum zirconium titanate (PLZT)).

In some embodiments, each of the data storage elements SE may include a variable resistor. A resistance state of the variable resistor may be changed into one of various states having different resistance values by a program operation. In some embodiments, the variable resistor may be a magnetic tunnel junction pattern using magnetization directions. The magnetic tunnel junction pattern may include a reference magnetic pattern having a magnetization direction fixed in one direction, a free magnetic pattern having a magnetization direction changeable to be parallel or anti-parallel to the magnetization direction of the reference magnetic pattern, and a tunnel barrier disposed between the reference magnetic pattern and the free magnetic pattern. In some embodiments, the variable resistor may include a phase-change material. A phase of the phase-change material may be converted into an amorphous state or a crystalline state by a temperature of supplied heat and/or a supplying time of the heat in a program operation. A resistance value of the phase-change material in the amorphous state may be higher than that of the phase-change material in the crystalline state. For example, the phase-change material may include a compound including at least one of chalcogens (e.g., tellurium (Te) and selenium (Se)). In some embodiments, the variable resistor may include a transition metal oxide. An electrical path may be generated in the transition metal oxide by a first program operation, and the electrical path generated in the transition metal oxide may be removed by a second program operation. When the electrical path is generated in the transition metal oxide, the transition metal oxide may have a low resistance value. When the electrical path is removed from the transition metal oxide, the transition metal oxide may have a high resistance value.

Core conductive lines CCL may be provided on the second insulating pattern 272. A core conductive line CCL may be referred to herein as a "conductive line." The core conductive lines CCL may be connected to the cell conductive lines CL on/via the boundary region BR. In some embodiments, the core conductive lines CCL may be connected to the cell conductive lines CL through vias CT. The core conductive lines CCL may be disposed on the dummy lines DL. Some of the cell conductive lines CL may be connected to the core conductive lines CCL on/via the boundary region disposed at one side of the cell region CAR, and the others of the cell conductive lines CL may be connected to the core conductive lines CCL on/via the boundary region disposed at another side of the cell region CAR. In some embodiments, odd-numbered lines of the cell conductive lines CL may be connected to the core conductive lines CCL on/via the boundary region BR disposed at the one side of the cell region CAR. Widths in the second direction D2 of the core conductive lines CCL may be greater than widths in the second direction D2 of the cell conductive lines CL. The core conductive lines CCL may electrically connect the transistors of the core region COR to the memory cells of the cell region CAR.

The core conductive lines CCL and the upper contacts LP may be formed using the same deposition process. In other words, the core conductive lines CCL may include the same material as the upper contacts LP. The core conductive lines CCL may extend along the sidewalls of the dummy lines DL so as to be connected to the dummy lower contacts 136 that are on the boundary region BR. Each of the core conductive lines CCL may be connected to a source/drain region or a gate of a corresponding one of the transistors on the core region COR. The core conductive lines CCL may be spaced apart from each other with the upper interlayer insulating layer 141 interposed therebetween.

The cell conductive line CL will be compared with the dummy line DL with reference to FIG. 2D. A height h1 from the top surface of the substrate 100 to a top surface of the third insulating pattern 262_A may be lower than a height HS from the top surface of the substrate 100 to top surfaces of the cell and dummy spacers BS and DS. A top surface of the first insulating pattern 224 may be disposed at the substantially same level as the top surface of the third insulating pattern 262_A. When the dummy line DL is defined to include the dummy spacer DS and the upper spacer 128, the dummy line DL may include a step portion ST disposed at a sidewall of the dummy line DL. The height h1 of the top surface of the third insulating pattern 262_A may be lower than a height HS of the step portion ST.

According to some embodiments of present inventive concepts, the height of the third insulating pattern 262_A may be adjusted to impede/prevent an electrical short between the core conductive lines CCL. If the top surface of the third insulating pattern 262_A is higher than the top surface of the dummy spacer DS (or the step portion ST), a conductive material may be provided to a position of the third insulating pattern 262_A to cause an electrical short between adjacent core conductive lines CCL. This will be described in more detail in a method of fabricating a semiconductor device according to some embodiments of present inventive concepts. As used herein, the term "thickness" may refer to a vertical thickness (i.e., a height) of a layer/element. Accordingly, descriptions herein of reducing a thickness may refer to reducing a height of a layer/element.

Figure 12:
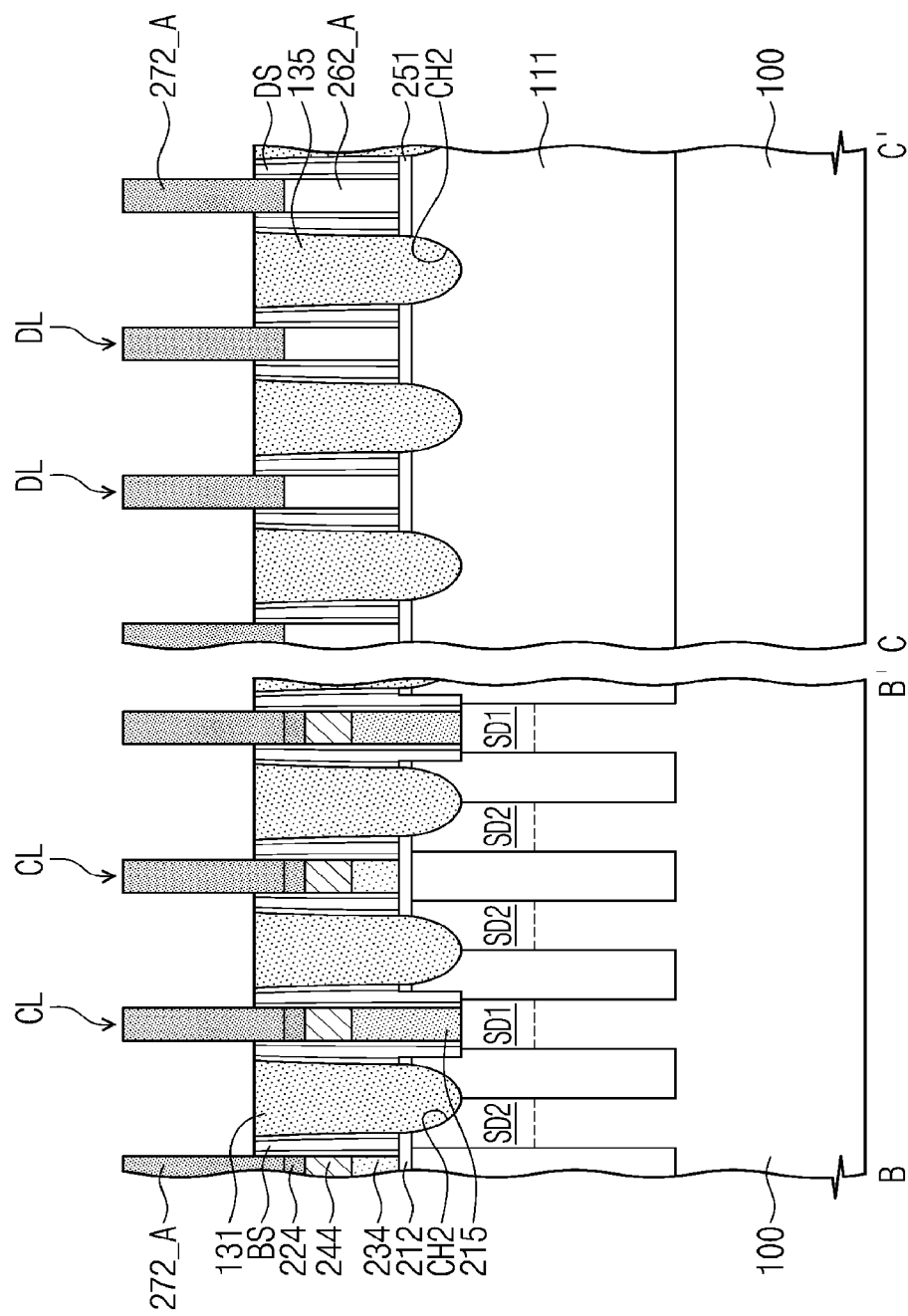
FIGS. 12 and 13 are cross-sectional views taken along the lines B-B' and C-C' of FIG. 11A.
Figure 13:
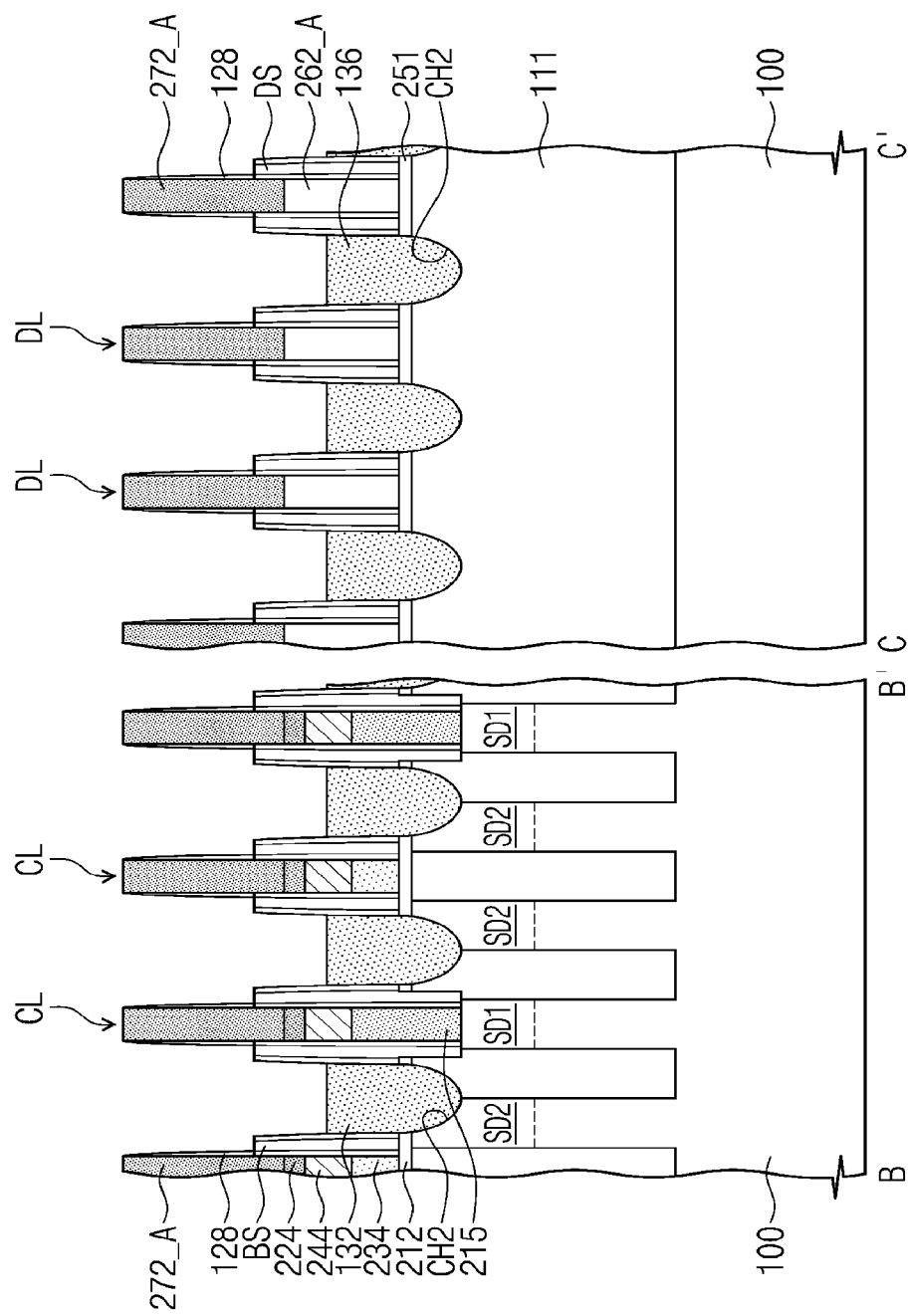

FIGS. 3A to 11A are plan views illustrating a method of fabricating a semiconductor device according to some embodiments of present inventive concepts. FIGS. 3B to 11B are cross-sectional views taken along lines A-A' of FIGS. 3A to 11A, respectively. FIGS. 3C to 11C are cross-sectional views taken along lines B-B' and C-C' of FIGS. 3A to 11A, respectively. FIG. 10D is a cross-sectional view taken along a line D-D' of FIG. 10A. FIGS. 12 and 13 are cross-sectional views taken along the lines B-B' and C-C' of FIG. 11A.

Figure 3A:
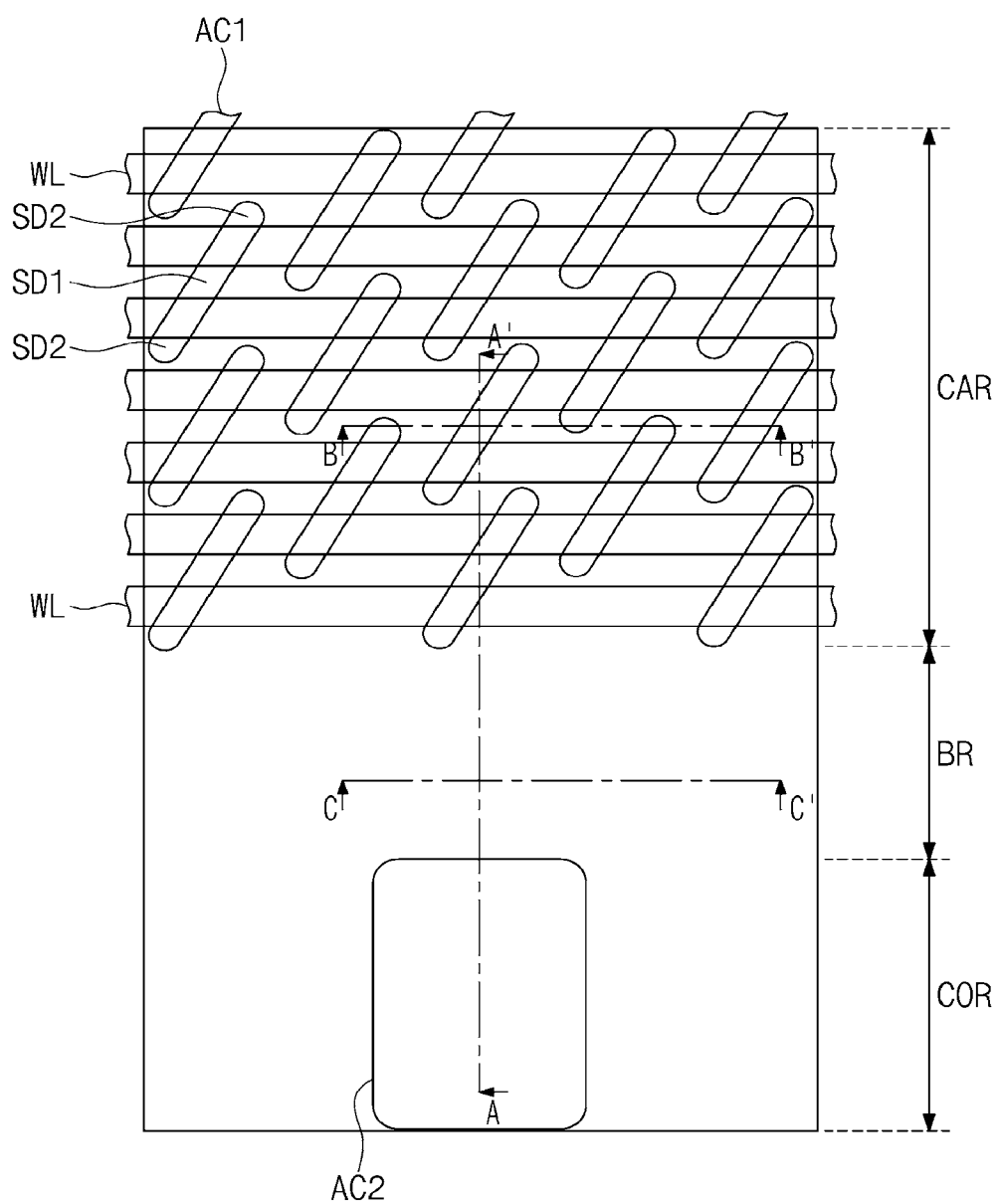
FIGS. 3A, 4A, 5A, 6A, 7A, 8A, 9A, 10A, and 11A are plan views illustrating a method of fabricating a semiconductor device according to some embodiments of present inventive concepts.
Figure 3B:
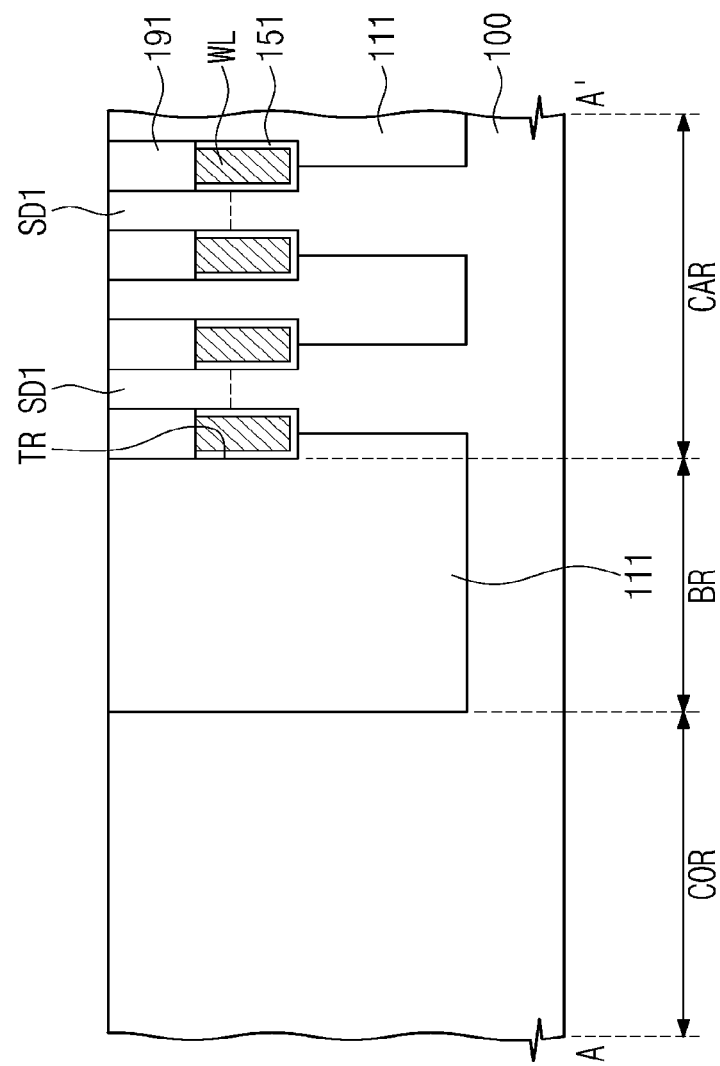
FIGS. 3B, 4B, 5B, 6B, 7B, 8B, 9B, 10B, and 11B are cross-sectional views taken along lines A-A' of FIGS. 3A, 4A, 5A, 6A, 7A, 8A, 9A, 10A, and 11A, respectively.
Figure 3C:
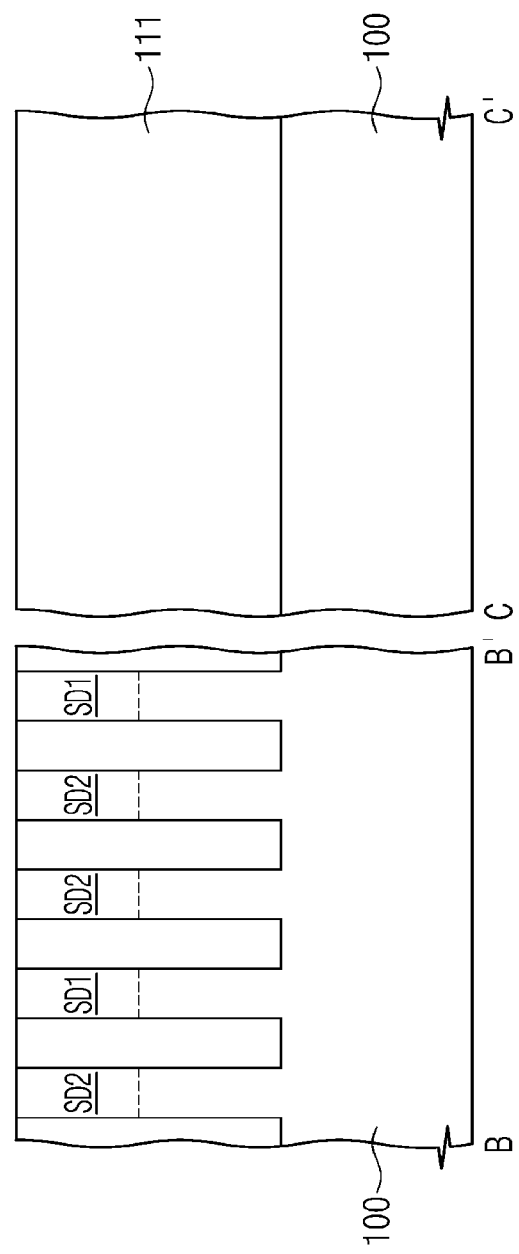
FIGS. 3C, 4C, 5C, 6C, 7C, 8C, 9C, 10C, and 11C are cross-sectional views taken along lines B-B' and C-C' of FIGS. 3A, 4A, 5A, 6A, 7A, 8A, 9A, 10A, and 11A, respectively.

Referring to FIGS. 3A to 3C, a substrate 100 may be provided. The substrate 100 may include a cell region CAR, a core region COR, and a boundary region BR between the cell region CAR and the core region COR. A device isolation layer 111 may be formed in the substrate 100 to define first active regions AC1 in the cell region CAR and to define a second active region AC2 in the core region COR. Device isolation trenches may be formed in the substrate 100, and the device isolation layer 111 may be formed by filling the device isolation trenches with an insulating material.

Trenches TR may be formed in the substrate 100 of the cell region CAR. The trenches TR may extend in the second direction D2. Each of the first active regions AC1 may intersect two trenches TR. A gate insulating layer 151 may be formed to conformally cover inner surfaces of the trenches TR. Word lines WL respectively filling the trenches TR may be formed on the gate insulating layer 151. The gate insulating layer 151 may include an insulating material. For example, the gate insulating layer 151 may include at least one of a silicon oxide layer, a silicon oxynitride layer, or a high-k dielectric layer. The word lines WL may include a conductive material. For example, the word lines WL may include at least one of doped poly-silicon, a metal material, or a conductive metal nitride.

The gate insulating layer 151 and the word lines WL which are disposed in upper regions of the trenches TR may be removed, and then capping patterns 191 may be formed in respective ones of the trenches TR. The capping patterns 191 may be formed on the word lines WL and may completely fill the trenches TR. The capping patterns 191 may include at least one of silicon oxide, silicon nitride, or silicon oxynitride.

First and second dopant regions SD1 and SD2 may be formed in upper portions of the first active regions AC1. The first and second dopant regions SD1 and SD2 may be formed by an ion implantation process using the device isolation layer 111 and the capping patterns 191 as ion implantation masks. The dopant regions SD1 and SD2 may have a different conductivity type from the substrate 100. In some embodiments, the first and second dopant regions SD1 and SD2 may be formed before the formation of the word lines WL. Each of the first active regions AC1 may include the first dopant region SD1 between a pair of word lines WL, and the second dopant regions SD2 spaced apart from each other with the first dopant region SD1 and the pair of word lines WL interposed therebetween. Portions of the second active region AC2 may be doped with dopants during the formation of the first and second dopant regions SD1 and SD2, or the second active region AC2 may be covered by a mask during the formation of the first and second dopant regions SD1 and SD2.

Figure 4A:
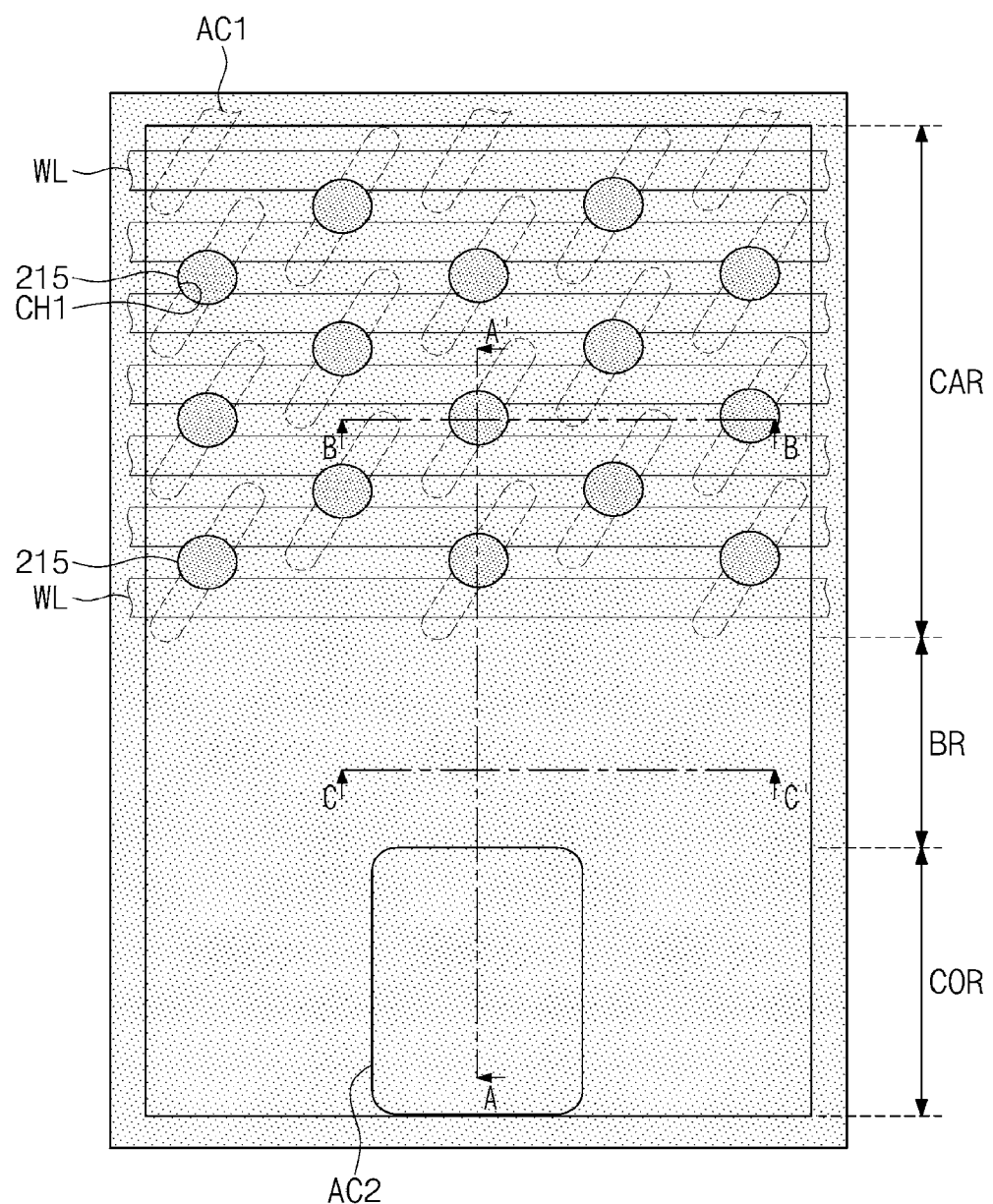
Figure 4B:
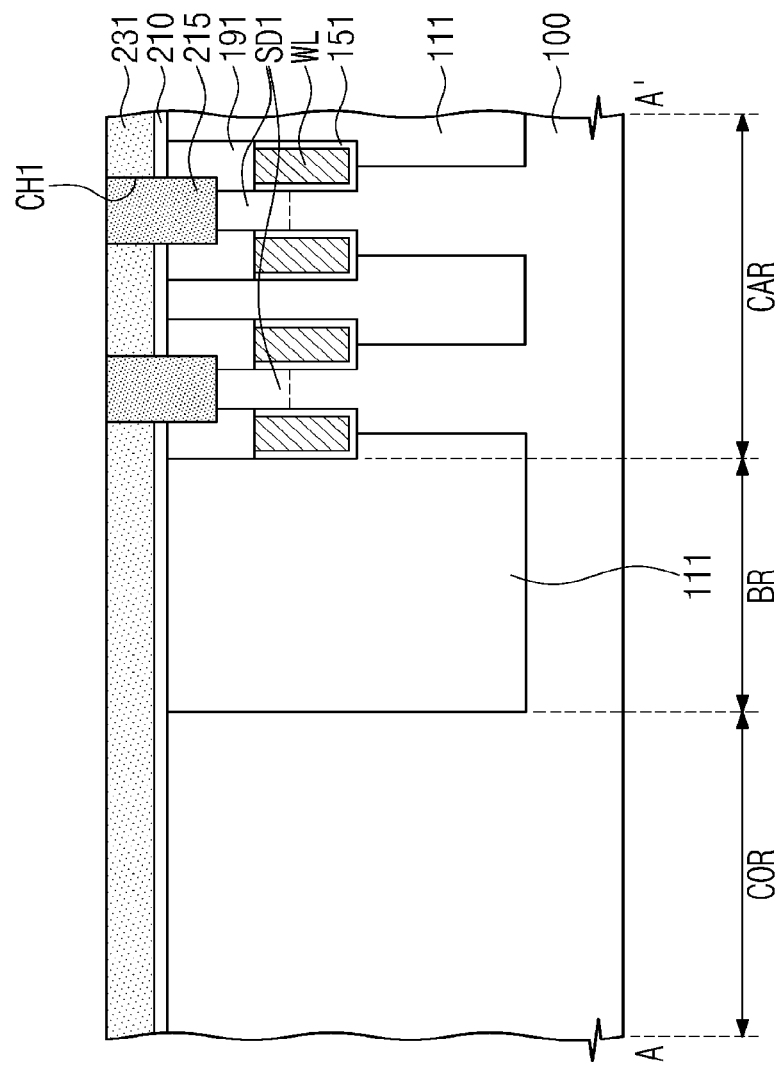
Figure 4C:
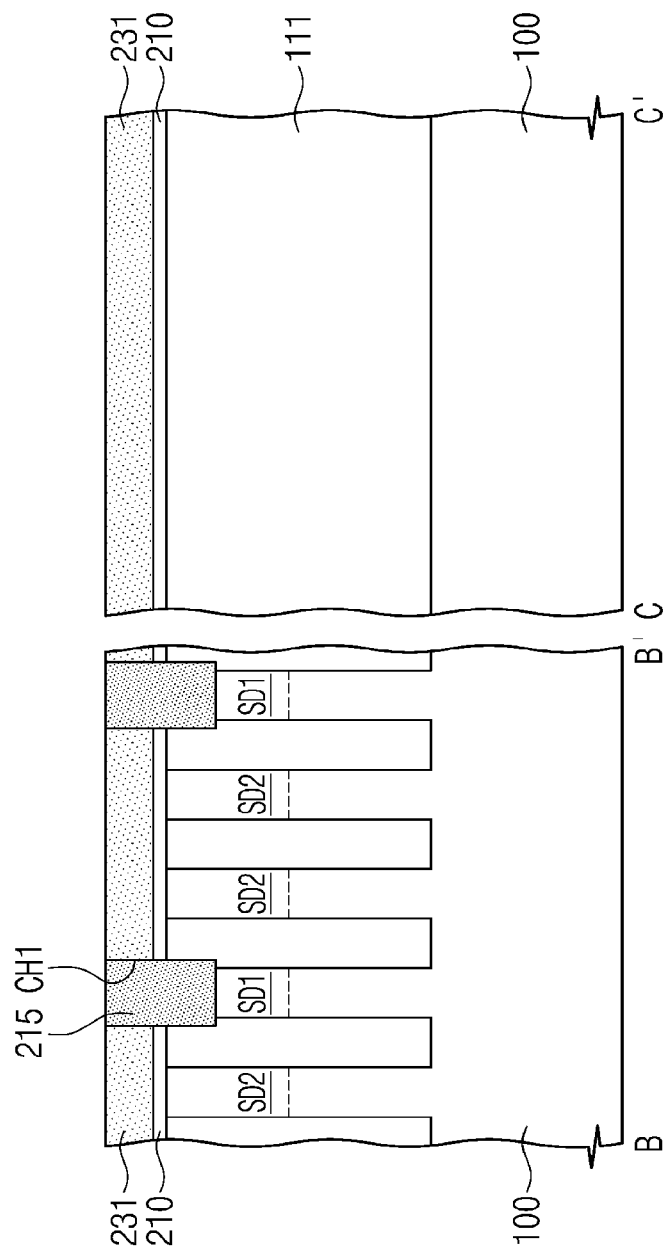

Referring to FIGS. 4A to 4C, a first buffer layer 210 may be formed on the substrate 100. The first buffer layer 210 may be formed of one or more insulating layers. For example, the first buffer layer 210 may be formed of at least one of a silicon oxide layer, a silicon nitride layer, or a silicon oxynitride layer. A first conductive layer 231 may be formed on the first buffer layer 210. For example, the first conductive layer 231 may include a doped poly-silicon layer. Each of the first buffer layer 210 and the first conductive layer 231 may be formed by a chemical vapor deposition (CVD) process or a physical vapor deposition (PVD) process. The first buffer layer 210 and the first conductive layer 231 may be formed on the cell region CAR, the core region COR, and the boundary region BR.

A mask pattern may be formed on the first conductive layer 231. The mask pattern may expose portions of the first conductive layer 231. An etching process may be performed on the first conductive layer 231 exposed by the mask pattern. The first conductive layer 231, the first buffer layer 210, and an upper portion of the substrate 100 may be etched by the etching process using the mask pattern as an etch mask, thereby forming first contact holes CH1 on the first active regions AC1. In detail, the first contact holes CH1 may expose respective ones of the first dopant regions SD1. When the first contact holes CH1 are formed, upper portions of the device isolation layer 111 adjacent to the first dopant regions SD1 may also be etched. In some embodiments, an additional ion implantation process may be performed on the first dopant regions SD1 exposed through the first contact holes CH1. Alternatively, the additional ion implantation process may be omitted.

Connection contacts 215 may be formed in respective ones of the first contact holes CH1. The connection contacts 215 may completely fill the first contact holes CH1. A doped semiconductor layer may be formed on the first conductive layer 231 to fill the first contact holes CH1, and a planarization process (e.g., a chemical mechanical polishing (CMP) process or an etch-back process) may be performed on the doped semiconductor layer until a top surface of the first conductive layer 231 is exposed, thereby forming the connection contacts 215. For example, the connection contacts 215 may include poly-silicon doped with N-type or P-type dopants.

Figure 5A:
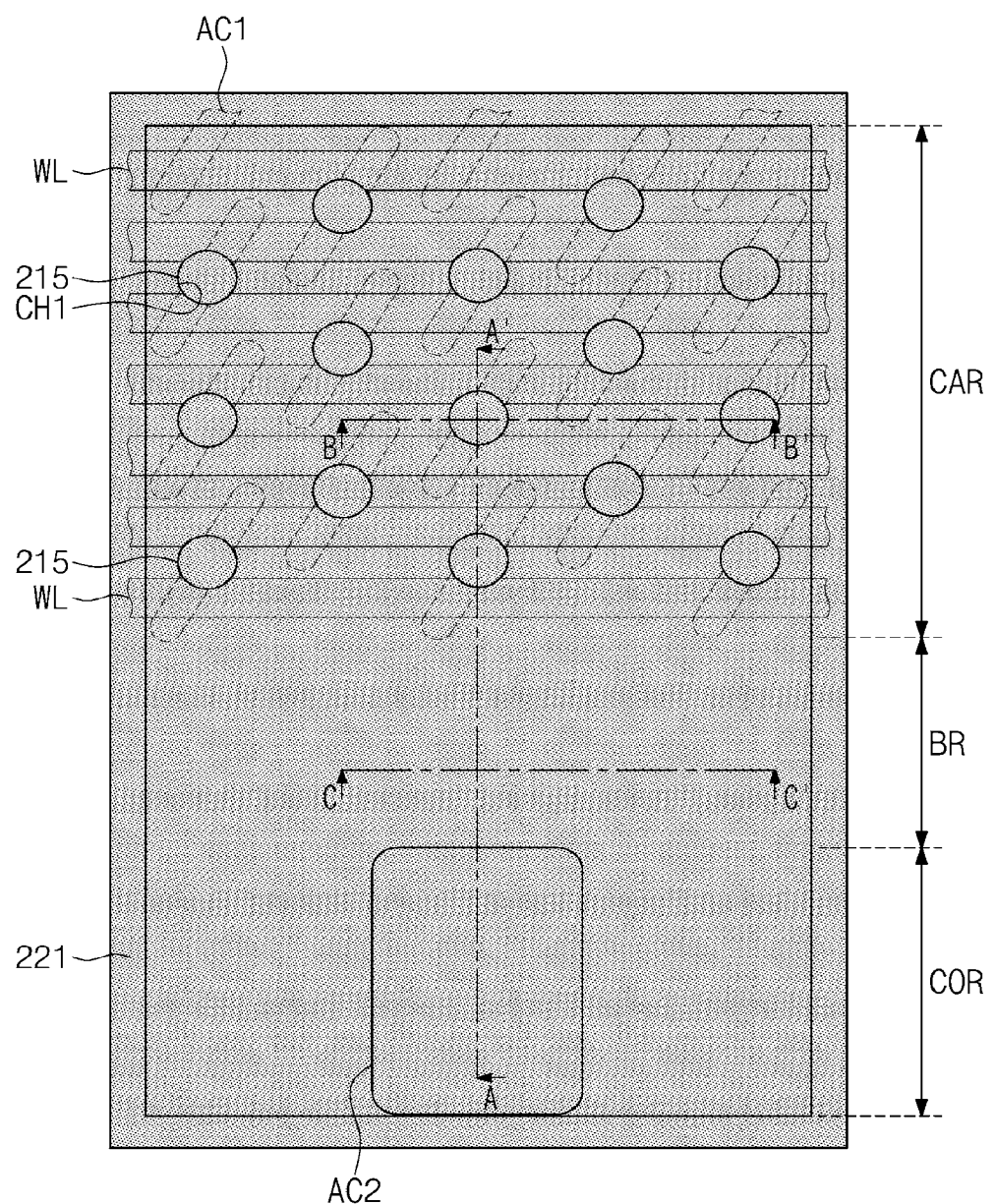
Figure 5B:
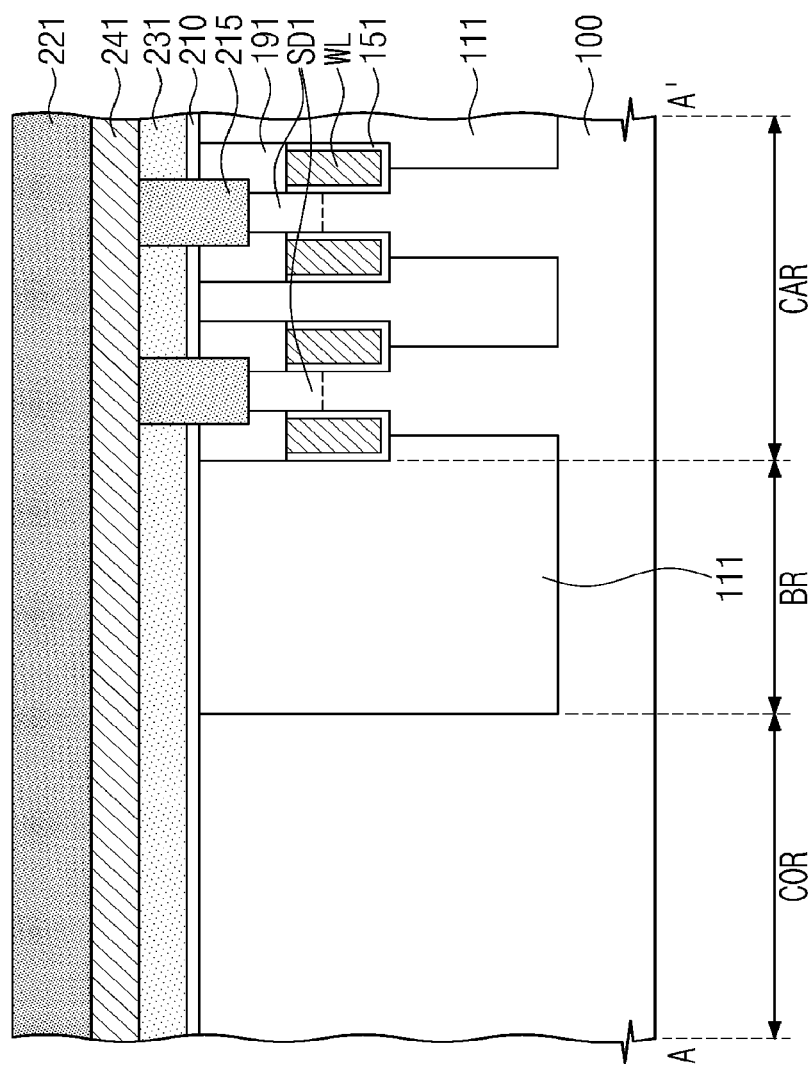
Figure 5C:
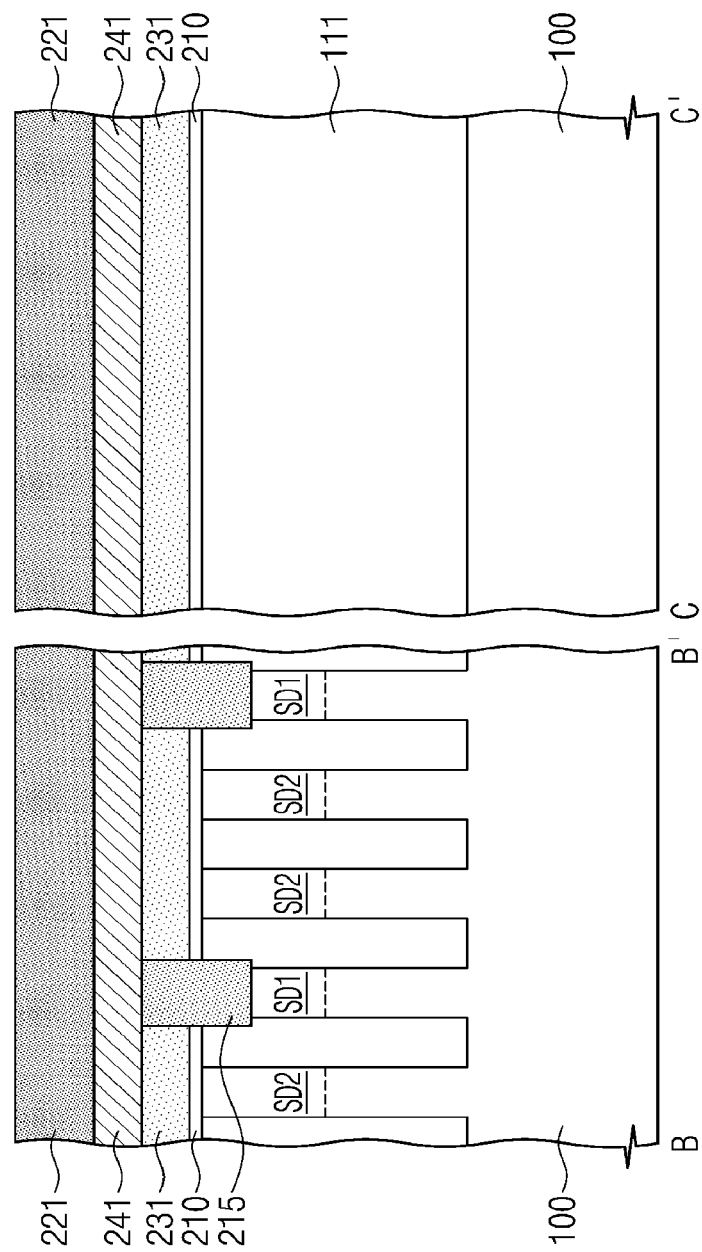

Referring to FIGS. 5A to 5C, a second conductive layer 241 may be formed on the first conductive layer 231 in which the connection contacts 215 are formed. The second conductive layer 241 may include one or more conductive layers. For example, the second conductive layer 241 may include at least one of tungsten (W), aluminum (Al), copper (Cu), nickel (Ni), or cobalt (Co). Moreover, in some embodiments, a diffusion barrier layer may be formed between the second conductive layer 241 and the first conductive layer 231. The diffusion barrier layer may be a diffusion barrier metal and may include, for example, titanium nitride (TiN), Ti/TiN, titanium silicon nitride (TiSiN), tantalum nitride (TaN), or tungsten nitride (WN).

A first mask layer 221 may be formed on the second conductive layer 241. For example, the first mask layer 221 may include at least one of a silicon nitride layer or a silicon oxynitride layer. The second conductive layer 241 and the first mask layer 221 may be formed on an entire top surface of the substrate 100.

Figure 6A:
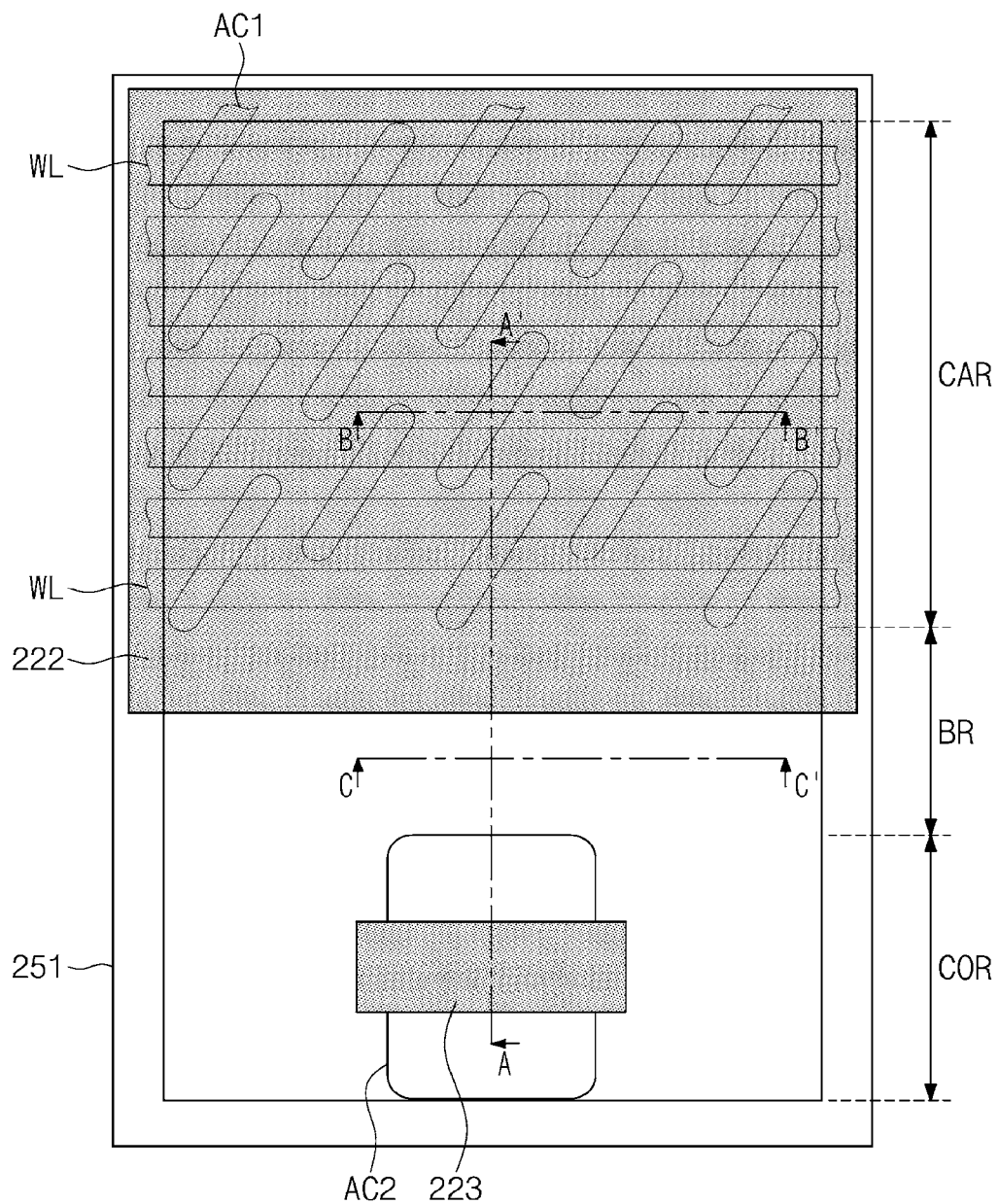
Figure 6B:
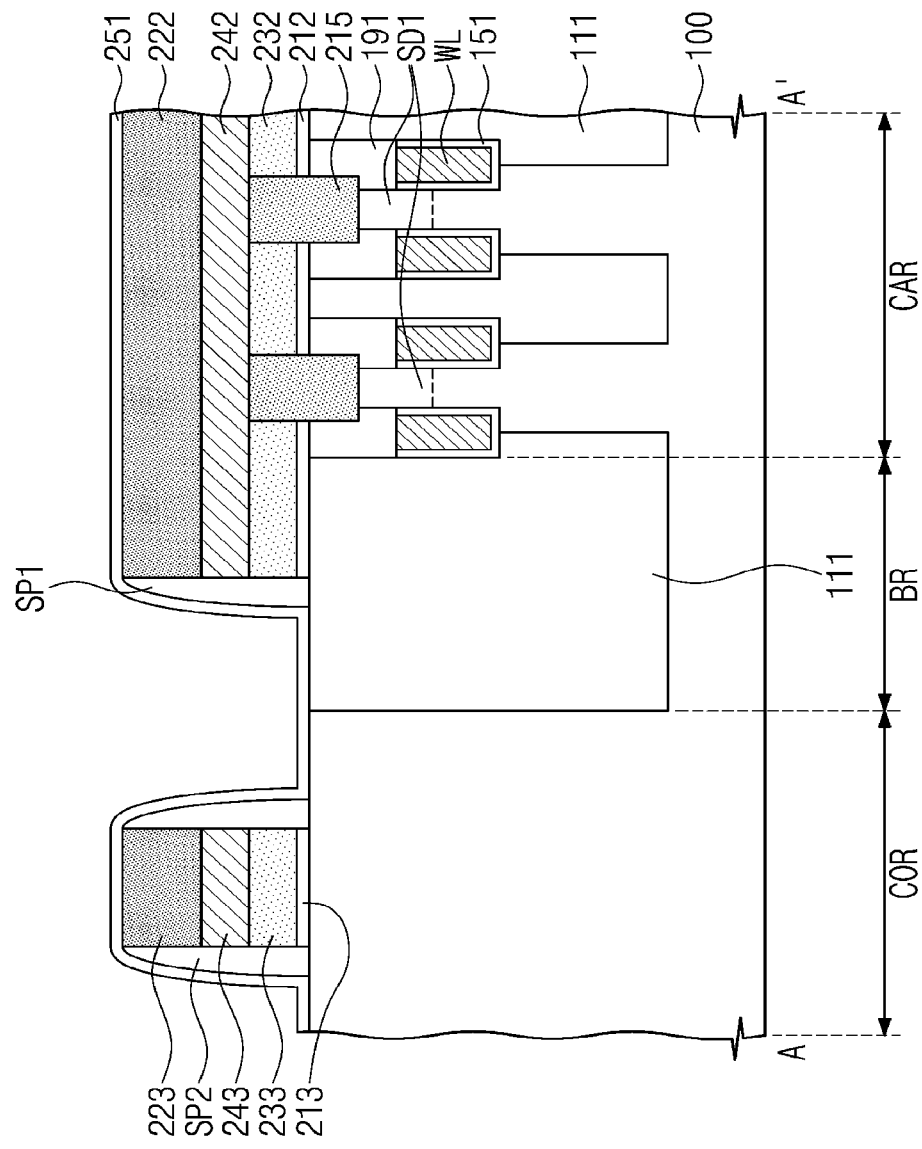
Figure 6C:
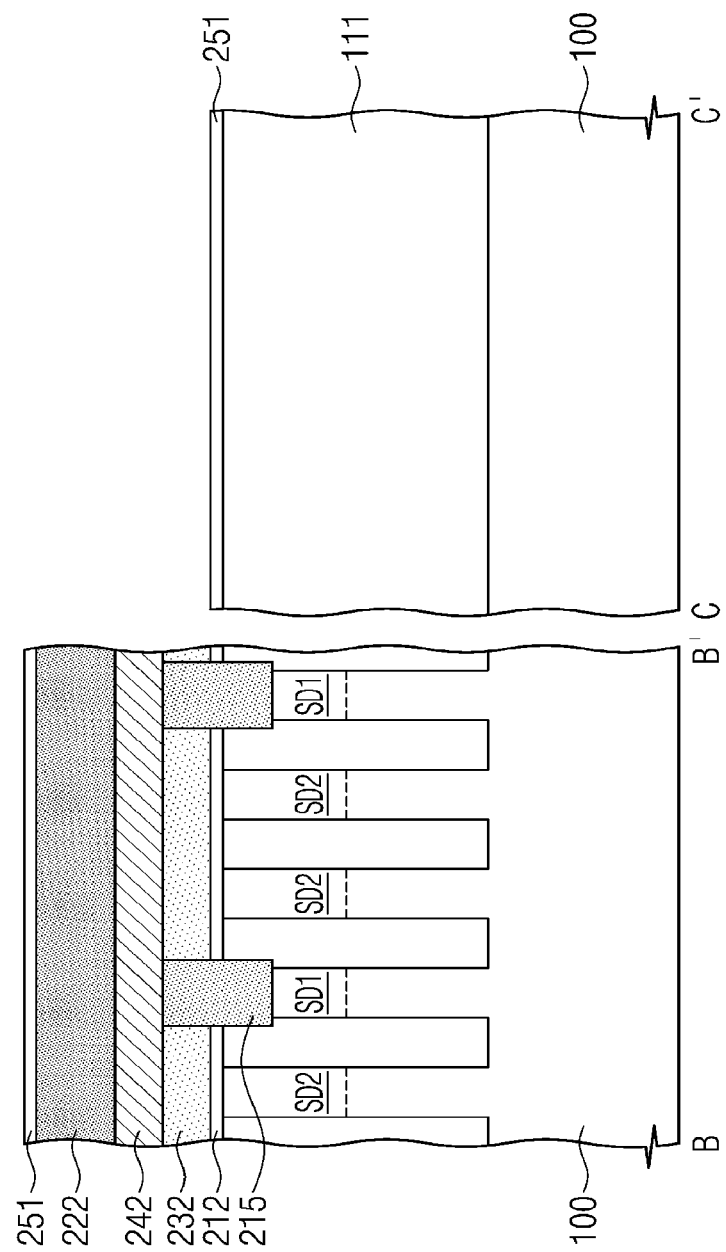

Referring to FIGS. 6A to 6C, the first mask layer 221 may be patterned to form a first mask pattern 222 and a core mask pattern 223. The first mask pattern 222 may be formed on the cell region CAR, and the core mask pattern 223 may be formed on the core region COR. The first mask pattern 222 may cover a portion of the boundary region BR but may expose the rest of the boundary region BR. The first mask pattern 222 and the core mask pattern 223 may be formed by an etching process using photoresist patterns as etch masks.

The second conductive layer 241, the first conductive layer 231, and the first buffer layer 210 may be sequentially etched using the first mask pattern 222 and the core mask pattern 223 as etch masks. Thus, a first buffer pattern 212, a first conductive pattern 232, and a second conductive pattern 242 sequentially stacked may be formed on the cell region CAR, and a core gate insulating layer 213, a first gate electrode 233, and a second gate electrode 243 sequentially stacked may be formed on the core region COR. The second conductive pattern 242/second sub-conductive line 244 may be referred to herein as a "conductive layer" and may extend from the cell region CAR into the boundary region BR to electrically connect with the core conductive line CCL (e.g., through the via CT). The device isolation layer 111 of the rest of the boundary region BR may be exposed by the first mask pattern 222. Portions of the second active region AC2 and the device isolation layer 111 of the core region COR may be exposed by the core mask pattern 223. The patterning process may include an anisotropic etching process. In FIGS. 5B and 6B, the core gate insulating layer 213 may be formed from the first buffer layer 210. Alternatively, the core gate insulating layer 213 may be formed from an additional/different insulating layer.

A first spacer SP1 may be formed to extend along sidewalls of the first buffer pattern 212, the first conductive pattern 232 and the second conductive pattern 242. A second spacer SP2 may be formed to extend along sidewalls of the core gate insulating layer 213, the first gate electrode 233 and the second gate electrode 243. In some embodiments, an insulating layer may be conformally formed on the substrate 100, and an anisotropic etching process may be performed on the insulating layer to form the first spacer SP1 and the second spacer SP2. For example, the first and second spacers SP1 and SP2 may include at least one of silicon oxide, silicon nitride, or silicon oxynitride. An ion implantation process may be performed to form dopant regions in the second active region AC2. The dopant regions of the second active region AC2 may correspond to source/drain regions of a core transistor. The dopant regions formed by the ion implantation process may have a different conductivity type from the substrate 100.

A second buffer pattern 251 may be formed on an entire top surface of the substrate 100 after the formation of the first and second spacers SP1 and SP2. The second buffer pattern 251 may be conformally formed along a top surface of the core mask pattern 223, a top surface of the first mask pattern 222, the exposed top surface of the device isolation layer 111, and the exposed top surface of the second active region AC2. The second buffer pattern 251 may include at least one of silicon nitride or silicon oxynitride.

Figure 7A:
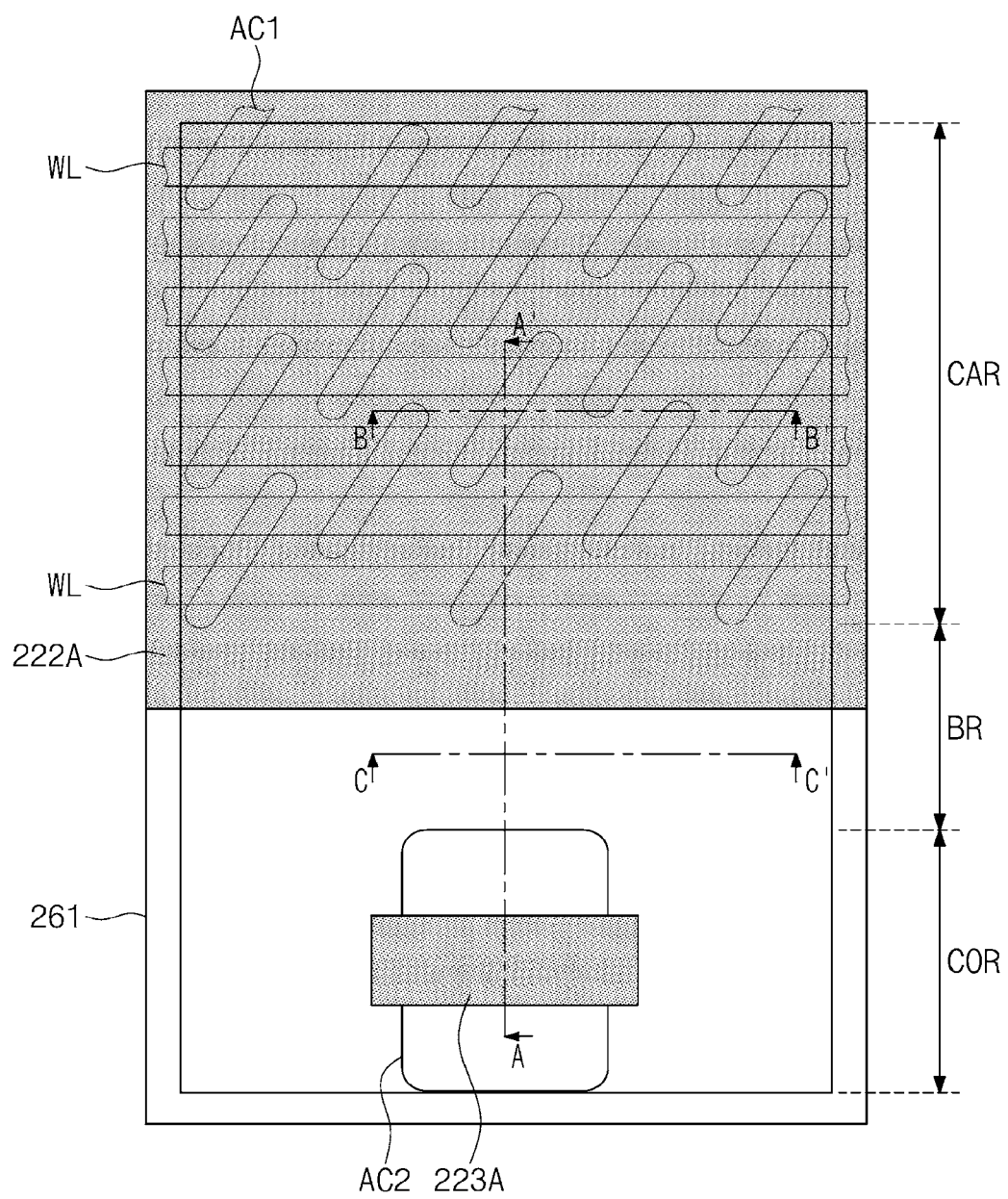
Figure 7B:
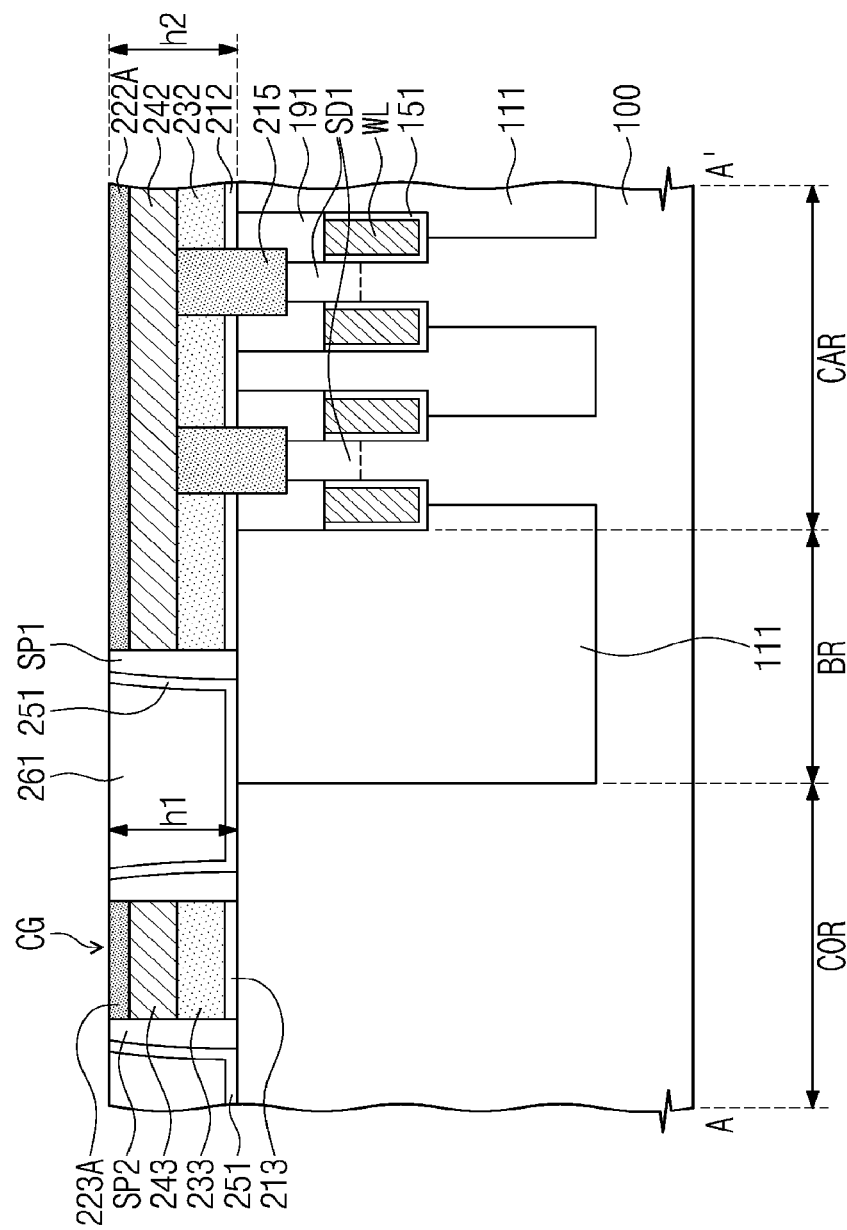
Figure 7C:
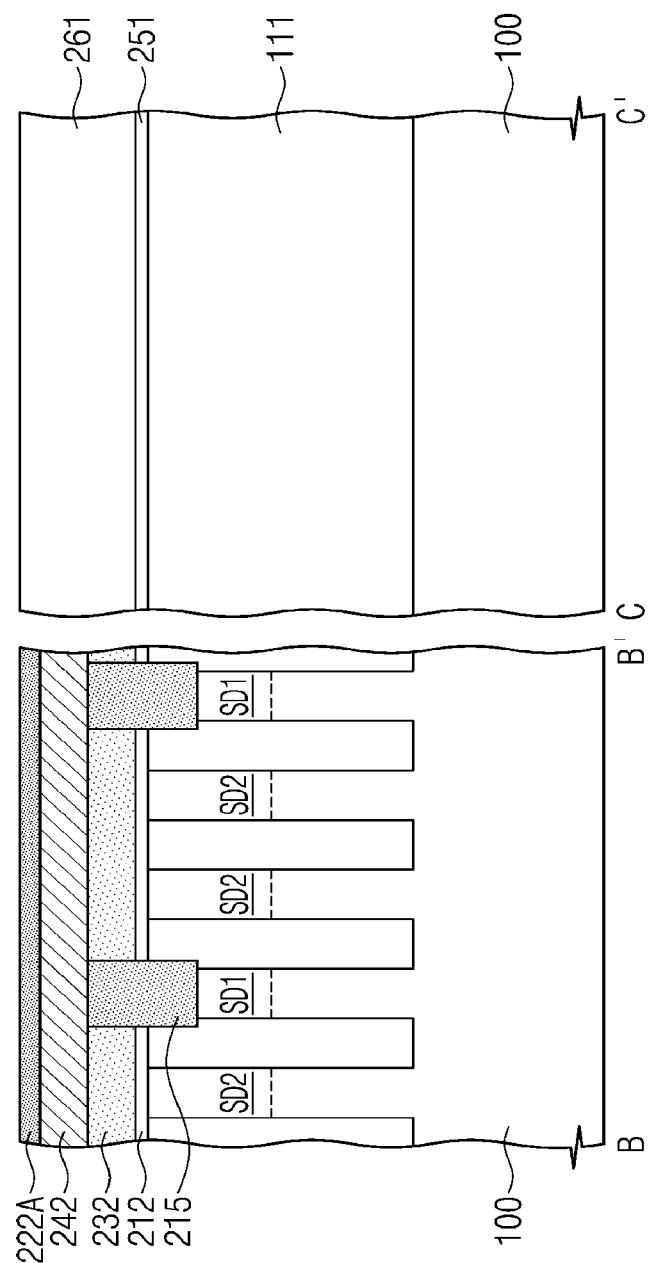

Referring to FIGS. 7A to 7C, an insulating layer may be formed on the second buffer pattern 251, and a planarization process may be performed on the insulating layer to form a lower interlayer insulating layer 261 between the first mask pattern 222 and the core mask pattern 223. The planarization process may be a chemical mechanical polishing (CMP) process. In some embodiments, the planarization process may be performed until an upper portion of the first mask pattern 222 and an upper portion of the core mask pattern 223 are removed. The second buffer pattern 251 may be used as an etch stop layer of the polishing process, and the polishing process may be additionally performed after the second buffer pattern 251 disposed on the mask patterns 223 and 222 is completely removed. As a result, a first mask pattern 222A and a core mask pattern 223A may be formed. The first mask pattern 222A may correspond to a remaining lower portion of the first mask pattern 222, and the core mask pattern 223A may correspond to a remaining lower portion of the core mask pattern 223. The core gate insulating layer 213, the first and second gate electrodes 233 and 243, and the core mask pattern 223A may constitute a core gate structure CG. In some embodiments, the lower interlayer insulating layer 261 may include a material having an etch selectivity with respect to the first mask pattern 222A in an etching process using a specific etch recipe. For example, when the first mask pattern 222A is formed of a silicon nitride layer, the lower interlayer insulating layer 261 may be formed of a silicon oxide layer.

A height h1 from a top surface of the substrate 100 to a top surface of the lower interlayer insulating layer 261 may be the substantially same as a height h2 from the top surface of the substrate 100 to a top surface of the first mask pattern 222A. The height h1 of the top surface of the lower interlayer insulating layer 261 may be the substantially same as a height of a top surface of the core mask pattern 223A. A portion of the second buffer pattern 251 may be removed by the planarization process, and a residual portion of the second buffer pattern 251 may remain between the lower interlayer insulating layer 261 and the substrate 100 and between the lower interlayer insulating layer 261 and the spacers SP1 and SP2.

Figure 8A:
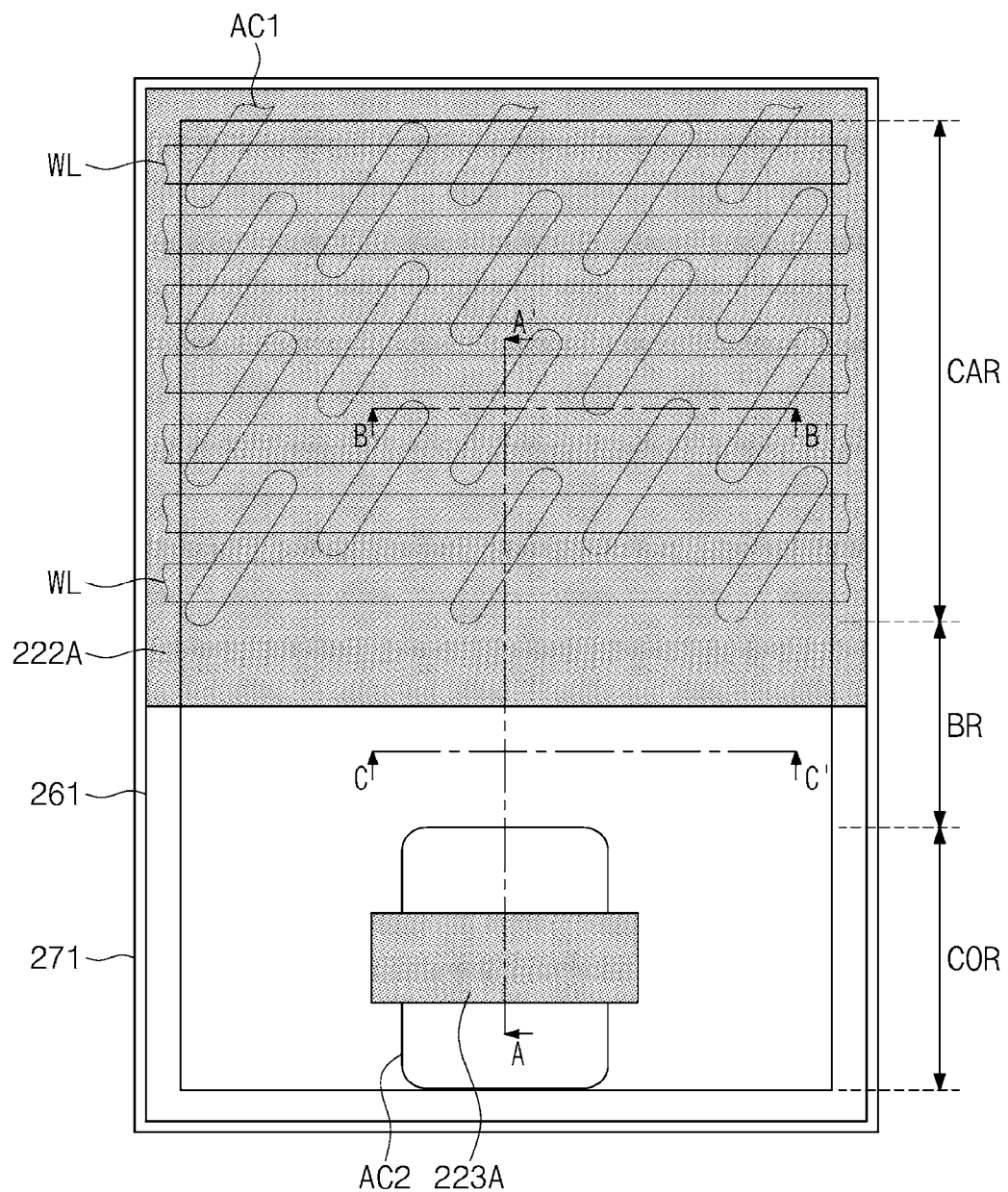
Figure 8B:
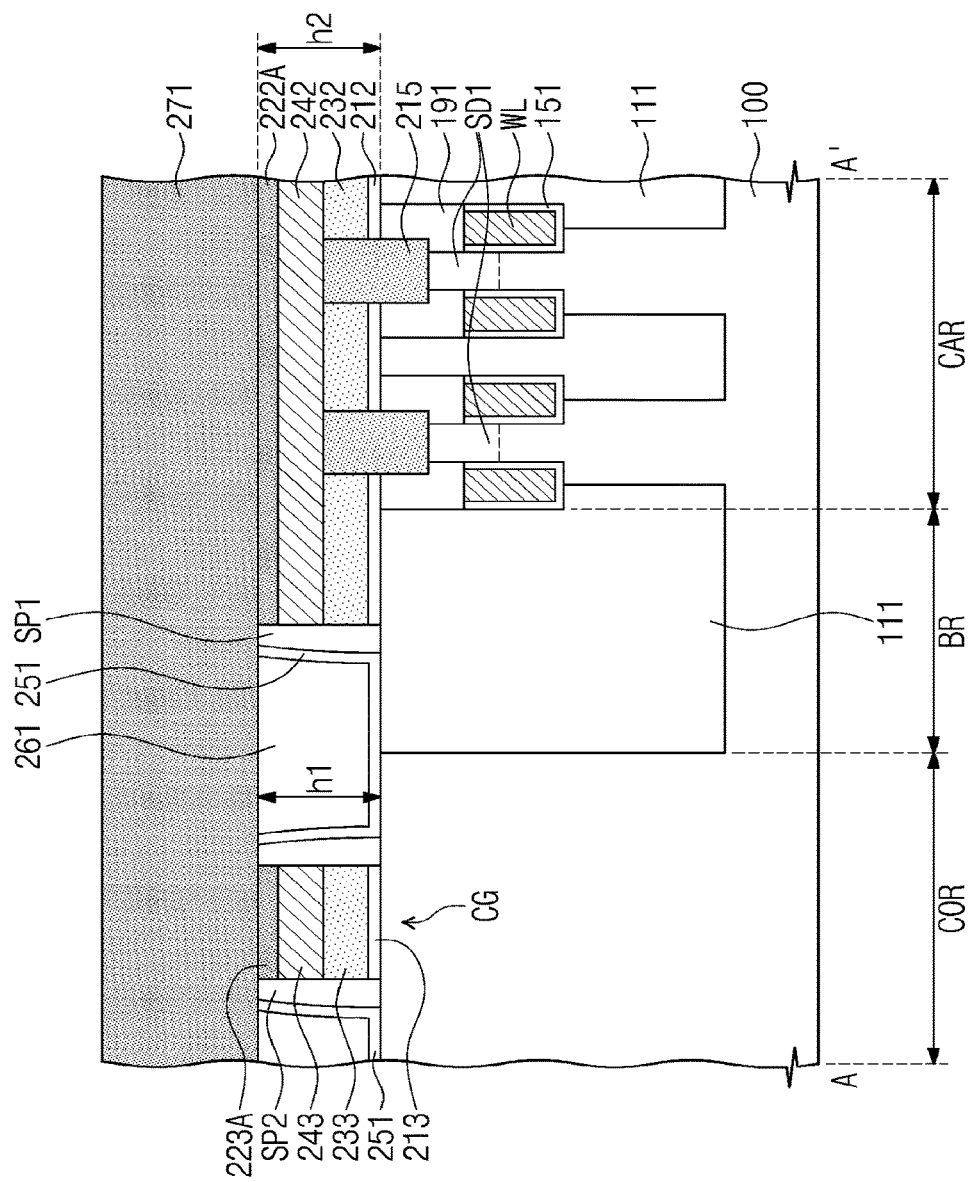
Figure 8C:
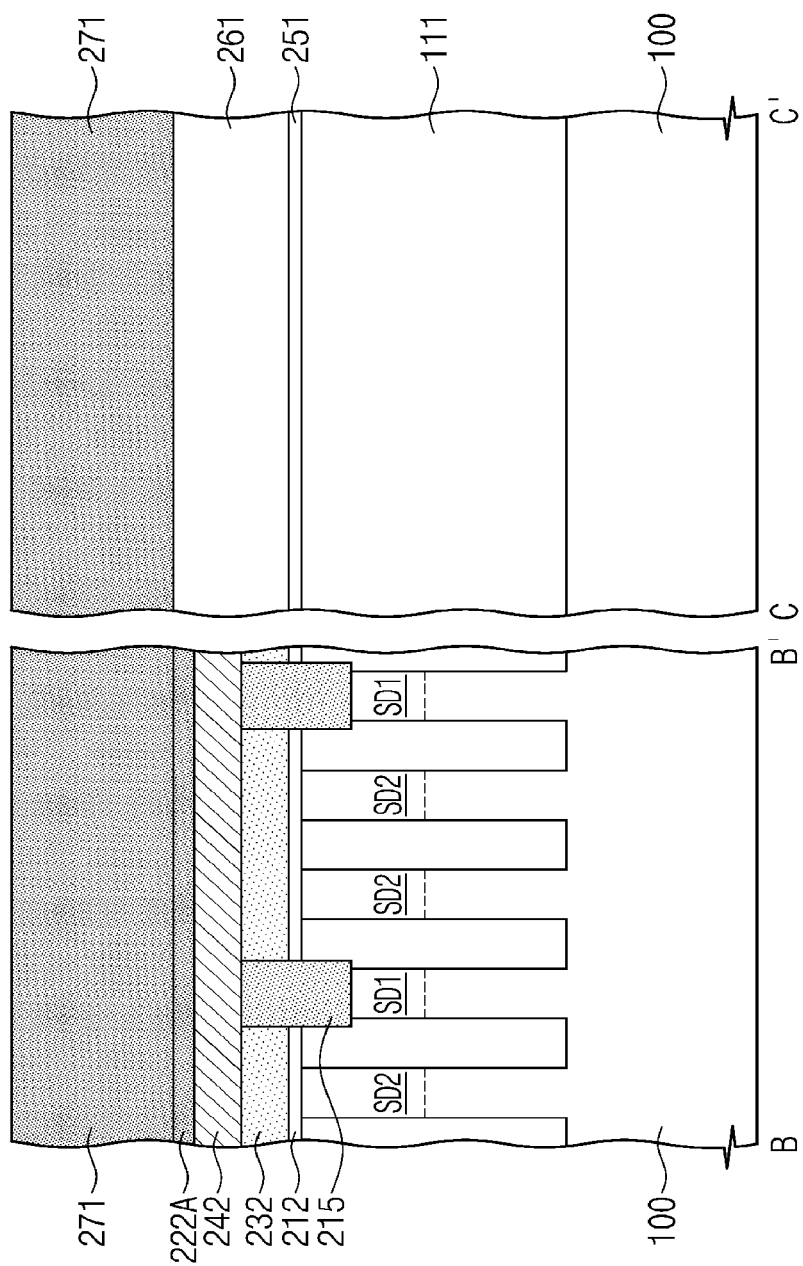

Referring to FIGS. 8A to 8C, a second mask layer 271 may be formed on the substrate 100. The second mask layer 271 may be formed of the same material as the first mask pattern 222A and the core mask pattern 223A. For example, the second mask layer 271 may include a silicon nitride layer. Even though the second mask layer 271 is formed of the same material as the first mask pattern 222A and the core mask pattern 223A, an interface may be generated/provided between the second mask layer 271 and the first mask pattern 222A and between the second mask layer 271 and the core mask pattern 223A since the deposition process for forming the second mask layer 271 is different from the deposition process for forming the mask patterns 222A and 223A. The second mask layer 271 may be thicker than the first mask layer 221 described with reference to FIGS. 5A to 5C. For example, the second mask layer 271 may be formed by a CVD process.

Figure 9A:
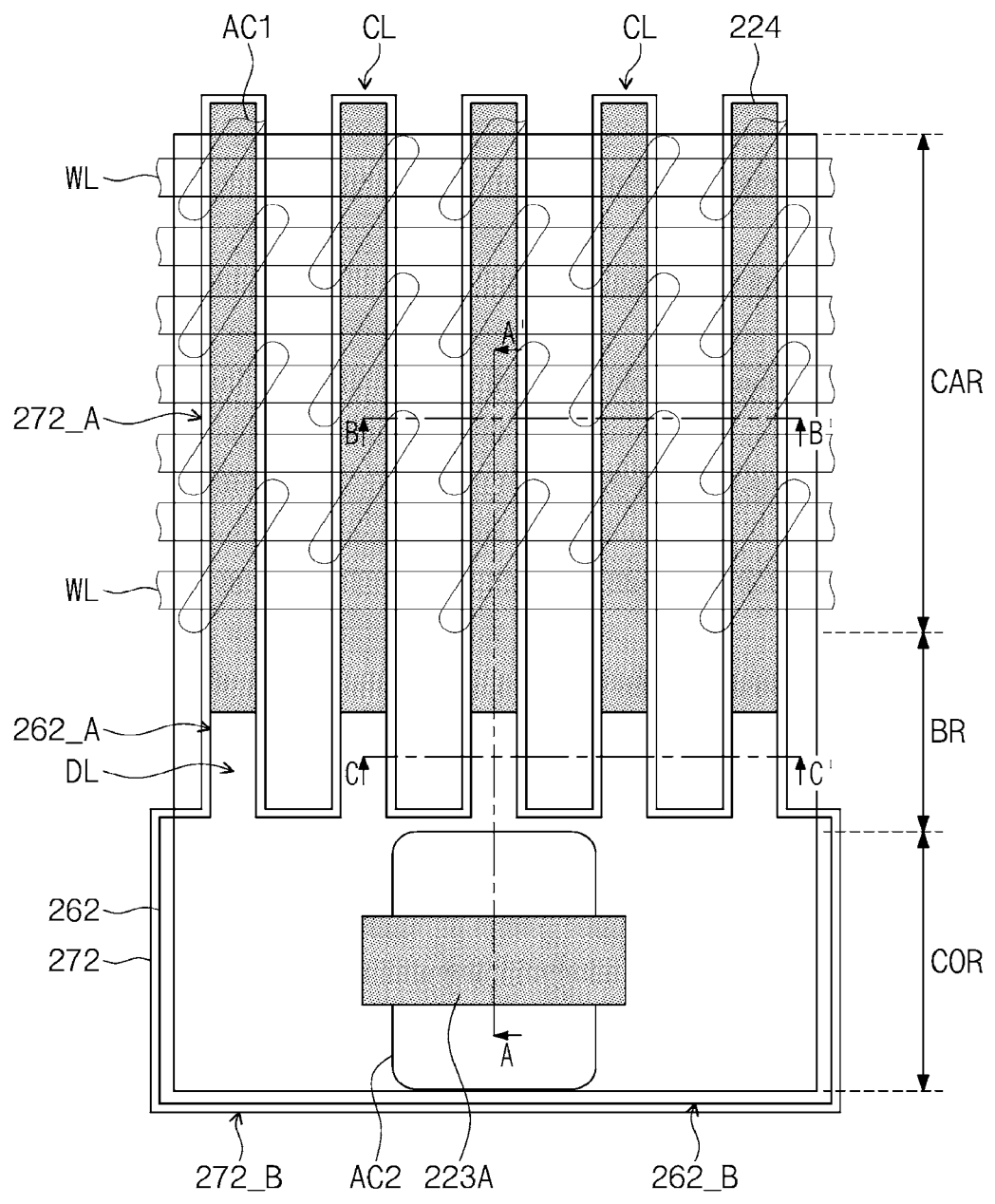
Figure 9B:
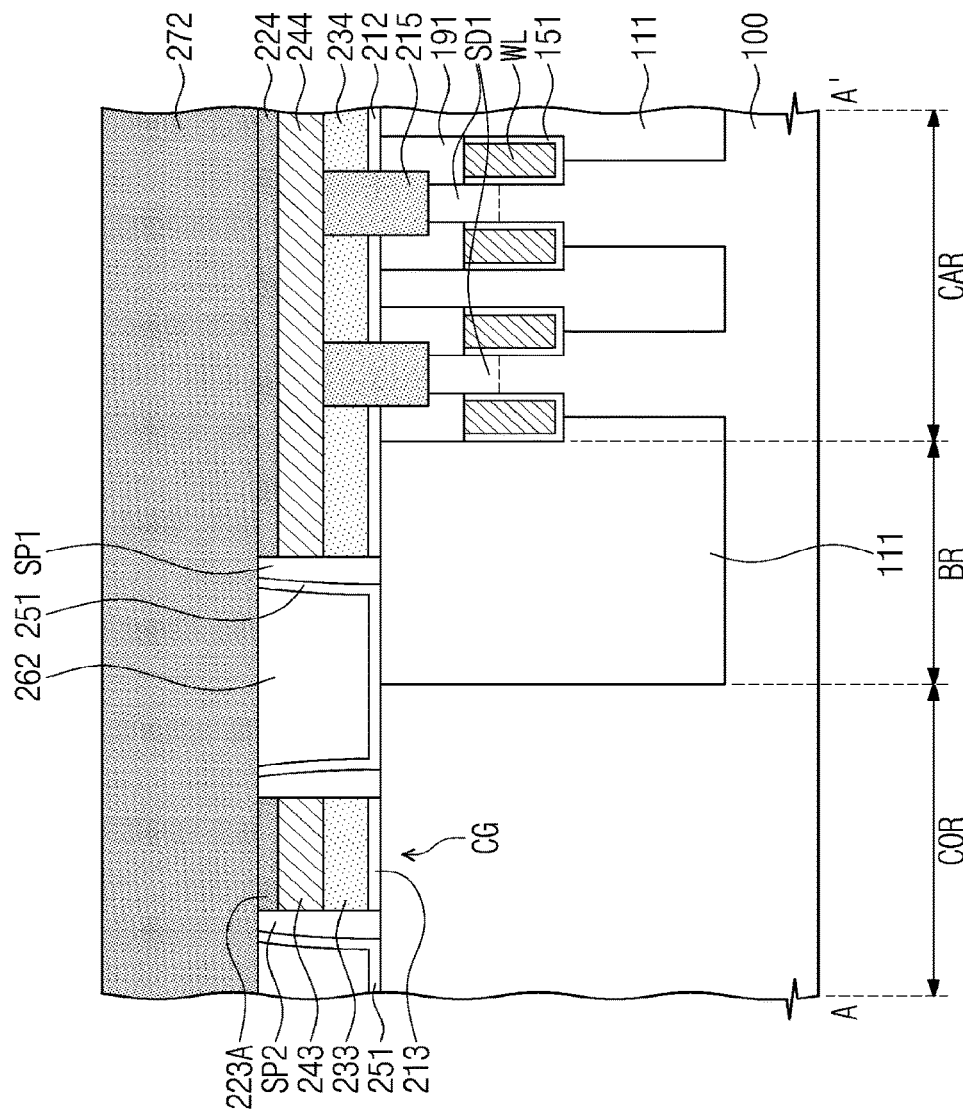
Figure 9C:
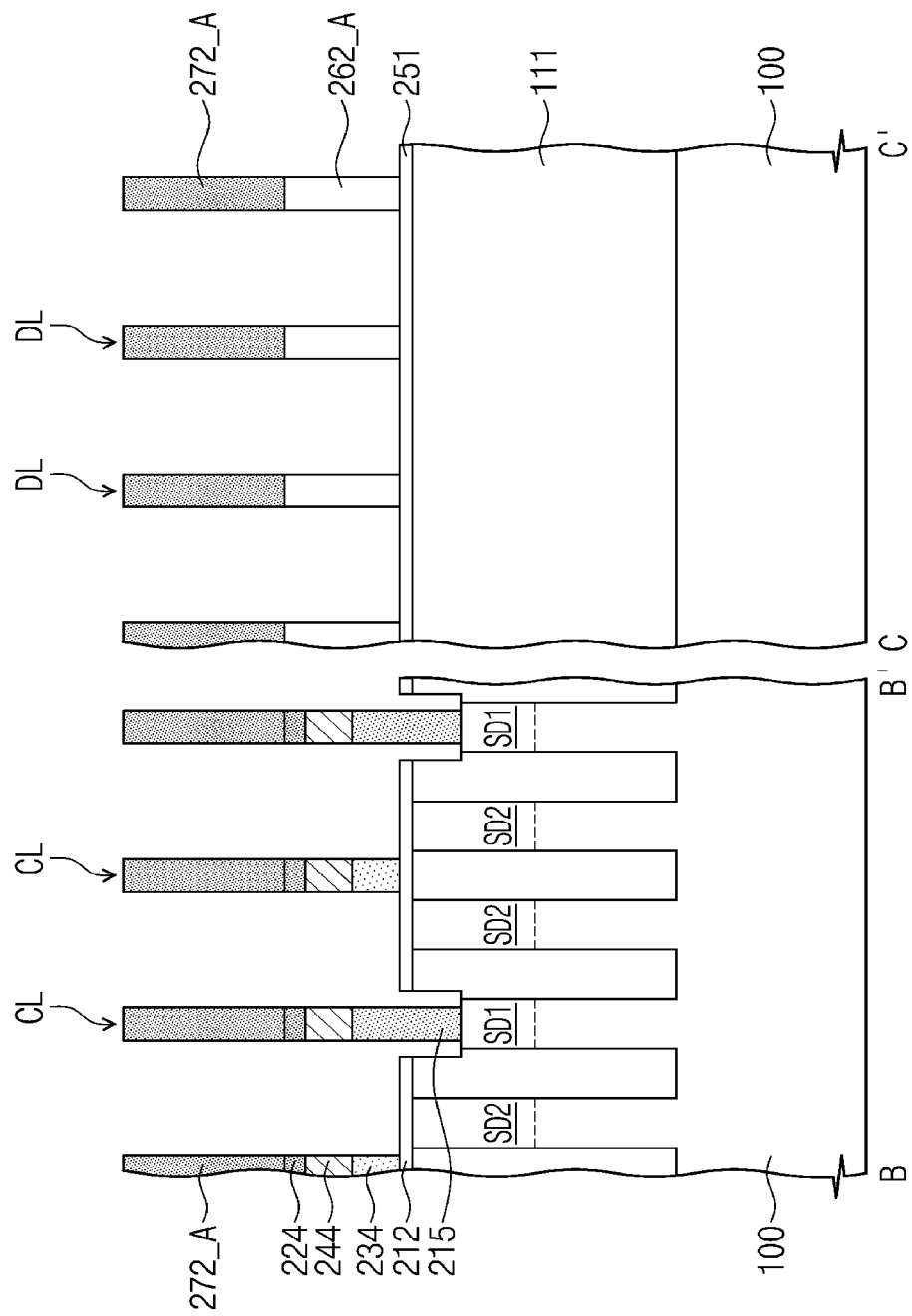
Figure 10A:
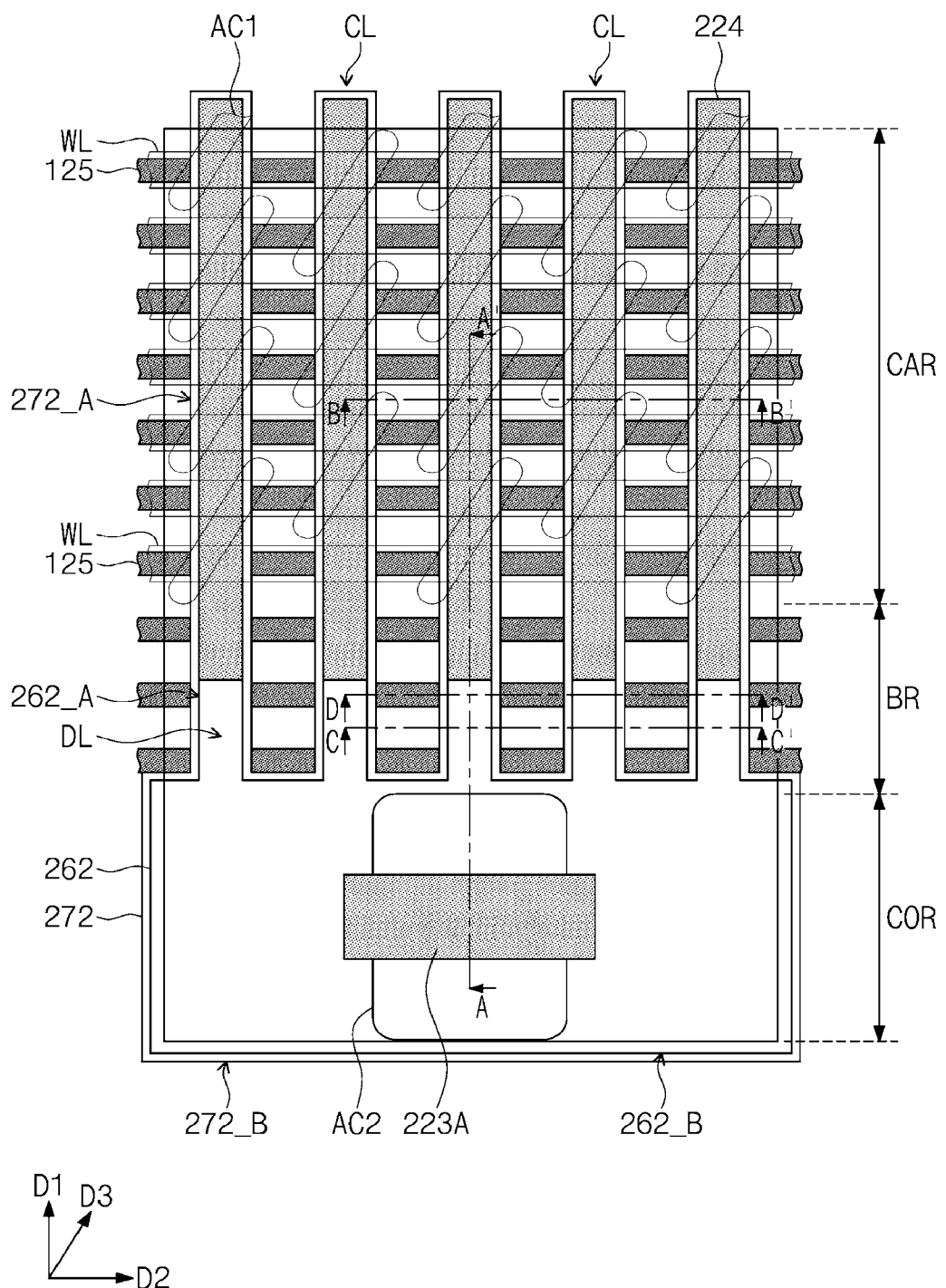
Figure 10B:
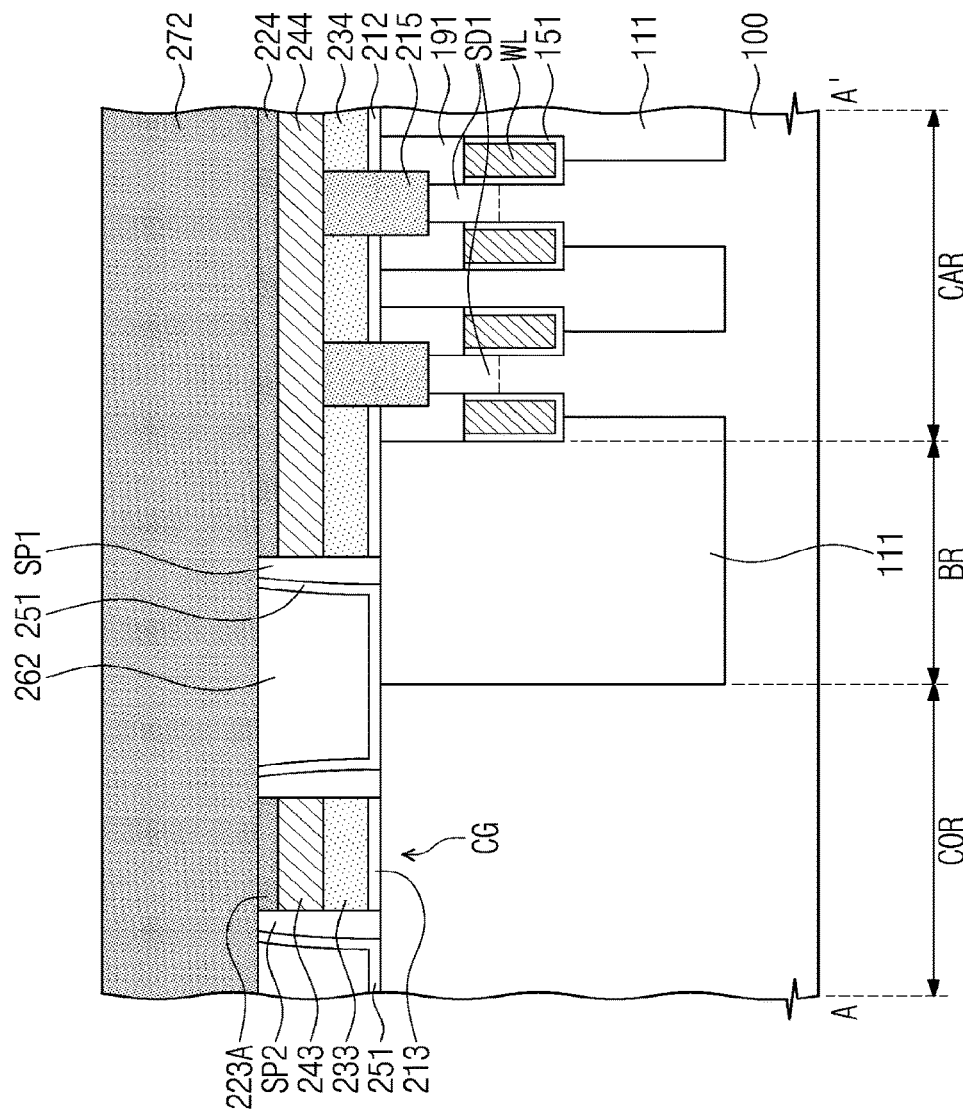
Figure 10C:
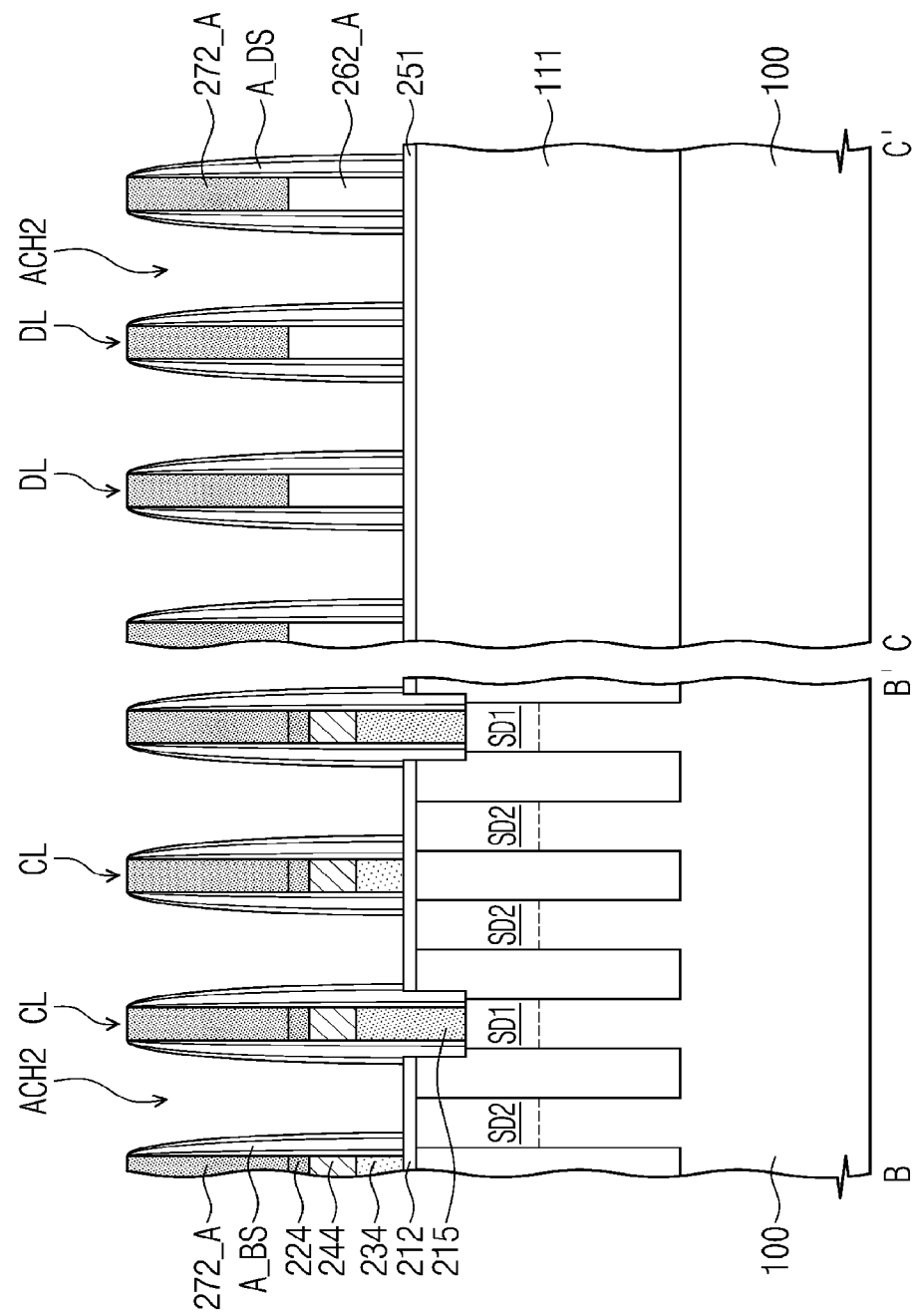
Figure 10D:
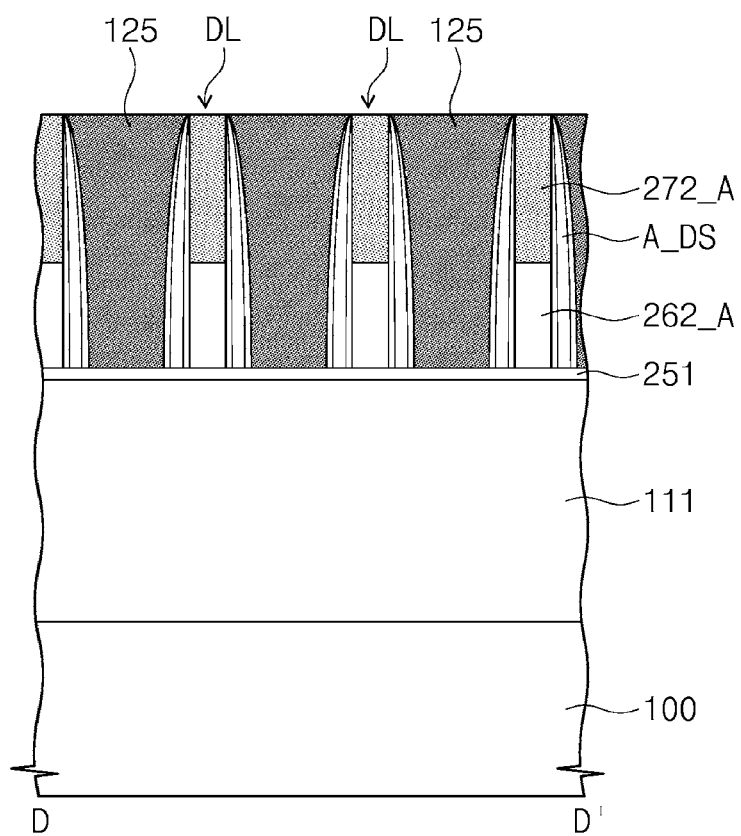
FIG. 10D is a cross-sectional view taken along a line D-D' of FIG. 10A.

Referring to FIGS. 9A to 9C, the second mask layer 271 may be patterned to form a second insulating pattern 272. The second insulating pattern 272 may be formed by an etching process using a photoresist pattern as an etch mask. The second insulating pattern 272 may include first portions 272_A on the cell region CAR and the boundary region BR. The second insulating pattern 272 may also include a second portion 272_B that covers the core region COR and is connected in common (e.g., continuously) to the first portions 272_A. The first portions 272_A may have linear shapes extending in the first direction D1 and may be arranged along the second direction D2. The lower interlayer insulating layer 261 and the second mask layer 271 may include different insulating materials, respectively, so that these layers 261, 271 will have an etch selectivity with respect to each other. Accordingly, the first portions 262_A and the first portions 272_A may include the different respective insulating materials. For example, the first portions 262_A and the first portions 272_A may include oxide and nitride (e.g., silicon nitride) materials, respectively.

The first mask pattern 222A, the second conductive pattern 242, and the first conductive pattern 232 may be sequentially etched using the second insulating pattern 272 as an etch mask. As a result, cell conductive lines CL may be formed on the cell region CAR. Each of the cell conductive lines CL may include a first sub-conductive line 234, a second sub-conductive line 244, a first insulating pattern 224, and the second insulating pattern 272 which are sequentially stacked. A portion of the connection contact 215 may also be removed by the etching process. The first buffer pattern 212 may not be etched by the etching process in FIGS. 9A-9C. Alternatively, the first buffer pattern 212 may also be patterned by the etching process.

The lower interlayer insulating layer 261 may be formed into a third insulating pattern 262 by the etching process. In other words, the lower interlayer insulating layer 261 may also be etched by the etching process using the second insulating pattern 272 as the etch mask. The third insulating pattern 262 may include first portions 262_A respectively aligned with the cell conductive lines CL on the boundary region BR, and a second portion 262_B connected in common (e.g., continuously) to the first portions 262_A and covering the core region COR. The first portions 262_A of the third insulating pattern 262 and the first portions 272_A of the second insulating pattern 272 disposed on the first portions 262_A may be defined as dummy lines DL. The first buffer pattern 212 may not be etched by the etching process in FIGS. 9A-9C. Alternatively, the first buffer pattern 212 may also be patterned by the etching process.

The first portions 272_A may be portions of the cell conductive lines CL on the cell region CAR and may be portions of the dummy lines DL on the boundary region BR. In other words, the first portions 272_A of the second insulating pattern 272 may be disposed on the first portions 262_A of the third insulating pattern 262, and the second portion 272_B of the second insulating pattern 272 may be disposed on the second portion 262_B of the third insulating pattern 262. The second buffer pattern 251 may not be etched by the etching process in FIGS. 9A-9C. Alternatively, at least a portion of the second buffer pattern 251 may also be etched by the etching process.

Referring to FIGS. 10A to 10D, preliminary spacers may be formed on sidewalls of the cell conductive lines CL and sidewalls of the dummy lines DL. In some embodiments, an insulating layer may be conformally formed on the cell conductive lines CL and the dummy lines DL, and an anisotropic etching process may be performed on the insulating layer to form the preliminary spacers. The preliminary spacers may include preliminary cell spacers A_BS formed on the sidewalls of the cell conductive lines CL and preliminary dummy spacers A_DS formed on the sidewalls of the dummy lines DL. The insulating layer for the formation of the preliminary spacers A_BS and A_DS may include a plurality of insulating layers, as described with reference to the layers/sub-spacers of the cell and dummy spacers BS and DS of FIG. 2D.

Fence insulating patterns 125 may be formed between the cell conductive lines CL and between the dummy lines DL. The fence insulating patterns 125 may be two-dimensionally arranged along the first direction D1 and the second direction D2 on the cell region CAR and the boundary region BR. The cell conductive lines CL, the dummy lines DL, and the fence insulating patterns 125 may define preliminary second contact holes ACH2. Top surfaces of the fence insulating patterns 125 may be disposed at the substantially same height as the top surface of the second insulating pattern 272. The fence insulating patterns 125 may include at least one of silicon nitride or silicon oxynitride. The process of forming the fence insulating patterns 125 may include a process of forming a plurality of insulating layers having different etch rates under (e.g., using) a specific etch recipe and a process of patterning the plurality of insulating layers.

Figure 11A:
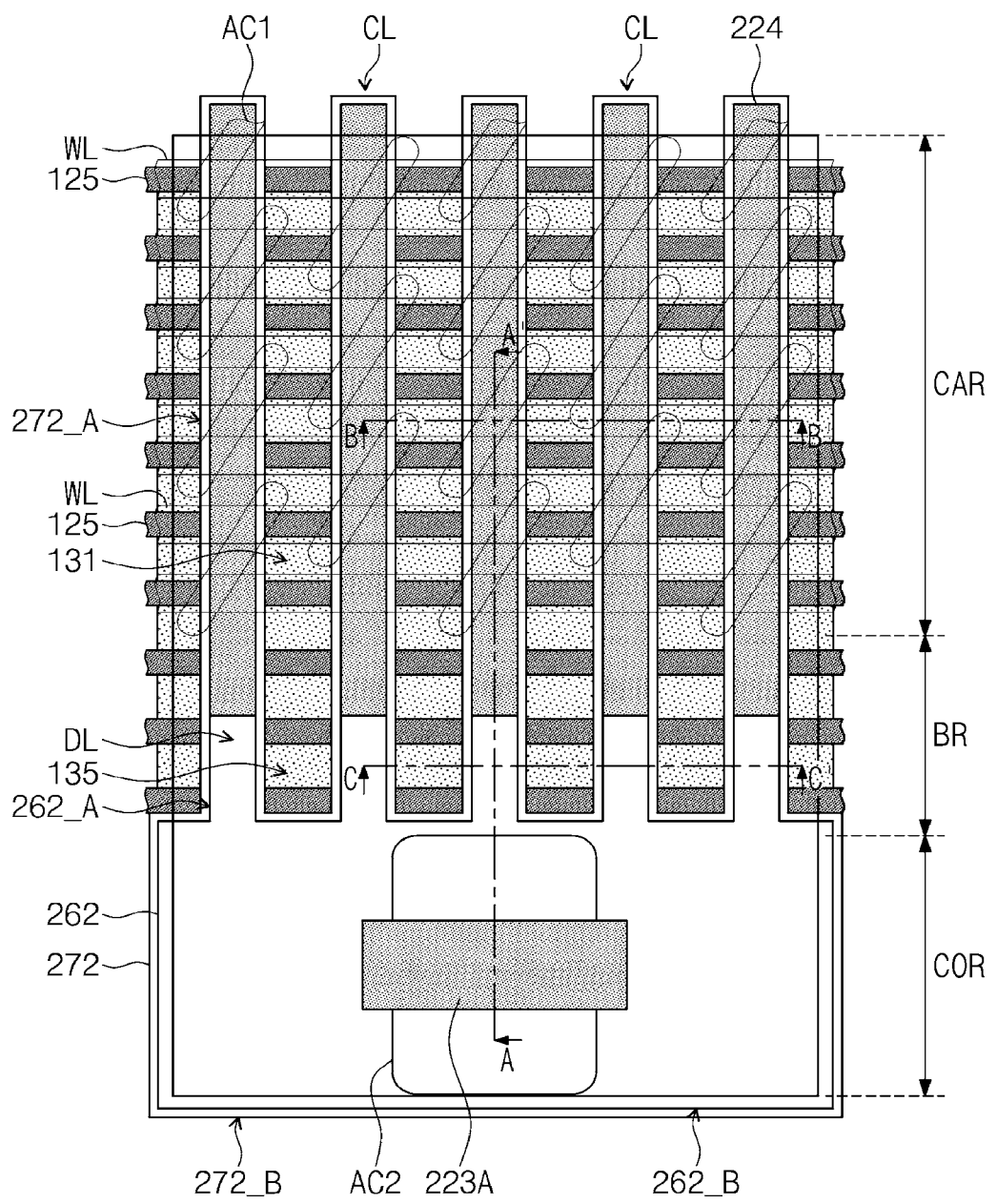
Figure 11B:
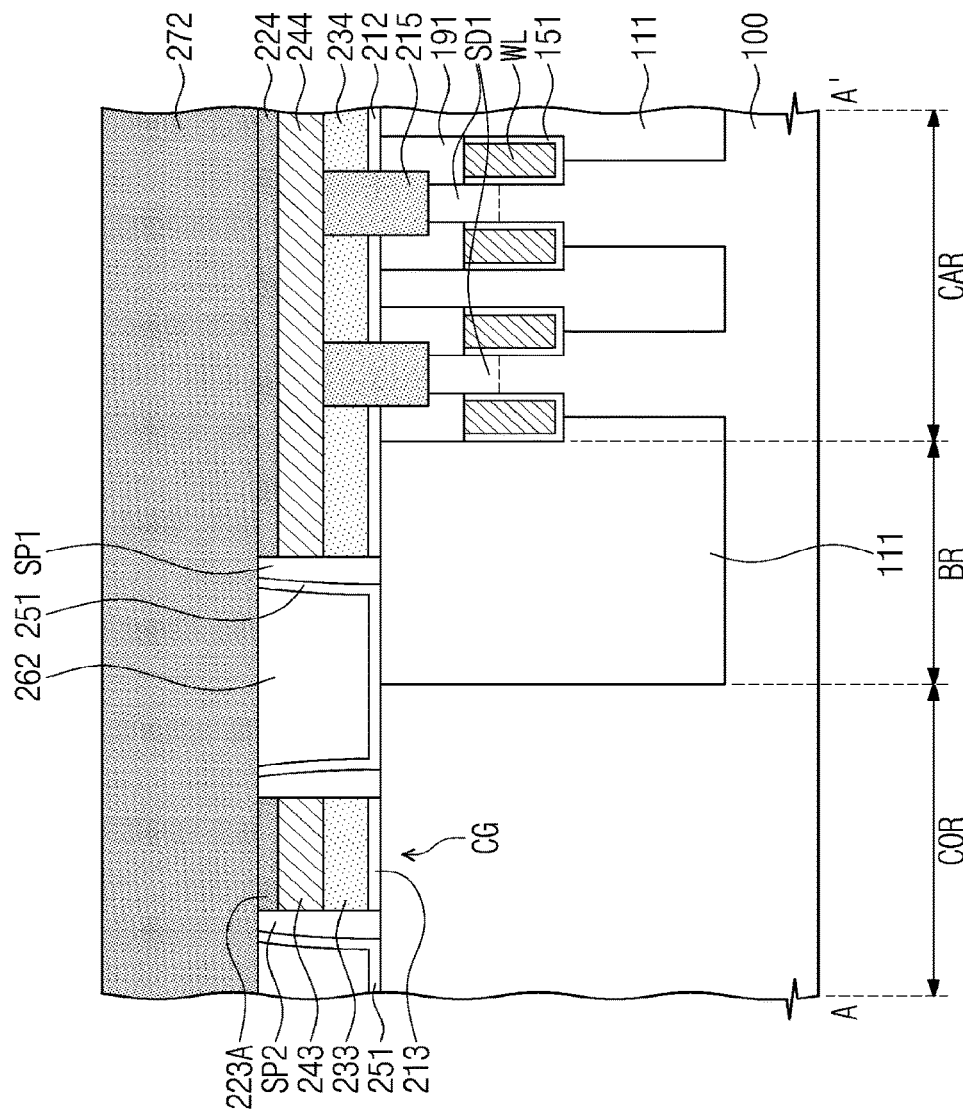
Figure 11C:
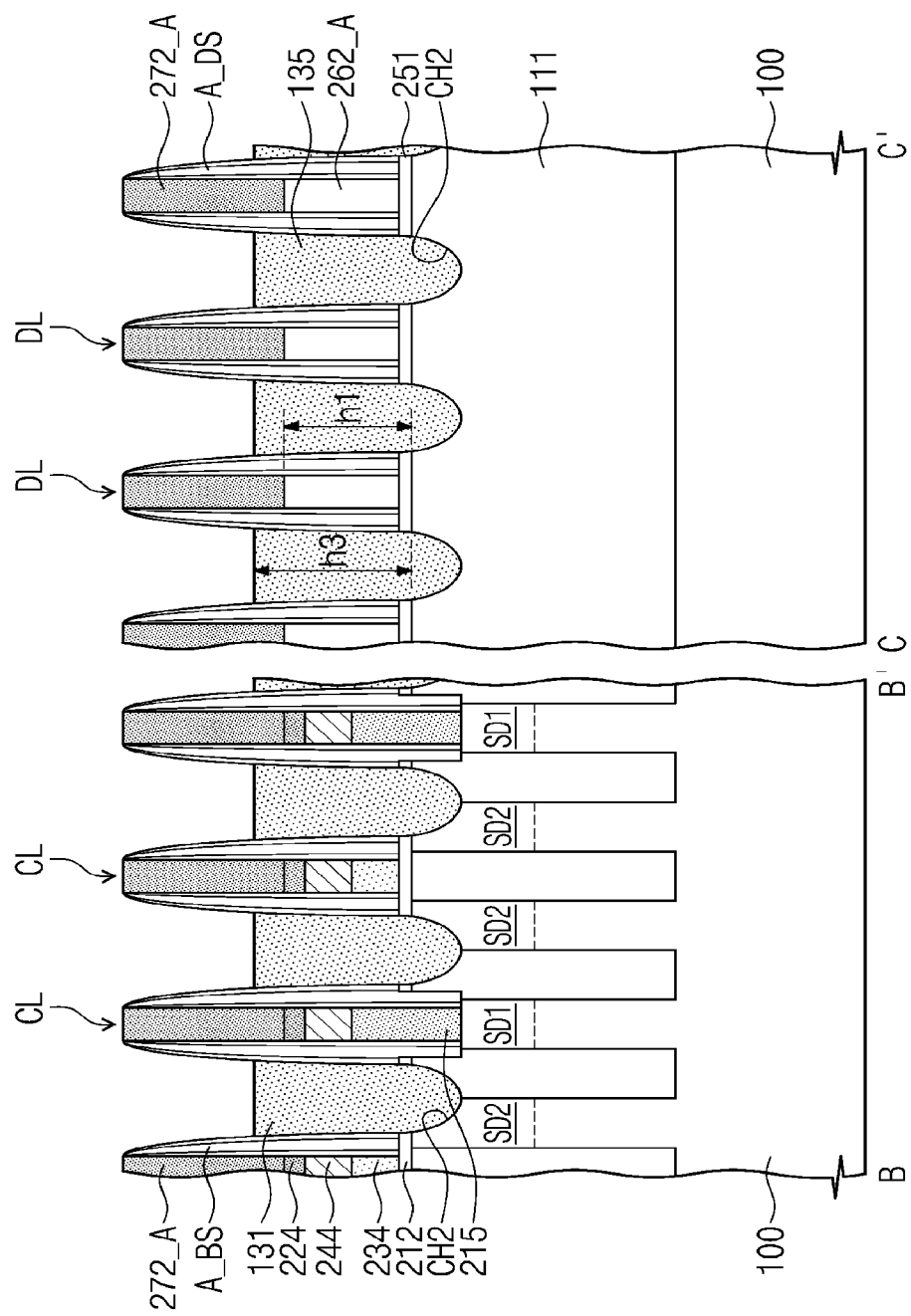

Referring to FIGS. 11A to 11C, the preliminary second contact holes ACH2 may be extended downward to form second contact holes CH2 exposing the second dopant regions SD2. Forming the second contact holes CH2 may include etching portions of the first buffer pattern 212, the second buffer pattern 251, the device isolation layer 111 and the second dopant regions SD2. Inner surfaces of lower regions of the second contact holes CH2 are rounded in FIG. 11C. However, embodiments of present inventive concepts are not limited thereto.

Preliminary lower contacts may be formed in respective ones of the second contact holes CH2. The preliminary lower contacts may include preliminary cell contacts 131 on/in the cell region CAR and preliminary dummy contacts 135 on/in the boundary region BR. For example, the preliminary lower contacts 131 and 135 may include a doped semiconductor material such as doped silicon. The process of forming the preliminary lower contacts 131 and 135 may include a deposition process and an etch-back process. After the etch-back process, a height h3 of top surfaces of the preliminary lower contacts 131 and 135 may be higher than a height h1 of the top surface of the third insulating pattern 262, e.g., a height h1 of top surfaces of the first portions 262_A of the third insulating pattern 262.

Referring to FIG. 12, upper portions of the preliminary spacers A_BS and A_DS exposed by the preliminary lower contacts 131 and 135 may be etched. Thus, cell spacers BS may be formed on the sidewalls of the cell conductive lines CL and dummy spacers DS may be formed on the sidewalls of the dummy lines DL. In other words, a height of top surfaces of the spacers BS and DS may be defined by the preliminary lower contacts 131 and 135. The sidewalls of the first portions 272_A of the second insulating pattern 272 are exposed in FIG. 12. Alternatively, a portion of the preliminary cell spacer A_BS may remain on the sidewall of the first portion 272_A.

Referring to FIG. 13, upper spacers 128 may be formed on the exposed sidewalls of the first portions 272_A. The upper spacers 128 may include at least one of a silicon oxide layer, a silicon nitride layer, or a silicon oxynitride layer. Alternatively, the upper spacers 128 may be omitted. In some embodiments, the upper spacer 128 may correspond to a layer of the insulating layers of the preliminary cell spacer A_BS, which is nearest to and remains on the sidewall of the first portion 272_A.

An etching process may be performed on the preliminary lower contacts 131 and 135 to form cell lower contacts 132 and dummy lower contacts 136. A height of top surfaces of the lower contacts 132 and 136 may be lower than a height of top surfaces of the second sub-conductive lines 244. The height of the top surfaces of the lower contacts 132 and 136 is higher than a height of top surfaces of the first sub-conductive lines 234 in FIG. 13. However, embodiments of present inventive concepts are not limited thereto.

Referring again to FIGS. 2A to 2D, a conductive layer may be formed on the resultant structure having the lower contacts 132 and 136, and a patterning process may be performed on the conductive layer to form upper contacts LP and core conductive lines CCL. The upper contacts LP may be formed on the cell lower contacts 132, and the core conductive lines CCL may be formed on the dummy lower contacts 136. The core conductive lines CCL may be connected to the cell conductive lines CL through vias CT, and the vias CT may be formed together with the upper contacts LP and the core conductive lines CCL. For example, the upper contacts LP may include at least one of tungsten (W), aluminum (Al), copper (Cu), nickel (Ni), cobalt (Co), or any conductive nitride thereof. A portion of each of the cell conductive lines CL may be etched during the patterning process. An insulating layer may be deposited after the patterning process, and a planarization process may be performed on the deposited insulating layer to form an upper interlayer insulating layer 141. The upper interlayer insulating layer 141 may include a silicon oxide layer. Data storage elements SE may be formed on respective ones of the upper contacts LP.

If the top surface of the third insulating pattern 262 is higher than the top surfaces of the dummy spacers DS, sidewalls of the third insulating pattern 262 may be exposed and etched in the process of FIG. 12 or 13. Thus, an electrical short may occur between the core conductive lines CCL formed thereafter.

According to some embodiments of present inventive concepts, the top surface of the third insulating pattern 262 may be lower than the top surfaces of the dummy spacers DS (or the step portion ST). Thus, the spacers BS and DS may protect the third insulating pattern 262 from the subsequent etching process. In more detail, the dummy spacers DS may protect the third insulating pattern 262 during the etch-back process of FIG. 12 and/or the etching process of FIG. 13.

Figure 14A:
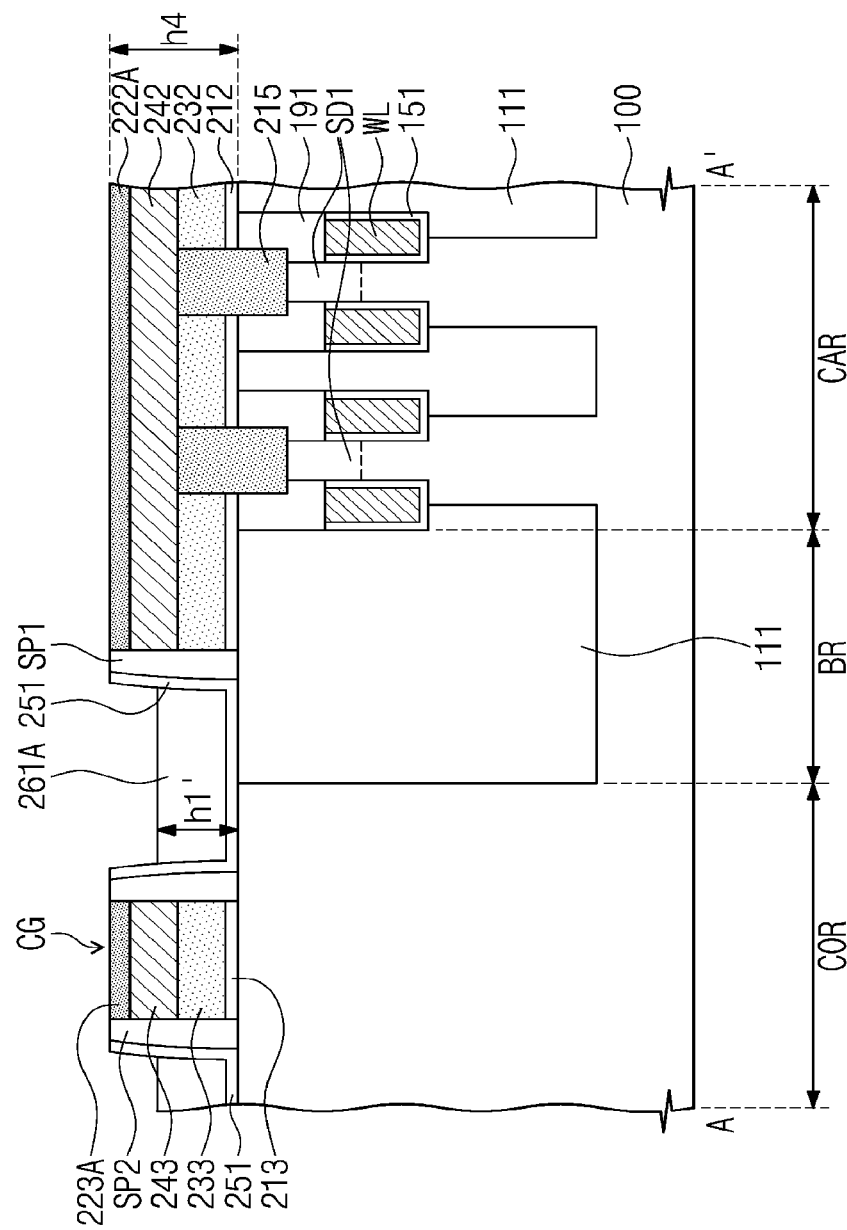
FIGS. 14A and 15A are cross-sectional views taken along the lines A-A' of FIGS. 7A and 2A, respectively, to illustrate a method of fabricating a semiconductor device according to some embodiments of present inventive concepts.
Figure 14B:
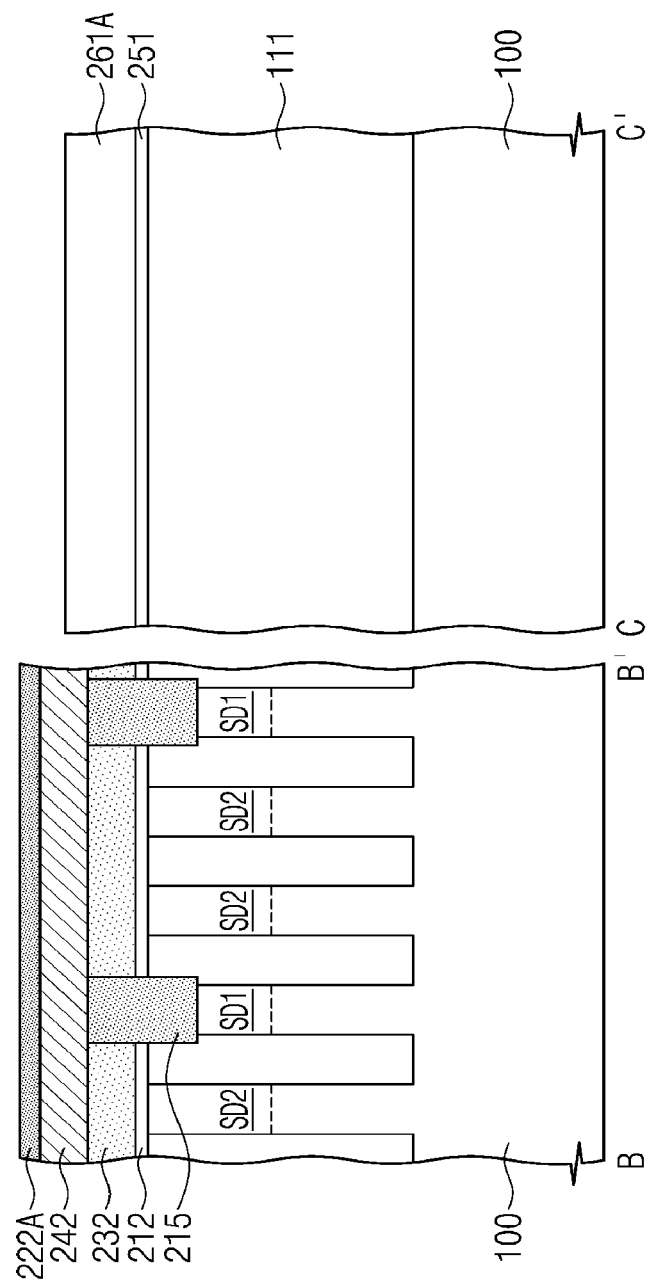
FIGS. 14B and 15B are cross-sectional views taken along the lines B-B' and C-C' of FIGS. 7A and 2A, respectively.
Figure 15A:
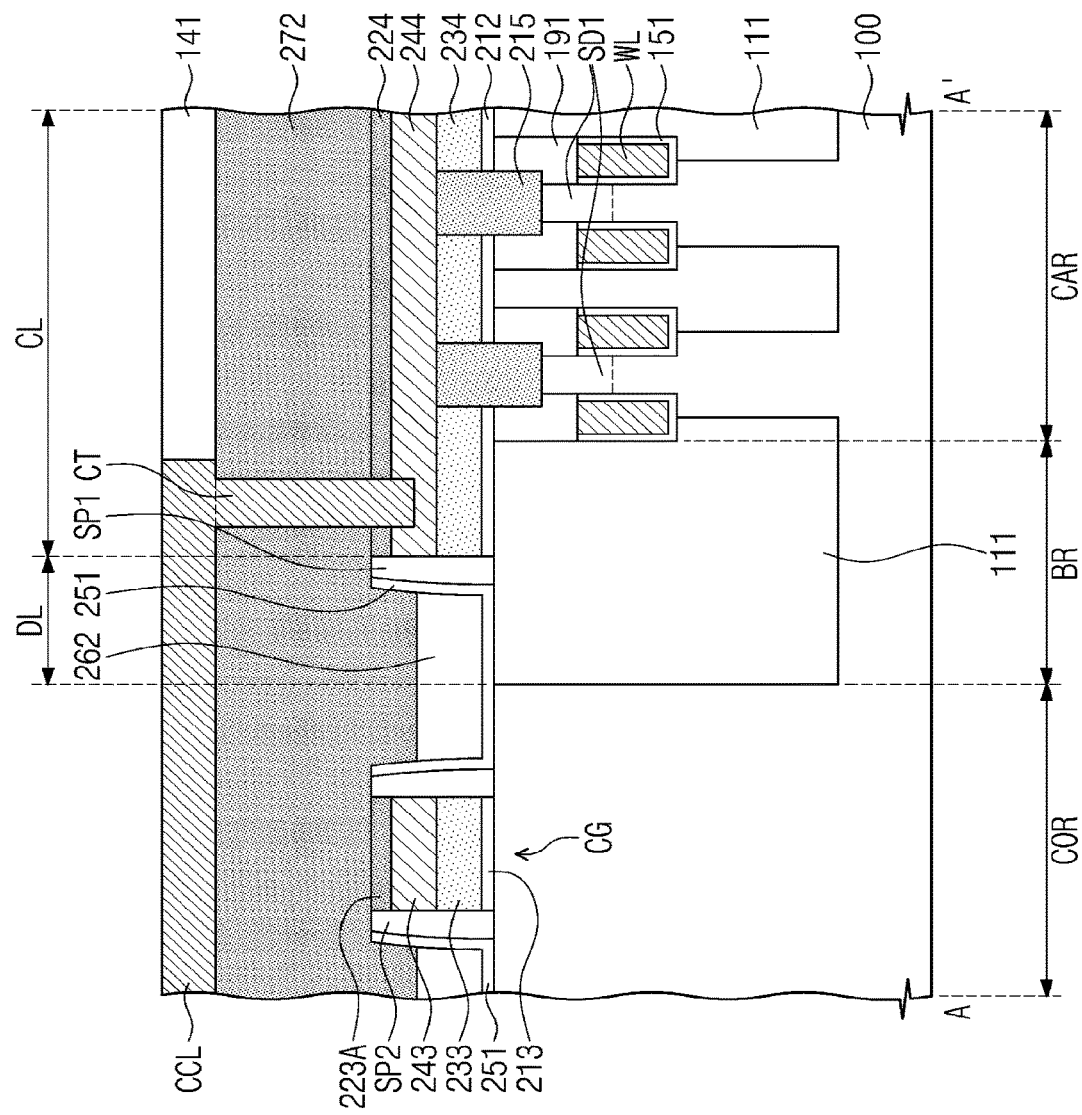
Figure 15B:
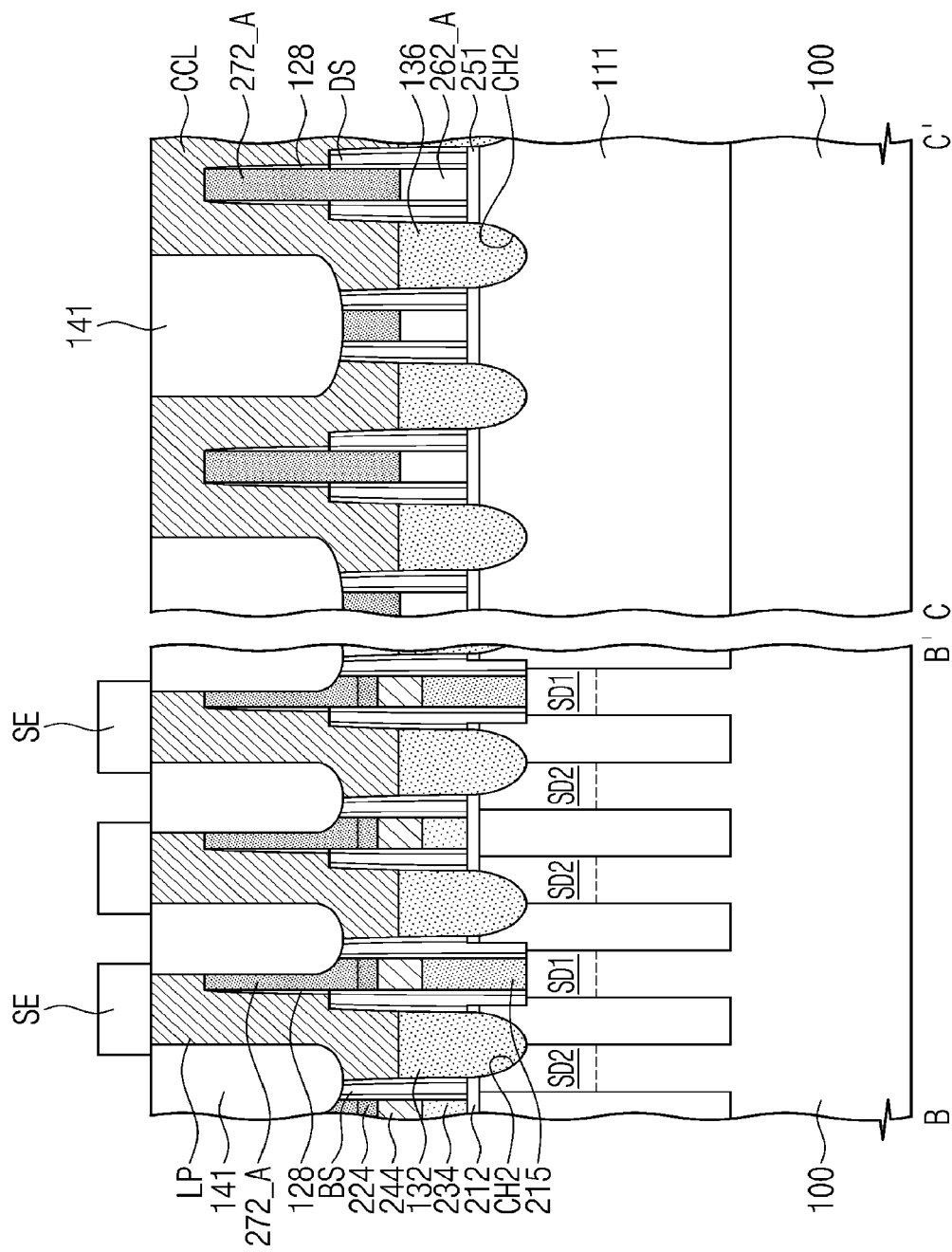

FIGS. 14A and 15A are cross-sectional views taken along the lines A-A' of FIGS. 7A and 2A, respectively, to illustrate a method of fabricating a semiconductor device according to some embodiments of present inventive concepts. FIGS. 14B and 15B are cross-sectional views taken along the lines B-B' and C-C' of FIGS. 7A and 2A, respectively. In FIGS. 14A-15B, descriptions of previously-discussed elements may be omitted or mentioned briefly for the purpose of ease and convenience in explanation.

Referring to FIGS. 14A and 14B, an upper portion of the lower interlayer insulating layer 261 of FIGS. 7A to 7C may be additionally etched. A height h1' of a top surface of the etched lower interlayer insulating layer 261A may be lower than a height h4 (which may equal the height h2) of the top surface of the first mask pattern 222A. The process of forming the lower interlayer insulating layer 261A may include a selective etching process. For example, the selective etching process may be a wet etching process using phosphoric acid. In some embodiments, the top surface of the lower interlayer insulating layer 261A may be lower than a top surface of the second conductive pattern 242.

After the formation of the lower interlayer insulating layer 261A, the processes of FIGS. 8A to 11A, 8B to 11B, 8C to 11C, 12, and 13 may be performed to fabricate a semiconductor device illustrated in FIGS. 15A and 15B. As illustrated in FIG. 15A, the second insulating pattern 272 may extend between the second sub-conductive line 244 and the second gate electrode 243. As illustrated in FIG. 15B, a top surface of a third insulating pattern 262 (e.g., top surfaces of first portions 262_A of the third insulating pattern 262) may be lower than the top surfaces of the second sub-conductive lines 244.

Figure 16A:
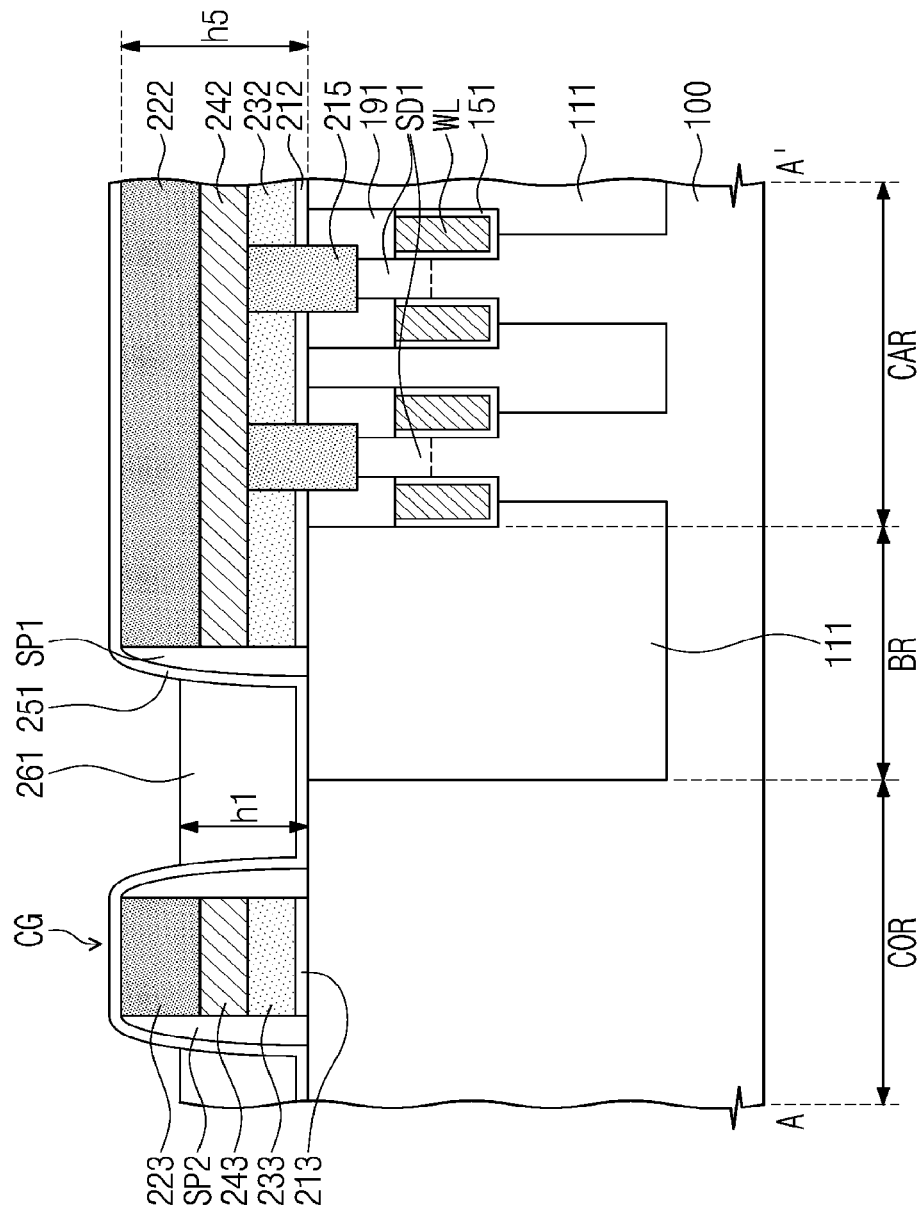
FIGS. 16A and 17A are cross-sectional views taken along the lines A-A' of FIGS. 7A and 2A, respectively, to illustrate a method of fabricating a semiconductor device according to some embodiments of present inventive concepts.
Figure 16B:
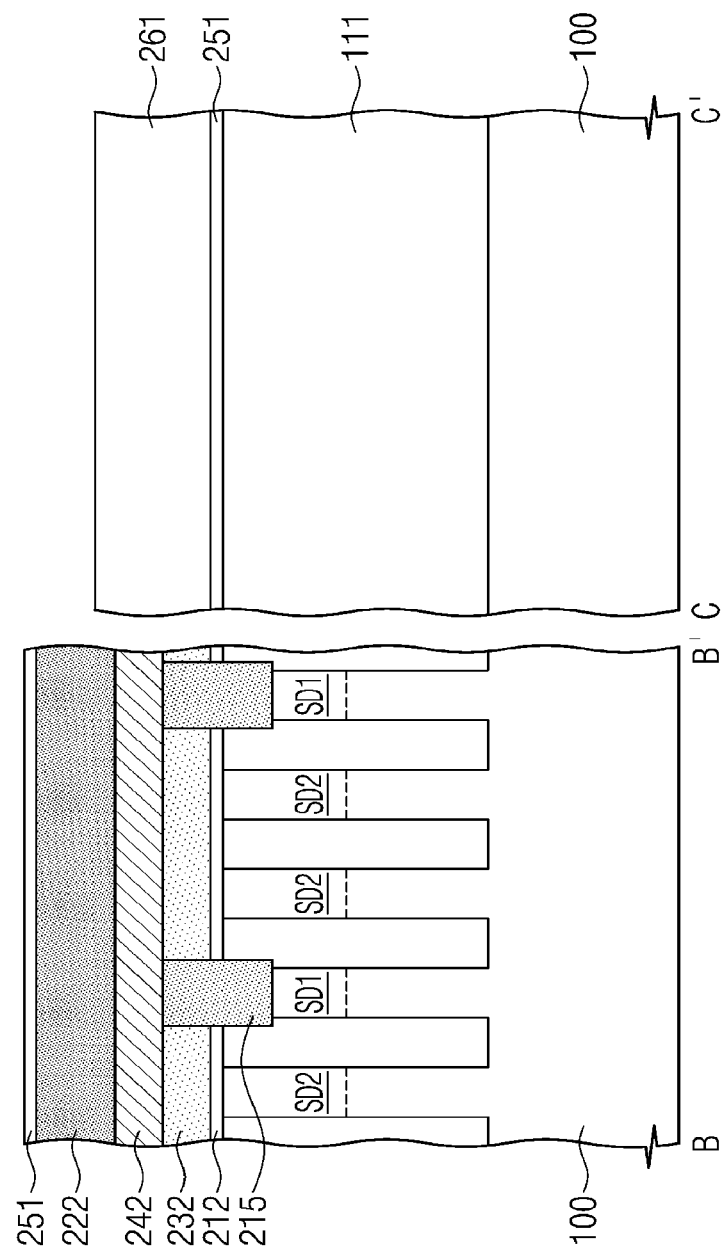
FIGS. 16B and 17B are cross-sectional views taken along the lines B-B' and C-C' of FIGS. 7A and 2A, respectively.
Figure 17A:
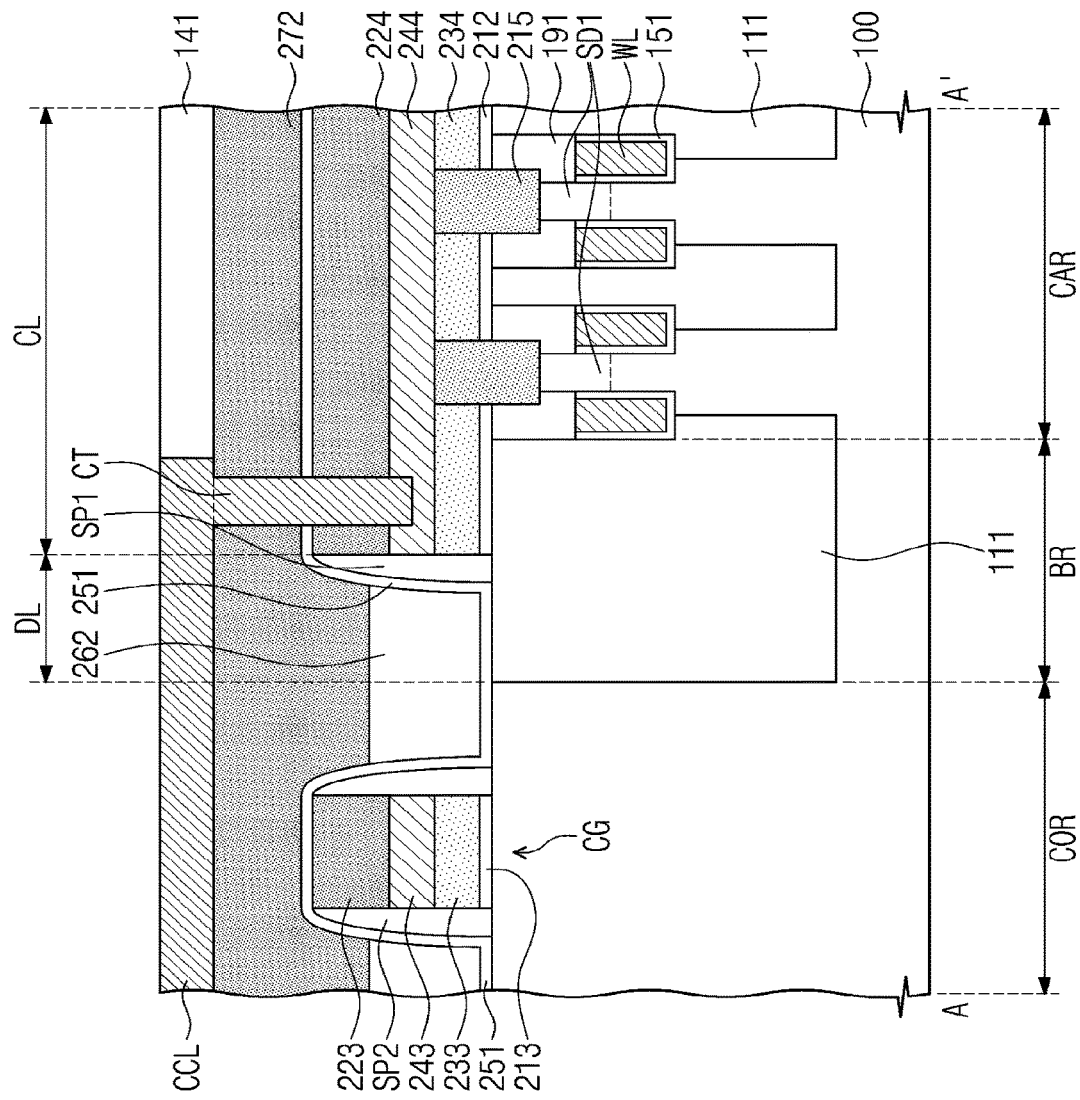
Figure 17B:
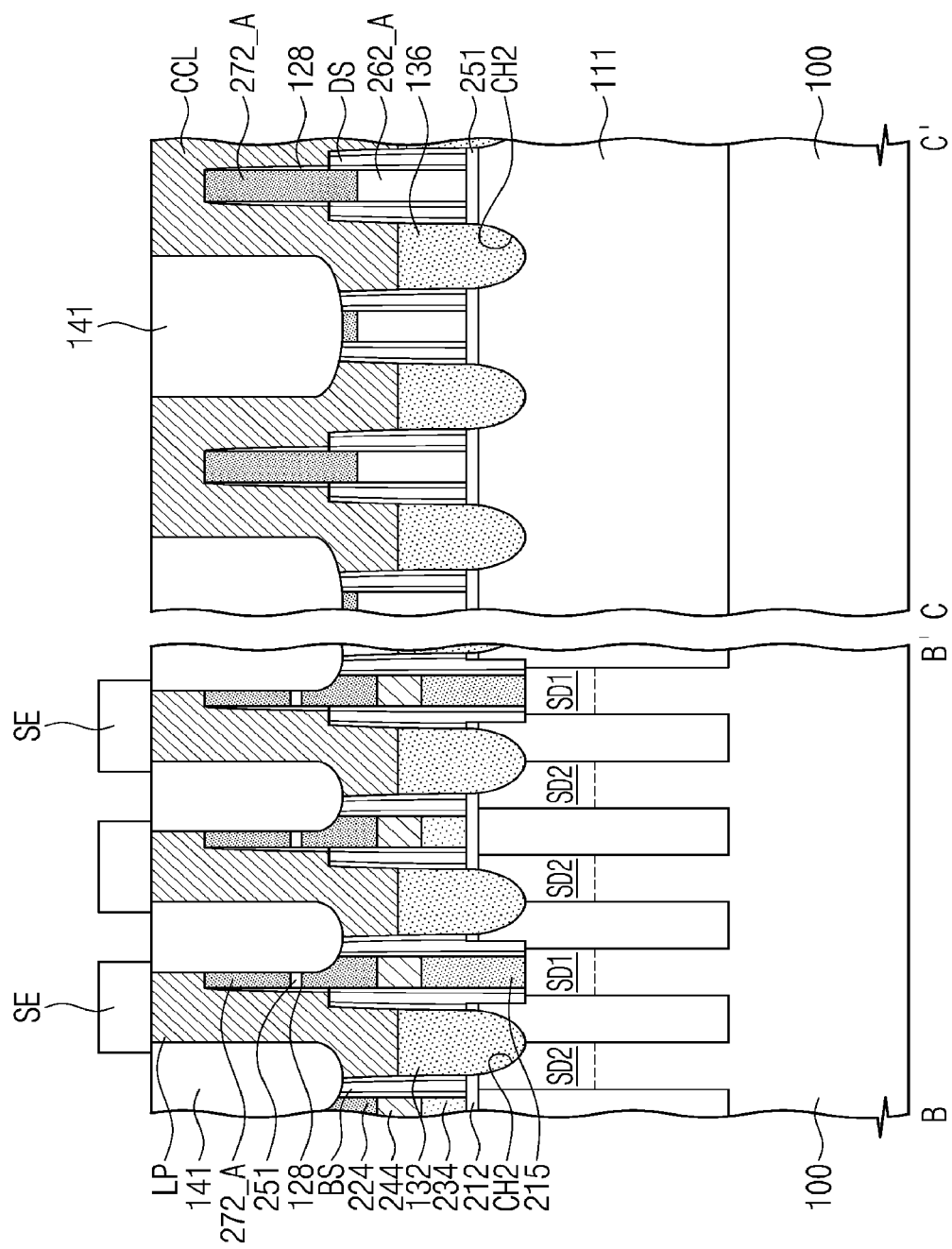

FIGS. 16A and 17A are cross-sectional views taken along the lines A-A' of FIGS. 7A and 2A, respectively, to illustrate a method of fabricating a semiconductor device according to some embodiments of present inventive concepts. FIGS. 16B and 17B are cross-sectional views taken along the lines B-B' and C-C' of FIGS. 7A and 2A, respectively. In FIGS. 16A-17B, descriptions of previously-described elements may be omitted or mentioned briefly for the purpose of ease and convenience in explanation.

Referring to FIGS. 16A and 16B, a lower interlayer insulating layer 261 may be formed on the resultant structure described with reference to FIGS. 6A to 6C. The process of forming the lower interlayer insulating layer 261 may include a process of forming an insulating layer on the resultant structure having the second buffer pattern 251 and a process of etching an upper portion of the insulating layer. The etching process may be a wet etching process. The second buffer pattern 251 and the first mask pattern 222 thereunder may not be etched during the etching process. Thus, a height h1 of a top surface of the lower interlayer insulating layer 261 may be lower than a height h5 of a top surface of the first mask pattern 222.

Thereafter, the processes of FIGS. 8A to 11A, 8B to 11B, 8C to 11C, 12, and 13 may be performed to fabricate a semiconductor device illustrated in FIGS. 17A and 17B. As illustrated in FIG. 17A, the second insulating pattern 272 may extend between the core mask pattern 223 and the first insulating pattern 224. As illustrated in FIGS. 17A and 17B, the second buffer pattern 251 may remain between the second insulating pattern 272 and the first insulating patterns 224.

Figure 18A:
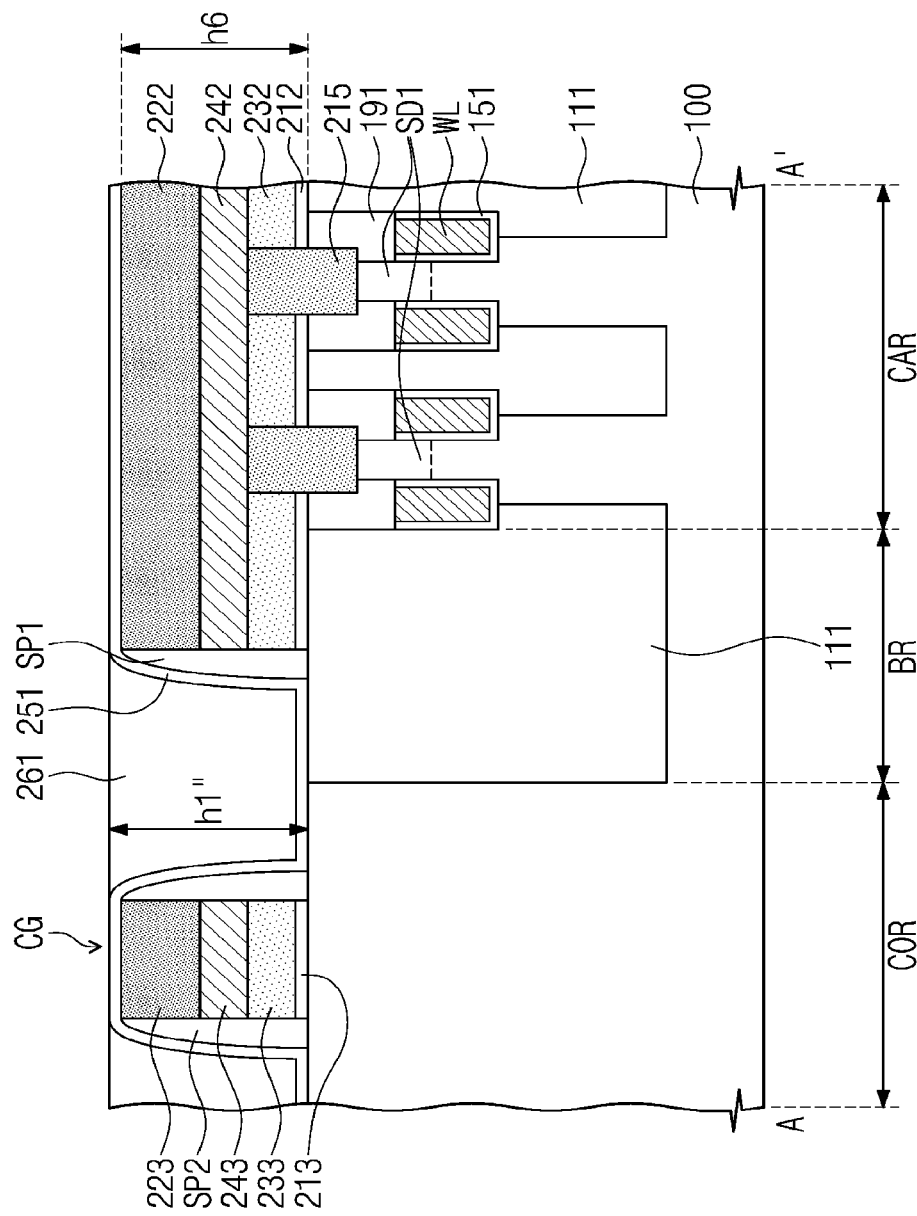
FIGS. 18A, 19A, and 22A are cross-sectional views taken along the lines A-A' of FIGS. 7A, 8A, and 2A, respectively, to illustrate a method of fabricating a semiconductor device according to some embodiments of present inventive concepts.
Figure 19A:
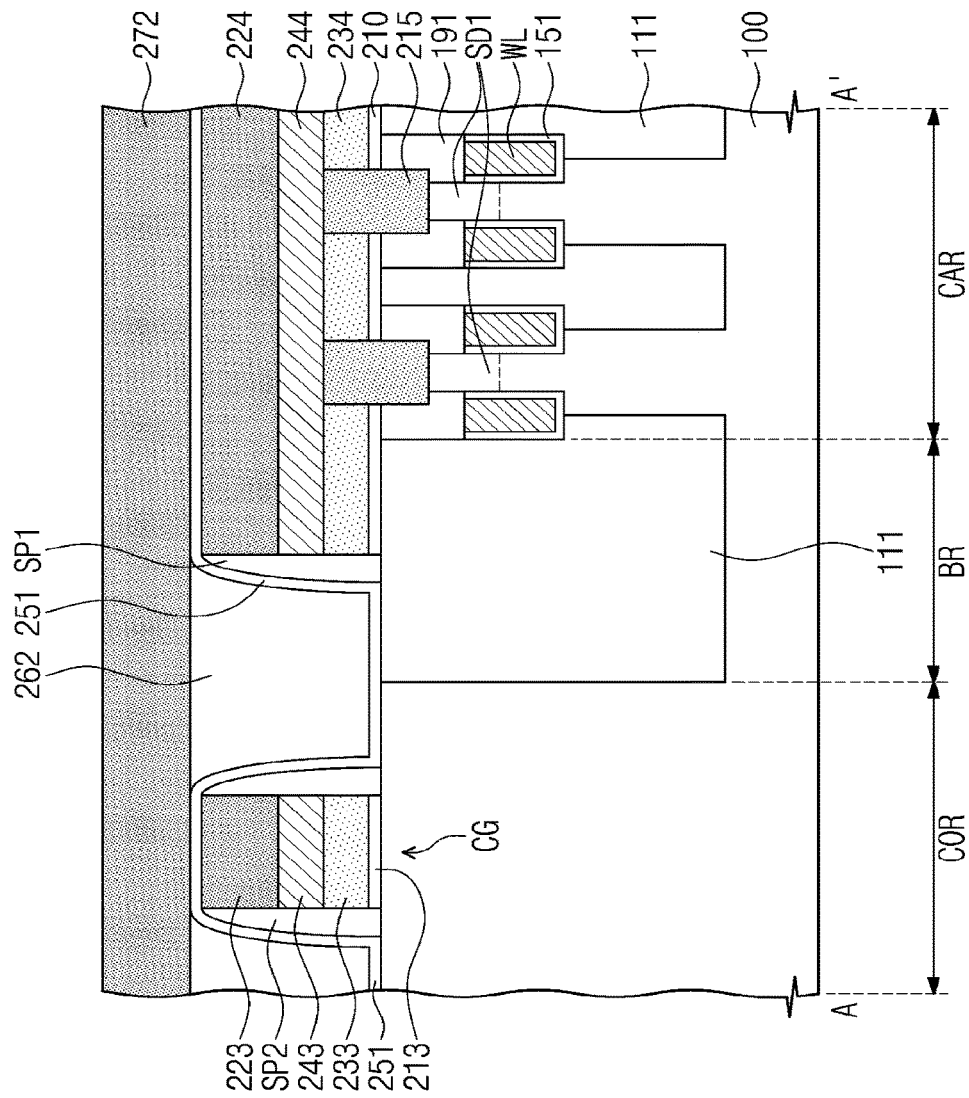
Figure 19B:
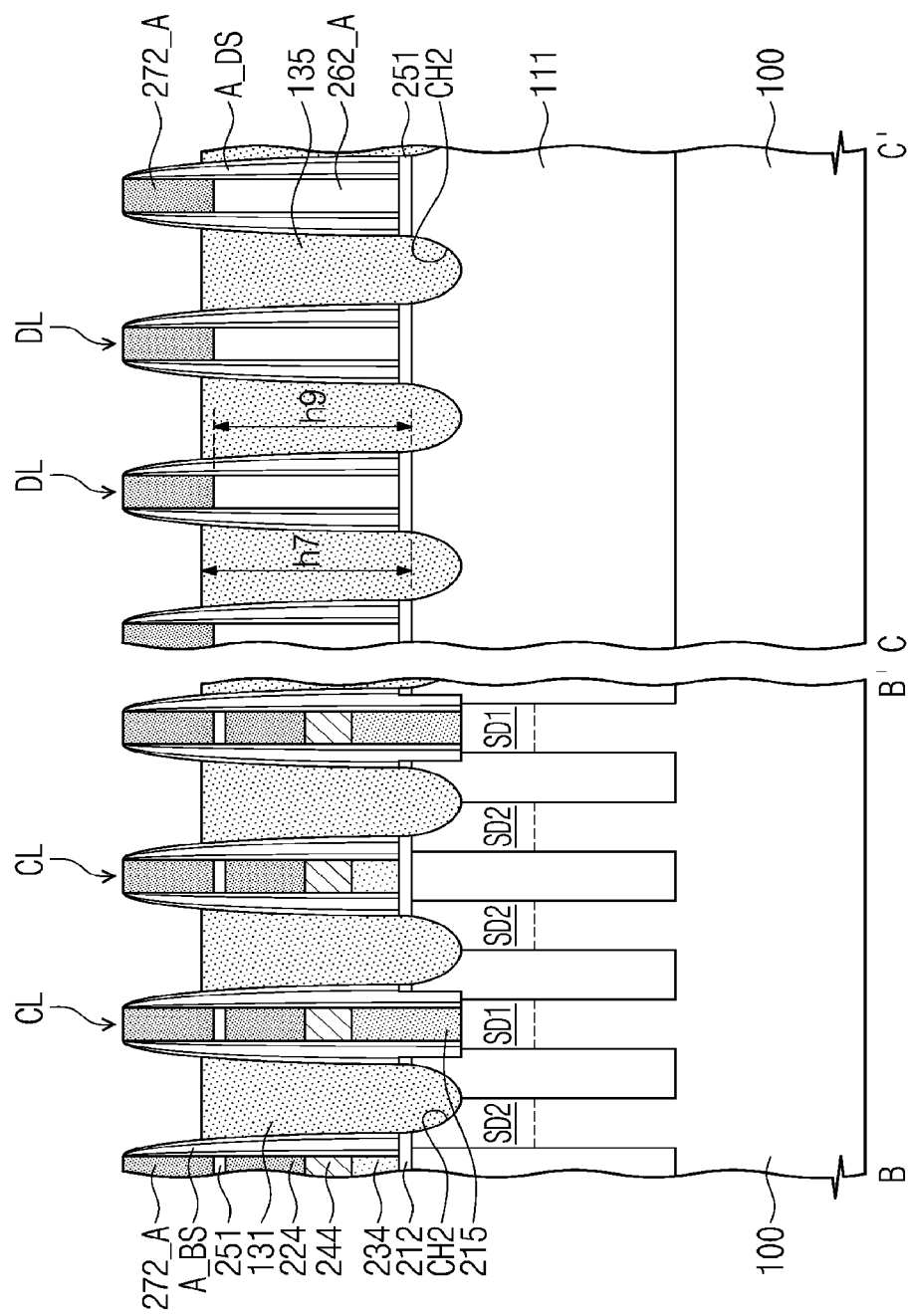
Figure 20:
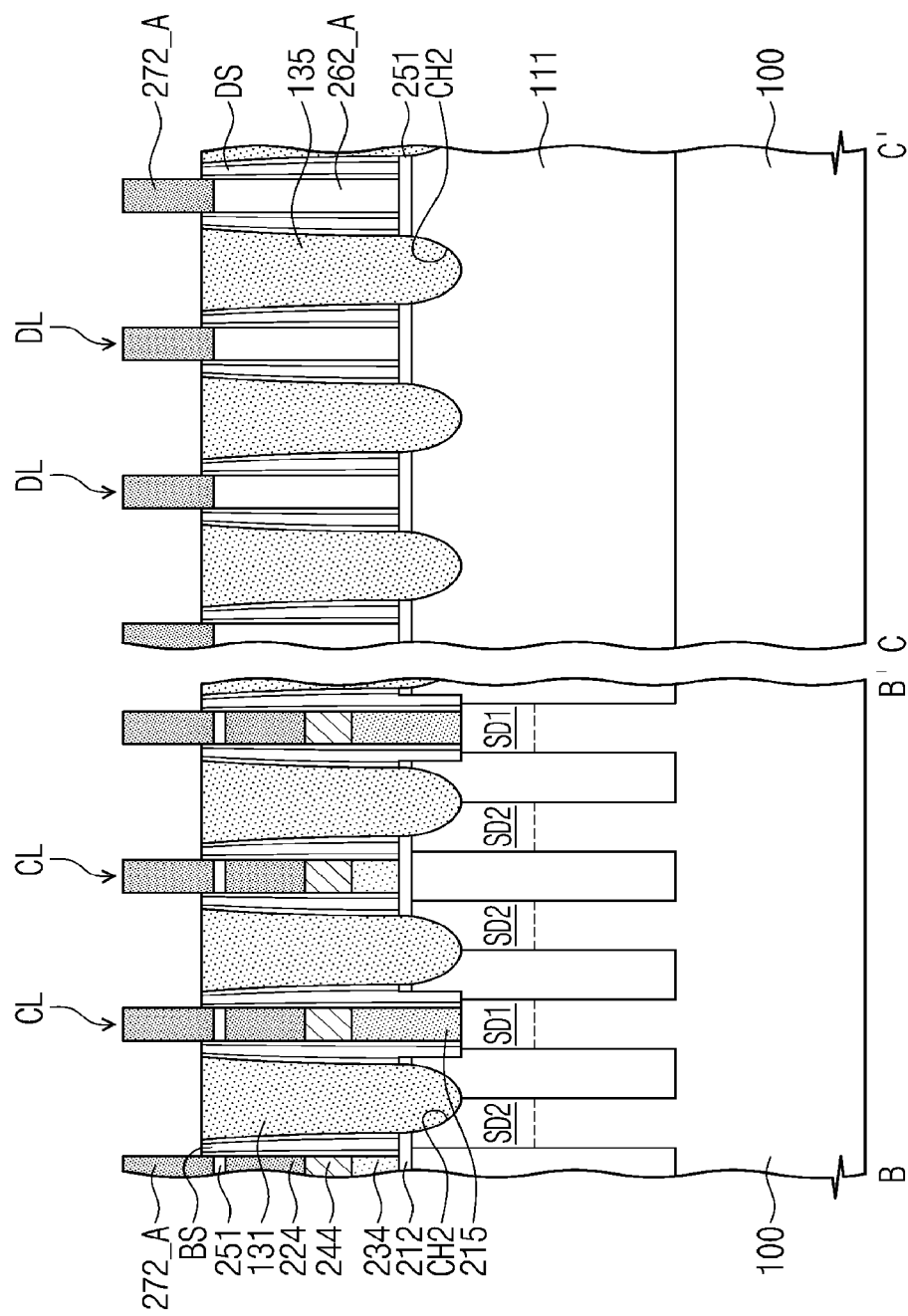
FIGS. 20 and 21 are cross-sectional views taken along the line A-A' of FIG. 8A.
Figure 21:
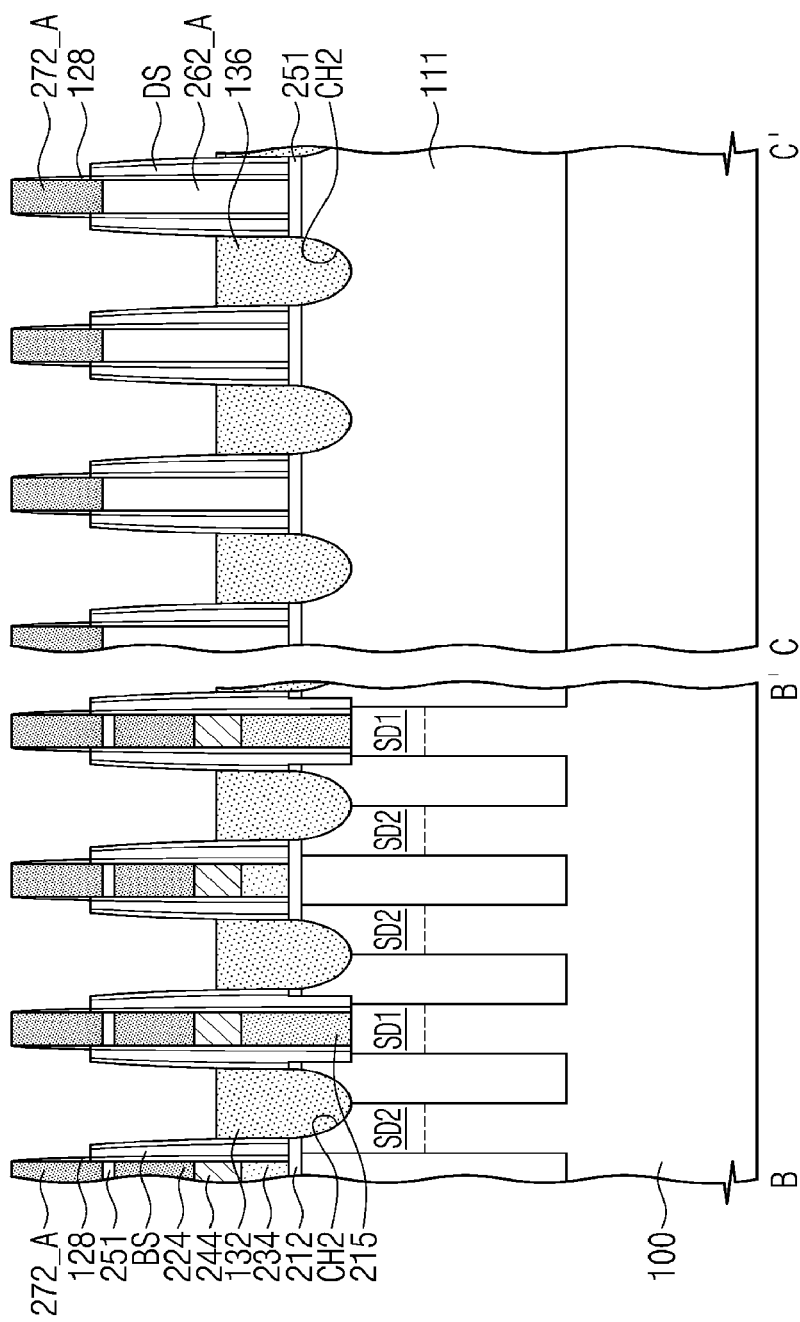
Figure 22A:
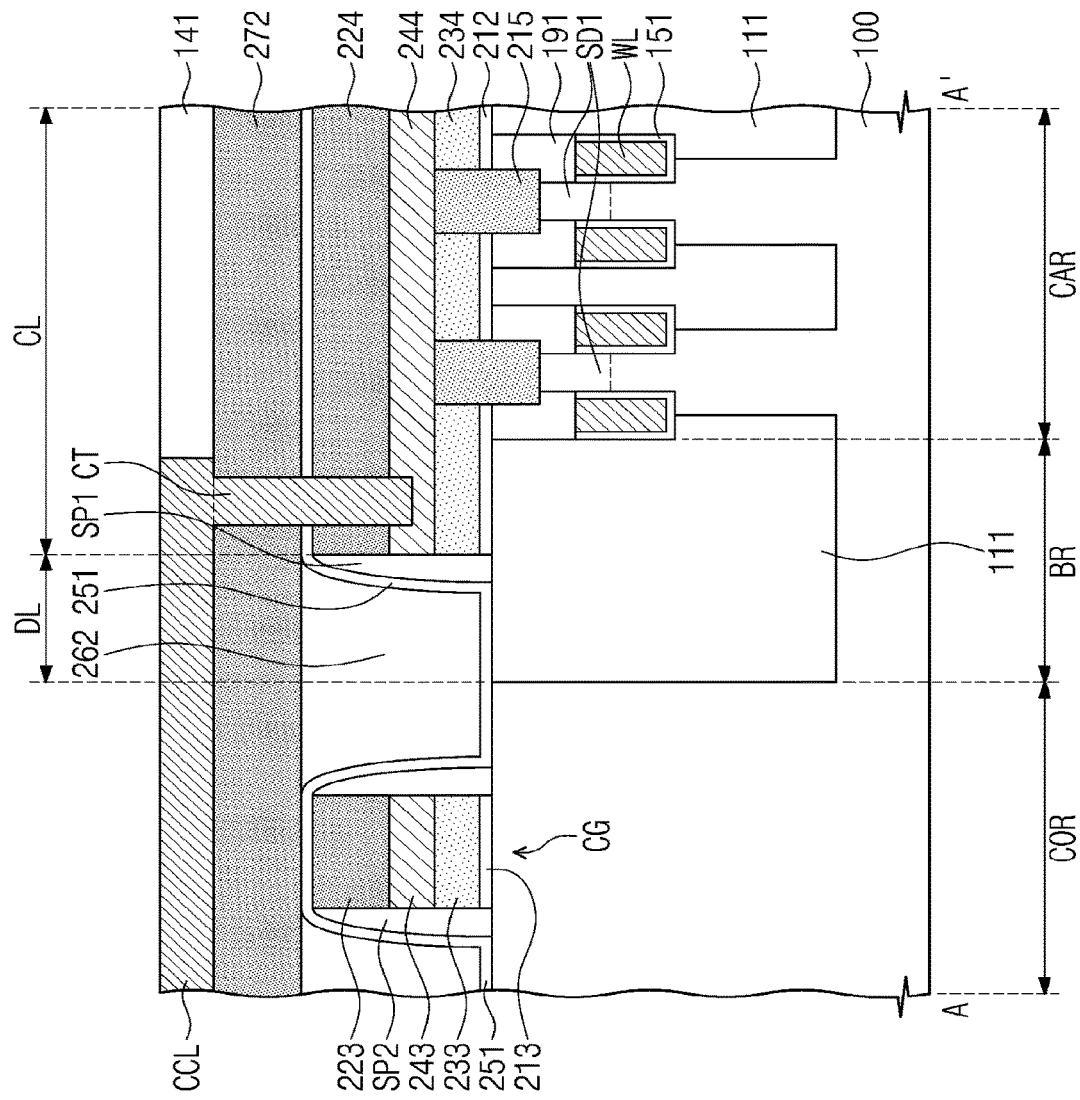
Figure 22B:
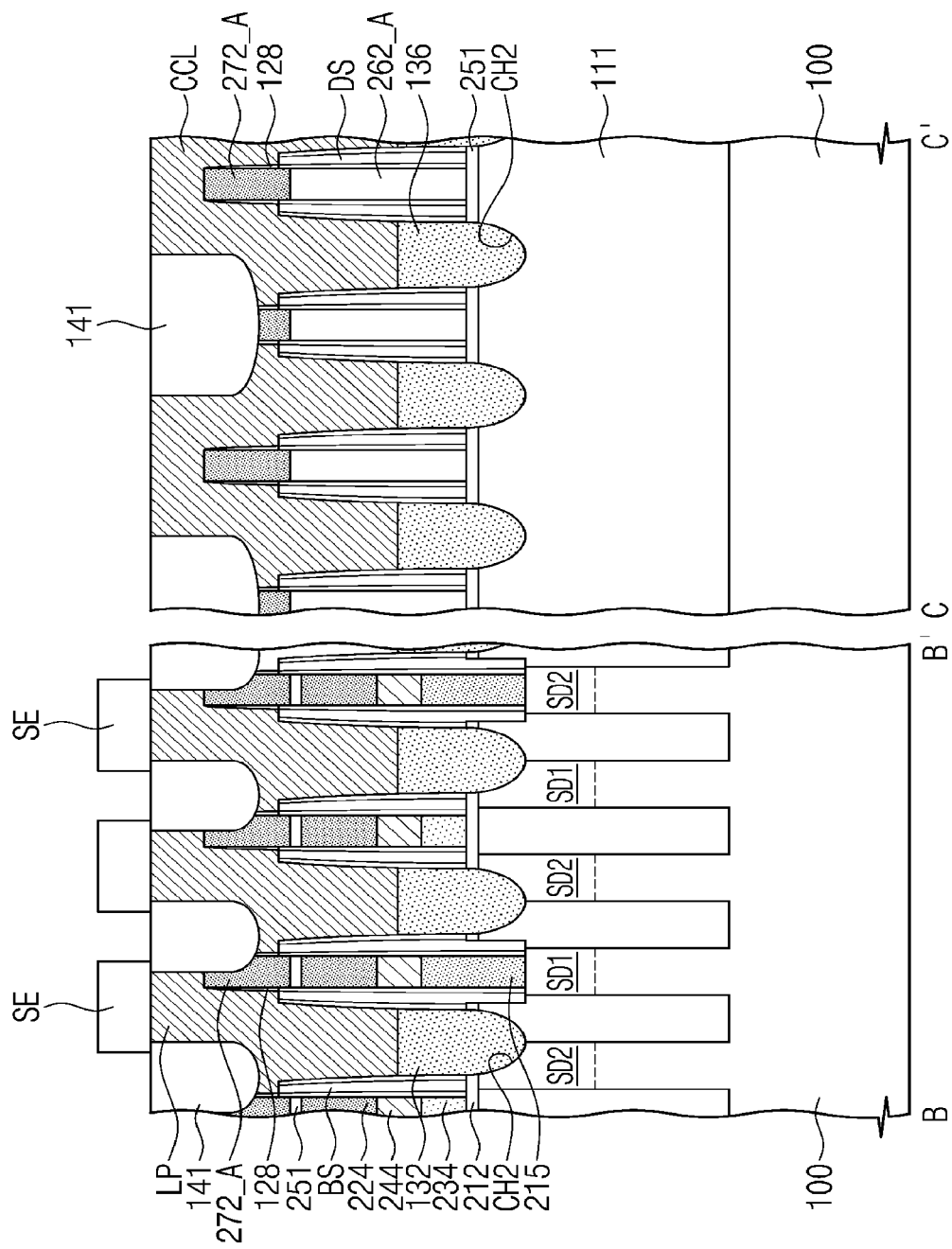

FIGS. 18A, 19A, and 22A are cross-sectional views taken along the lines A-A' of FIGS. 7A, 8A, and 2A, respectively, to illustrate a method of fabricating a semiconductor device according to some embodiments of present inventive concepts. FIGS. 20 and 21 are cross-sectional views taken along the line A-A' of FIG. 8A. FIGS. 18B, 19B, and 22B are cross-sectional views taken along the lines B-B' and C-C' of FIGS. 7A, 8A, and 2A, respectively. In FIGS. 18A-22B, descriptions of previously-described elements may be omitted or mentioned briefly for the purpose of ease and convenience in explanation.

Referring to FIGS. 18A and 18B, a lower interlayer insulating layer 261 may be formed on the second buffer pattern 251 described with reference to FIGS. 6A to 6C. Forming the lower interlayer insulating layer 261 may include forming an insulating layer on the second buffer pattern 251 and performing a planarization process on the insulating layer. The planarization process may be a CMP process. In some embodiments, after the planarization process, at least a portion of the second buffer pattern 251 may remain on the first mask pattern 222 and the core mask pattern 223. An upper portion of the first mask pattern 222 and an upper portion of the core mask pattern 223 may not be removed (e.g., may be protected). Thus, a height h1" of a top surface of the lower interlayer insulating layer 261 may be higher than a height h6 (which may equal the height h5) of a top surface of the first mask pattern 222.

Referring to FIGS. 19A and 19B, a second mask layer may be formed on the lower interlayer insulating layer 261. The second mask layer may be patterned to form a second insulating pattern 272. The second insulating pattern 272 may include first portions 272_A on/in the cell region CAR and the boundary region BR. An etching process may be performed using the second insulating pattern 272 as an etch mask to form cell conductive lines CL on/in the cell region CAR. Each of the cell conductive lines CL may include a first sub-conductive line 234, a second sub-conductive line 244, a first insulating pattern 224, and the second insulating pattern 272 which are sequentially stacked. Each of the cell conductive lines CL may further include the second buffer pattern 251 disposed between the first insulating pattern 224 and the second insulating pattern 272.

The lower interlayer insulating layer 261 may be formed into a third insulating pattern 262 by the etching process. The third insulating pattern 262 may include first portions 262_A respectively aligned with the cell conductive lines CL on the boundary region BR, and a second portion 262_B connected in common to the first portions 262_A and covering the core region COR. The first portions 262_A of the third insulating pattern 262 and the first portions 272_A of the second insulating pattern 272 disposed on the first portions 262_A may be defined as dummy lines DL.

Preliminary spacers may be formed on sidewalls of the cell conductive lines CL and sidewalls of the dummy lines DL. The preliminary spacers may include preliminary cell spacers A_BS formed on the sidewalls of the cell conductive lines CL and preliminary dummy spacers A_DS formed on the sidewalls of the dummy lines DL. Fence insulating patterns may be formed between the cell conductive lines CL and between the dummy lines DL.

Second contact holes CH2 exposing the second dopant regions SD2 may be formed and then preliminary lower contacts may be formed in respective ones of the second contact holes CH2. The preliminary lower contacts may include preliminary cell contacts 131 on/in the cell region CAR and preliminary dummy contacts 135 on/in the boundary region BR. The process of forming the preliminary lower contacts 131 and 135 may include a deposition process and an etch-back process. After the etch-back process, a height h7 of top surfaces of the preliminary lower contacts 131 and 135 may be higher than a height h9 of the top surface of the third insulating pattern 262, e.g., a height h9 of top surfaces of the first portions 262_A of the third insulating pattern 262. The height h7 of the top surfaces of the preliminary lower contacts 131 and 135 may be higher than a height of the topmost surface of the second buffer pattern 251.

Referring to FIG. 20, upper portions of the preliminary spacers A_BS and A_DS exposed by the preliminary lower contacts 131 and 135 may be etched. Thus, cell spacers BS may be formed on the sidewalls of the cell conductive lines CL and dummy spacers DS may be formed on the sidewalls of the dummy lines DL.

Referring to FIG. 21, upper spacers 128 may be formed on the exposed sidewalls of the first portions 272_A of the second insulating pattern 272. An etching process may be performed on the preliminary lower contacts 131 and 135 to form cell lower contacts 132 and dummy lower contacts 136. A height of top surfaces of the lower contacts 132 and 136 may be lower than a height of top surfaces of the second sub-conductive lines 244. The height of the top surfaces of the lower contacts 132 and 136 is higher than a height of top surfaces of the first sub-conductive lines 234 in FIG. 21. However, embodiments of present inventive concepts are not limited thereto.

Referring to FIGS. 22A to 22B, a conductive layer may be formed on the resultant structure having the lower contacts 132 and 136, and a patterning process may be performed on the conductive layer to form upper contacts LP on the cell lower contacts 132 and to form core conductive lines CCL on the dummy lower contacts 136. Data storage elements SE may be formed on respective ones of the upper contacts LP.

Figure 23A:
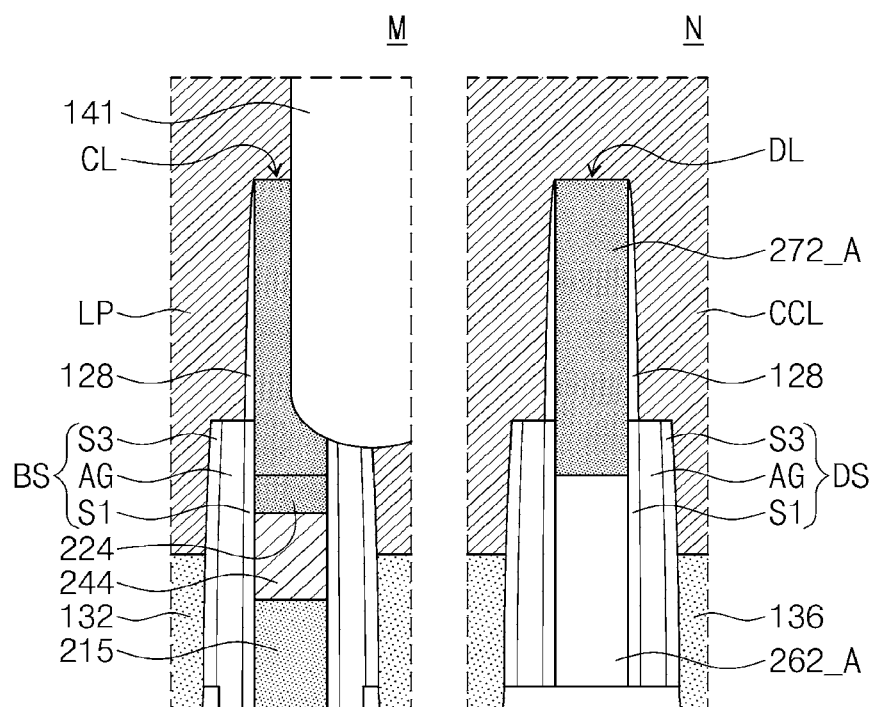
FIGS. 23A and 23B are enlarged views of regions 'M' and 'N' of FIG. 2C to compare a cell conductive line and a dummy line according to some embodiments of present inventive concepts.
Figure 23B:
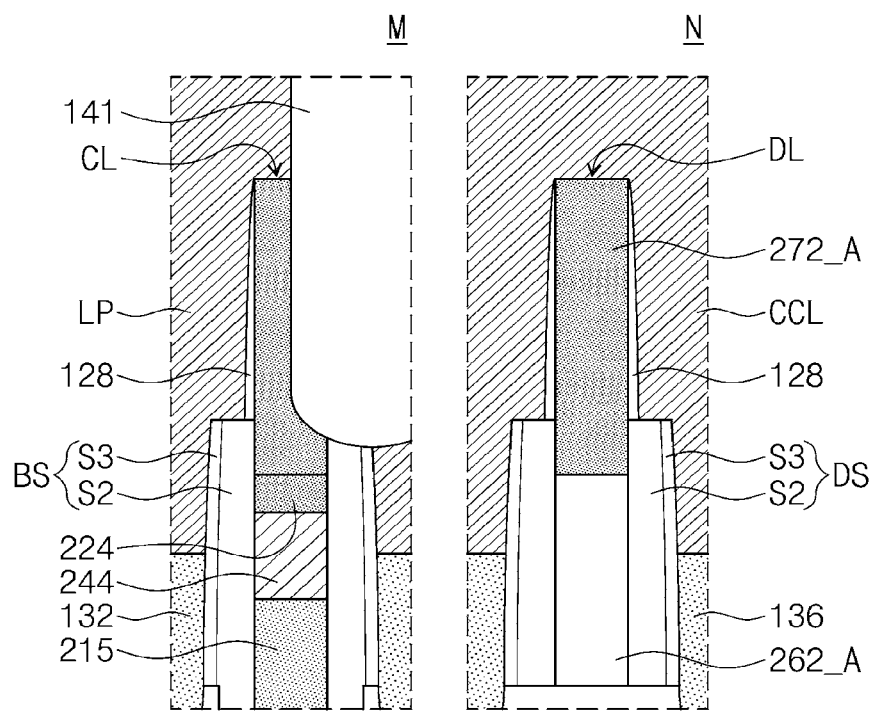

FIGS. 23A and 23B are enlarged views of regions 'M' and 'N' of FIG. 2C to compare a cell conductive line and a dummy line to each other according to some embodiments of present inventive concepts.

Referring to FIG. 23A, each of cell and dummy spacers BS and DS may include an air gap AG between the first sub-spacer S1 and the third sub-spacer S3. The air gap AG may correspond to a substantially empty space which does not include a solid material. In some embodiments, the second sub-spacer S2 of FIG. 2D may be exposed in the process of patterning the conductive layer for the formation of the upper contacts LP and the core conductive lines CCL described with reference to FIGS. 2A and 2C. The exposed second sub-spacer S2 may be selectively removed, and then the upper interlayer insulating layer 141 may be formed. For example, the second sub-spacer S2 may be formed of silicon oxide and the first and third sub-spacers S1 and S3 may be formed of silicon nitride.

Referring to FIG. 23B, each of cell and dummy spacers BS and DS may include the second sub-spacer S2 and the third sub-spacer S3 but may not include the first sub-spacer S1, unlike FIG. 2D.

According to some embodiments of present inventive concepts, semiconductor devices with improved reliability may be provided or realized.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
a gate structure comprising a first gate electrode, a second gate electrode, and a core mask pattern that are sequentially stacked;
a cell conductive line comprising a sub-conductive line, a first insulating pattern, and a second insulating pattern that are sequentially stacked;
a stack structure between the gate structure and the cell conductive line on the substrate, wherein the stack structure comprises a buffer pattern and a third insulating pattern on the buffer pattern;
a first spacer between the cell conductive line and the stack structure;
a second spacer between the stack structure and the gate structure; and
a conductive line that is on the third insulating pattern,
wherein a top surface of the first spacer is coplanar with a top surface of the second spacer.

2. The semiconductor device of claim 1, wherein a top surface of the first gate electrode is at a level different from that of a top surface of the first insulating pattern.

3. The semiconductor device of claim 1, wherein a top surface of buffer pattern is coplanar with the top surface of the second spacer.

4. The semiconductor device of claim 1, wherein a top surface of the third insulating pattern is lower than a top surface of the core mask pattern.

5. The semiconductor device of claim 1, wherein each of the first and second spacers comprises at least two layers.

6. The semiconductor device of claim 1, wherein the second insulating pattern extends over the stack structure and the gate structure.

7. The semiconductor device of claim 6, wherein the second insulating pattern contacts a top surface of the third insulating pattern.

8. The semiconductor device of claim 6, wherein the second insulating pattern contacts a top surface of the core mask pattern.

9. The semiconductor device of claim 1, further comprising a pair of spacers on sidewalls of the stack structure,
wherein a top surface of the third insulating pattern is lower than top surfaces of the pair of spacers.

10. The semiconductor device of claim 1, further comprising a device isolation layer in the substrate,
wherein the device isolation layer is below the stack structure.

11. A semiconductor device comprising:
a substrate;
a gate structure comprising a first gate electrode, a second gate electrode, and a core mask pattern that are sequentially stacked;
a cell conductive line comprising a sub-conductive line, a first insulating pattern, and a second insulating pattern that are sequentially stacked;
a stack structure between the gate structure and the cell conductive line on the substrate, wherein the stack structure comprises a buffer pattern and a third insulating pattern on the buffer pattern;
a first spacer between the cell conductive line and the stack structure;
a second spacer between the stack structure and the gate structure; and
a conductive line that is on the third insulating pattern,
wherein a top surface of the third insulating pattern is coplanar with, or at a lower level than, a top surface of the second spacer.

12. The semiconductor device of claim 11, wherein a top surface of the first gate electrode is at a level different from that of a top surface of the first insulating pattern.

13. The semiconductor device of claim 11, wherein a top surface of buffer pattern is coplanar with the top surface of the second spacer.

14. The semiconductor device of claim 11, wherein each of the first and second spacers comprises at least two layers.

15. The semiconductor device of claim 11, wherein the second insulating pattern extends over the stack structure and the gate structure.

16. The semiconductor device of claim 15, wherein the second insulating pattern contacts the top surface of the third insulating pattern.

17. The semiconductor device of claim 15, wherein the second insulating pattern contacts a top surface of the core mask pattern.

18. A semiconductor device comprising:

a substrate;

a gate structure comprising a first gate electrode, a second gate electrode, and a core mask pattern that are sequentially stacked;

a cell conductive line comprising a sub-conductive line, a first insulating pattern, and a second insulating pattern that are sequentially stacked;

a stack structure between the gate structure and the cell conductive line on the substrate, wherein the stack structure comprises a buffer pattern and a third insulating pattern on the buffer pattern;

a first spacer between the cell conductive line and the stack structure;

a second spacer between the stack structure and the gate structure; and a conductive line that is on the third insulating pattern, wherein a top surface of buffer pattern is coplanar with a top surface of the second spacer.

19. The semiconductor device of claim 18, wherein a top surface of the first spacer is coplanar with the top surface of the second spacer.

20. The semiconductor device of claim 18, wherein a top surface of the third insulating pattern is coplanar with, or at a lower level than, the top surface of the second spacer.

* * * * *